US010439573B2

(12) United States Patent
Schober et al.

(10) Patent No.: US 10,439,573 B2
(45) Date of Patent: Oct. 8, 2019

(54) MULTI-STAGE AND FEED FORWARD COMPENSATED COMPLEMENTARY CURRENT FIELD EFFECT TRANSISTOR AMPLIFIERS

(71) Applicant: Circuit Seed, LLC, Newport Beach, CA (US)

(72) Inventors: Susan Marya Schober, Corona Del Mar, CA (US); Robert C. Schober, Huntington Beach, CA (US)

(73) Assignee: Circuit Seed, LLC, Newport Beach, CA (US)

( * ) Notice: Subject to any disclaimer, the term of this patent is extended or adjusted under 35 U.S.C. 154(b) by 0 days.

(21) Appl. No.: 15/748,497

(22) PCT Filed: Jul. 29, 2016

(86) PCT No.: PCT/US2016/044770
§ 371 (c)(1),
(2) Date: Jan. 29, 2018

(87) PCT Pub. No.: WO2017/019973
PCT Pub. Date: Feb. 2, 2017

(65) Prior Publication Data
US 2018/0226930 A1 Aug. 9, 2018

Related U.S. Application Data

(60) Provisional application No. 62/309,903, filed on Mar. 17, 2016, provisional application No. 62/268,983, (Continued)

(51) Int. Cl.
*H03F 3/45* (2006.01)
*H03F 1/08* (2006.01)
(Continued)

(52) U.S. Cl.
CPC ..... *H03F 3/45183* (2013.01); *H01L 29/4238* (2013.01); *H01L 29/78* (2013.01);
(Continued)

(58) Field of Classification Search
CPC .................................................. H03F 3/45183
See application file for complete search history.

(56) References Cited

U.S. PATENT DOCUMENTS 3,887,878 A * 6/1975 Schade, Jr. ........... H03F 3/3071
330/267
3,986,134 A 10/1976 Yokoyama
(Continued)

FOREIGN PATENT DOCUMENTS

CN 101142686 3/2008
CN 102265403 11/2011
(Continued)

OTHER PUBLICATIONS

Aguirre, et al., "Temperature Controlled Measurement System for Precise Characterization of Electronic Circuits and Devices", IEEE Instrumentation and Measurement, 2014, 4 pages.
(Continued)

*Primary Examiner* — Patricia T Nguyen
(74) *Attorney, Agent, or Firm* — Lee & Hayes, P.C.

(57) ABSTRACT

The present invention relates to a multi-stage and feed forward compensated complimentary current field effect transistor amplifiers, enabling a charge-based approach that takes advantage of the exponential properties incurred in sub-threshold operation. A plurality of complimentary pairs of novel current field effect transistors are connected in series to form a multi-stage amplifier.

19 Claims, 44 Drawing Sheets

Related U.S. Application Data filed on Dec. 17, 2015, provisional application No. 62/198,927, filed on Jul. 30, 2015.

(51) Int. Cl.

| | |
|---|---|
| *H03F 3/30* | (2006.01) |
| *H03K 19/003* | (2006.01) |
| *H01L 29/423* | (2006.01) |
| *H01L 29/78* | (2006.01) |

(52) U.S. Cl.
CPC ........... *H03F 1/083* (2013.01); *H03F 3/3022* (2013.01); *H03F 3/45475* (2013.01); *H03K 19/00384* (2013.01); *H03F 2203/45246* (2013.01); *H03F 2203/45692* (2013.01)

(56) References Cited

U.S. PATENT DOCUMENTS

| | | | |
|---|---|---|---|
| 4,100,502 A | 7/1978 | Yamashiro | |
| 4,247,859 A * | 1/1981 | Rai-Choudhury | H01L 27/092 257/352 |
| 4,282,477 A * | 8/1981 | Ahmed | G05F 3/30 323/312 |
| 4,309,665 A | 1/1982 | Yamashiro | |
| 4,607,274 A | 8/1986 | Yoshitake | |
| 4,910,709 A | 3/1990 | Dhong et al. | |
| 4,927,779 A | 5/1990 | Dhong et al. | |
| 5,041,894 A * | 8/1991 | Reczek | H01L 27/0921 257/372 |
| 5,349,311 A | 9/1994 | Mentzer | |
| 5,528,056 A | 6/1996 | Shimada et al. | |
| 6,046,638 A | 4/2000 | Hogeboom | |
| 6,081,218 A | 6/2000 | Ju et al. | |
| 6,441,663 B1 | 8/2002 | Chuang et al. | |
| 6,784,824 B1 | 8/2004 | Quinn | |
| 6,933,750 B2 | 8/2005 | Takahashi et al. | |
| 7,057,302 B2 | 6/2006 | Matsuzawa et al. | |
| 7,554,409 B1 * | 6/2009 | Zhang | H03F 1/523 330/10 |
| 2002/0016030 A1 | 2/2002 | Misewich et al. | |
| 2003/0049892 A1 | 3/2003 | Yamaguchi et al. | |
| 2003/0210097 A1 | 11/2003 | Wilson et al. | |
| 2004/0102170 A1 | 5/2004 | Jensen et al. | |
| 2005/0168242 A1 | 8/2005 | Won | |
| 2005/0218299 A1 * | 10/2005 | Olsen | H03F 3/08 250/214 A |
| 2006/0001413 A1 | 1/2006 | Marinca | |
| 2006/0065927 A1 | 3/2006 | Thean et al. | |
| 2006/0139195 A1 | 6/2006 | Casper et al. | |
| 2007/0046369 A1 | 3/2007 | Schober et al. | |
| 2007/0085593 A1 * | 4/2007 | Wich | G11C 17/18 327/525 |
| 2007/0098041 A1 | 5/2007 | Seo | |
| 2008/0258959 A1 | 10/2008 | Trifonov et al. | |
| 2009/0160487 A1 | 6/2009 | Hu et al. | |
| 2009/0311837 A1 | 12/2009 | Kapoor | |
| 2011/0309888 A1 | 12/2011 | Bulzacchelli et al. | |
| 2012/0097965 A1 | 4/2012 | Shin et al. | |
| 2012/0098579 A1 | 4/2012 | Schober et al. | |
| 2013/0027107 A1 | 1/2013 | Nohara | |
| 2013/0177175 A1 | 7/2013 | Ting | |
| 2013/0287071 A1 | 10/2013 | Chen et al. | |
| 2014/0062550 A1 | 3/2014 | Lee et al. | |
| 2014/0132435 A1 | 5/2014 | Dempsey | |
| 2014/0159168 A1 | 6/2014 | Toh et al. | |
| 2015/0070091 A1 | 3/2015 | Schober et al. | |
| 2018/0219514 A1 | 8/2018 | Schober et al. | |
| 2018/0219519 A1 | 8/2018 | Schober et al. | |
| 2018/0224878 A1 | 8/2018 | Schober et al. | |
| 2019/0123688 A1 | 4/2019 | Schober et al. | |

FOREIGN PATENT DOCUMENTS

| | | |
|---|---|---|
| CN | 104465657 | 3/2015 |
| EP | 1079294 | 9/2004 |
| JP | 2014063929 | 4/2014 |
| KR | 1020120043522 | 5/2012 |
| WO | WO9534913 | 12/1995 |
| WO | WO2007014053 | 2/2007 |
| WO | WO2007081634 | 7/2007 |

OTHER PUBLICATIONS

Amaravati, et al., "800-nA Process-and-Voltage-Invariant 106-dB PSRR PTAT Current Reference", IEEE Transactions on Circuits and Systems—II: Express Briefs, Sep. 2013, 60(9), pp. 577-581.

Anusandhana Journal of Science, Engineering and Management, vol. 1, Issue 2, Dec. 2012, 78 pages.

Baghini, et al., "A Sub-1V 32nA Process, Voltage and Temperature Invariant Voltage Reference Circuit", 2013 26th International Conference on VLSI Design and the 12th International Conference on Embedded Systems, 2013, pp. 136-141.

Baker, et al., "High Speed Op-amp Design: Compensation and Topologies for Two and Three Stage Designs", IEEE Solid-State Circuits Society, Apr. 9-10, 2015, 58 pages.

Bendali, et al., "A 1-V CMOS Current Reference With Temperature and Process Compensation", IEEE Transactions on Circuits and Systems—I: Regular Papers, vol. 54, No. 7, Jul. 2007, pp. 1424-1429.

Christoffersen, et al., "An Ultra-Low Power CMOS PTAT Current Source", IEEE-EMATA 2010, pp. 35-40.

Dai, et al., "Threshold Voltage Based CMOS Voltage Reference", IEE Proceedings Circuits Devices Systems, vol. 151, No. 1, Feb. 2004, pp. 58-62.

De Vita, et al., "A 300 nW, 12 ppm/C Voltage Reference in a Digital 0.35 um CMOS Process", 2006 Symposium on VLSI Circuits Digest of Technical Papers, IEEE 2006, 3 pages.

Galeano et al., "A Very Low Power Area Efficient CMOS Only Bandgap Reference", IEEE 2012, 6 pages.

Gray, et al., "Analysis and Design of Analog Integrated Circuits", John Wiley & Sons, Inc., 2009.

Haft-Baradaran, Afshin, "Basic and Advanced Current References", University of Toronto, 2001, 16 pages.

Hirose, et al., "A CMOS Bandgap and Sub-Bandgap Voltage Reference Circuits for Nanowatt Power LSIs", IEEE Asian Solid-State Circuits Conference, Nov. 8-10, 2010, 4 pages.

Huang, et al., "A 1V 16.9ppm/C 250nA Switched-Capacitor CMOS Voltage Reference", 2008, IEEE International Solid-State Circuits Conference, 4 pages.

Huang, et al., "Piecewise Linear Curvature-Compensated CMOS Bandgap Reference", IEEE, 2008, pp. 308-311.

Huffenus, et al., "A High PSRR Class-D Audio Amplifier IC Based on a Self-Adjusting Voltage Reference", European Solid State Circuits Conference, 2010, pp. 4.

Ivanov, et al., "An Ultra Low Power Bandgap Operational at Supply From 0.75 V", IEEE Journal of Solid-State Circuits, vol. 47, No. 7, Jul. 2012, pp. 1515-1523.

Le, et al., "A Design of Three-Stage CMOS Opamp Using Indirect Feedback Compensation Technique", The Solid-State Systems Symposium & VLSI and Related Technology, 4S, Aug. 2012, pp. 153-156.

Lee, et al., "A Wideband CMOS Variable Gain Amplifier With an Exponential Gain Control", IEEE Transactions on Microwave Theory and Techniques, vol. 55, No. 6, Jun. 2007, pp. 1363-1373.

Mattia, et al., "2.3 ppm/C 40 nW MOSFET-Only Voltage Reference", ISLPED' 14, Aug. 11-13, 2014, 7 pages.

Meijer, et al., "Temperature Sensors and Voltage References Implemented in CMOS Technology", IEEE Sensors Journal, vol. 1, No. 3, Oct. 2001, pp. 225-234.

Millemon Sr., B.A., "CMOS Characterization, Modeling, and Circuit Design in the Presence of Random Local Variation", A Thesis submitted Aug. 2012, Boise State University, 88 pages.

(56) References Cited

OTHER PUBLICATIONS

Mok, et al., "Design Considerations of Recent Advanced Low-Voltage Low-Temperature-Coefficient CMOS Bandgap Voltage Reference", CICC, Oct. 2004, 8 pages.
Osaki, et al., "1.2-V Supply, 100-nW, 1.09-V Bandgap and 0.7-V Supply, 52.5-nW, 0.55-V Subbandgap Reference circuits for Nanowatt CMOS LSIs", IEEE Journal of Solid-State Circuits, vol. 48, No. 6, Jun. 2013, pp. 1530-1538.
Pain, et al., "Low-power Low-noise Analog Circuits for on-focal-plane Signal Processing of Infrared Sensors", Proceedings of the SPIE, vol. 1946, 1993, 10 pages.
Park, et al., "A 95nW Ring Oscillator-based Temperature Sensor for RFID Tags in 0.13um CMOS", IEEE 2009, pp. 1153-1156.
Paul, et al., "Design of Second-Order Sub-Bandgap Mixed-Mode Voltage Reference Circuit for Low Voltage Applications", Proceedings of the 18th Intl Conference on VLSI Design, 2005, 6 pages.
Rossi, et al., "PTAT Voltage Generator Based on an MOS Voltage Divider", 2007, Instituto de Ing. Electrica, Universidad de la Republica, Montevideo, Uruguay, 4 pages.
Rossi, et al., "Ultra-low Power CMOS Cells for Temperature Sensors", SBCCI '05, Sep. 4-7, 2005, pp. 202-206.
Rossi-Aicardi, et al., "A MOSFET-only Voltage Source with Arbitrary Sign Adjustable Temperature Coefficient", IEEE 2011, pp. 366-369.
Saxena, et al., "Compensation of CMOS Op-amps Using Split-Length Transistors", IEEE 2008, pp. 109-112.
Saxena, et al., "Indirect Compensation Technique for Low-Voltage CMOS Op-amps", Jan. 18, 2016, 4 pages.
Saxena, et al., "Indirect Feedback Compensation of CMOS Op-Amps ", 2006 IEEE Workshop on Microelectronics and Electron Devices, 2 pages.
Saxena, et al., "Systematic Design of Three-Stage Op-amps Using Split-Length Compensation", 2011, IEEE 54th International Midwest Symposium on Circuits and Systems (MWSCAS), pp. 1-4.
Saxena, Vishal, "Indirect Feedback Compensation Techniques for Mulit-Stage Operational Amplifiers", A Thesis submitted Oct. 2007, Boise State University, 209 pages.
Schmitt, Otto H., "A Simple Differential Amplifier", R.S.I., vol. 8, Apr. 1937, pp. 126-127.
Schmitt, Otto H., "A Thermionic Trigger", Journal of Scientific Instrumens, 1937, 3 pages.
Shinde, S.V., "PVT Insensitive Reference Current Generation", Proceedings of the International MultiConference of Engineers and Computer Scientists 2014, vol. II, Mar. 12-14, 2014, 5 pages.
Sun, et al., "A Low-Power Low-Voltage Bandgap Reference in CMOS", CCECE 2010 Canadian Conference, 5 pages.
Tzanateas et al., "A CMOS Bandgap Voltage Reference", IEEE Journal of SolidD-State Circuits, vol. SC-14, No. 3, Jun. 1979, pp. 655-657.

Vittoz, et al., "A Low-Voltage CMOS Bandgap Reference", IEEE Journal of Solid-State Circuits, Vovl. SC-14, No. 3, Jun. 1979, pp. 573-577.
Vittoz, et al., "CMOS Analog Integrated Circuits Based on Weak Inversion Operation", IEEE Journal of Solid-State Circuits, Jun. 1977, vol. SC-12, No. 3, pp. 224-231.
Yang, et al., "All-CMOS Subbandgap Reference Circuit Operating at Low Supply Voltage", IEEE 2011, pp. 893-896.
Zhang Z., "CMOS Radio Frequency Integrated Circuit Design for Direct Conversion Receivers", A thesis submitted to The Hong Kong University of Science and Technology, Sep. 2001, 155 pages.
PCT Search Report and Written Opinion dated Oct. 20, 2016 for PCT application No. PCT/US216/044792, 13 pages.
PCT Search Report and Written Opinion dated Nov. 10, 2016 for PCT application No. PCT/US2016/044770, 15 pages.
PCT Search Report and Written Opinion dated Nov. 8, 2016 for PCT application No. PCT/US2016/044787, 16 pages.
PCT Search Report and Written Opinion dated Apr. 3, 2017 for PCT application No. PCT/US16/67529, 14 pages.
PCT Search Report and Written Opinion dated May 13, 2016 for PCT Application No. PCT/US16/14639, 11 pages.
Baker, R. Jacob, "CMOS—Circuit Design, Layout, and Simulation, Third Edition", IEEE Press, 2010.
Horowitz, et al., "The Art of Electronics—2nd Edition", Cambridge University Press, 1989, 1041 pages.
PCT Search Report and Written Opinion dated Oct. 23, 2015 for PCT Applicatoin No. PCT/US2015/42696, 12 pages.
International Search Report and Written Opinion from PCT/US2016/044792, dated Oct. 20, 2016, 11 pages.
International Search Report and Written Opinion from PCT/U52016/044800 dated Mar. 13, 2017, 8 pages.
Office Action for U.S. Appl. No. 15/748,813, dated Oct. 18, 2018, Schober et al., Low Noise Trans-Impedance Amplifiers Based on Complementary Current Field-Effect Transistor Devices, 14 pages.
Razavi, B., Design of Analog CMOS Integrated Circuits, 2001, McGraw-Hill Higher Education, New York, NY.
Razavi, B., Fundamentals of Microelectronics, Wiley, 2006.
Office Action from related Chinese Application No. 201580083441.5 dated Apr. 26, 2019, 6 pages.
Ajit et al., "The Minority Carrier Injection Controlled field-Effect Transistor (MICFET): A New MOS-Gate Power Transistor Sturcture", IEEE Transactions on Electron Devices, vol. 39, No. 8, Aug. 1992, 7 pages.
Baker et al., "High Speed Op-amp Design: Compensation and Topologies for Tow and three Stage Designs", Jul. 1, 2007, retrieved Jun. 6, 2006 from <<http://cmosedu.com/jbaker/papers/talks/Multistage_Opamp_Presentation.pdf>>, 58 pages.
Extened European Search Report dated Jun. 28, 2019 for European Patent Application No. 15899854.2, 7 pages.
Sugawara, et al., 350 V Carrier injection Field Effect Transistor (CIFET) with Very Low On-Resistance and High Switching Speed, Proceedings of the 7th International Symposium on Power Semiconductor Devices and IC's, May 23, 1995, 5 pages.

* cited by examiner

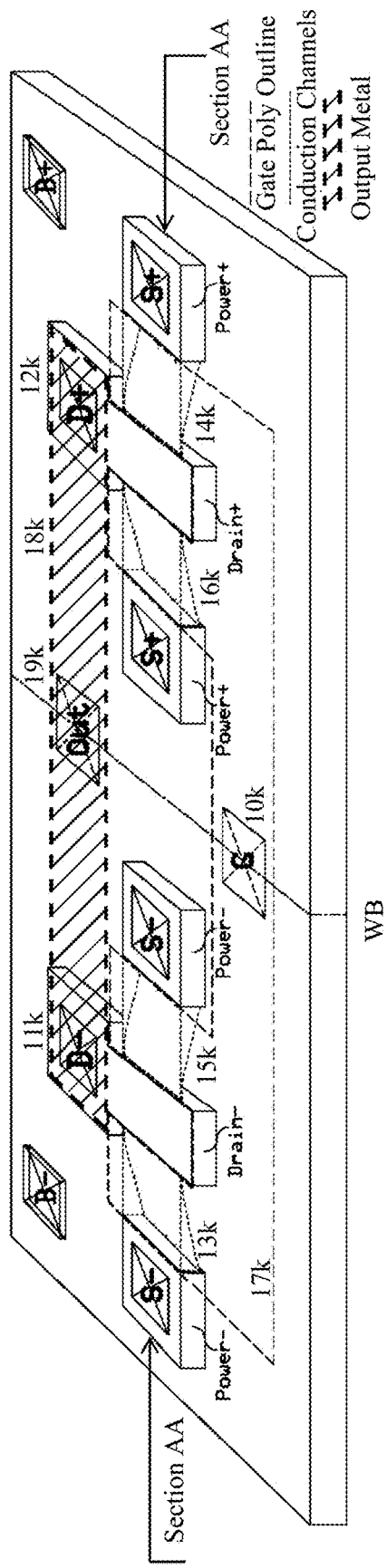
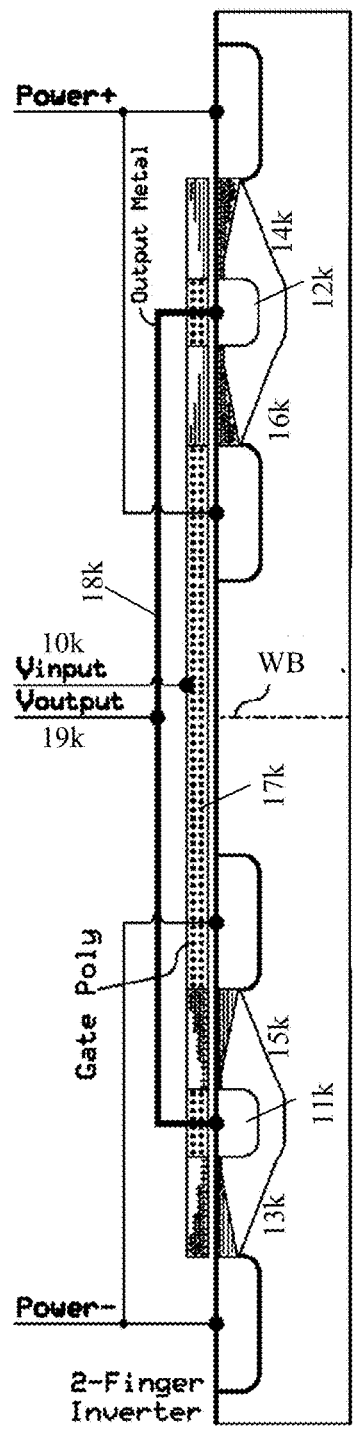
PRIOR ART
Figure 1m
PRIOR ART
Figure 1n

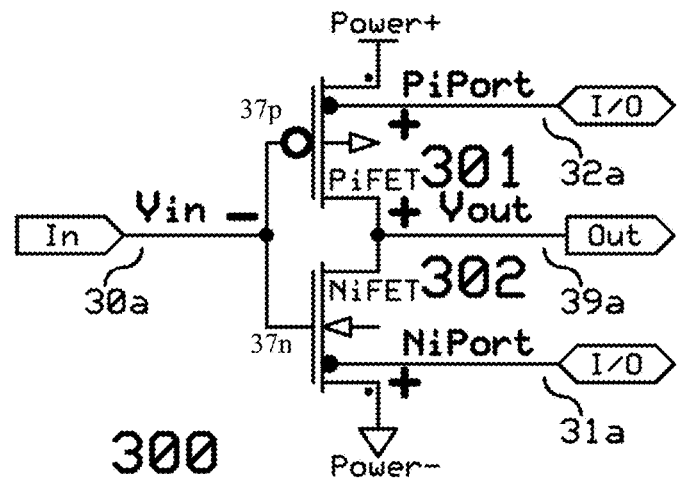
Figure 3a
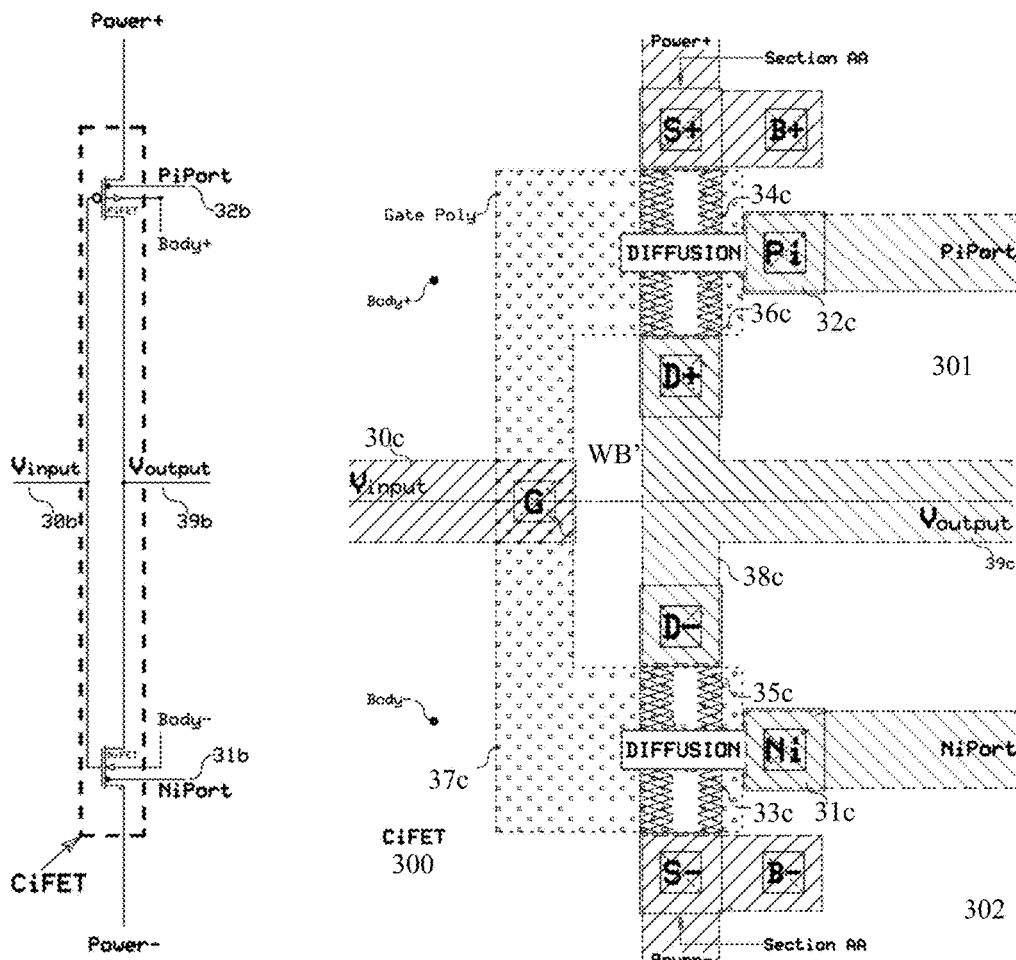
Figure 3b
Figure 3c

CiFET

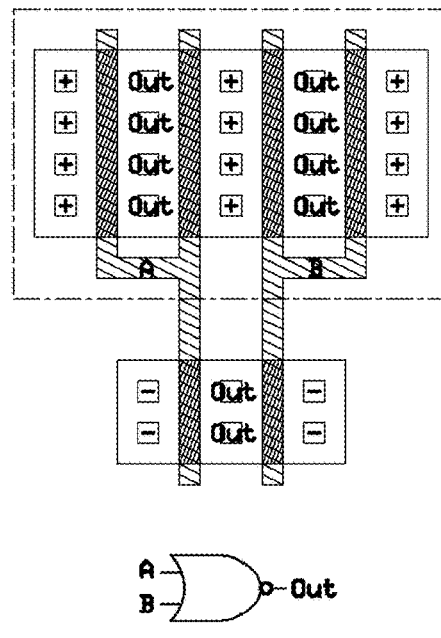
PRIOR ART
Figure 3i
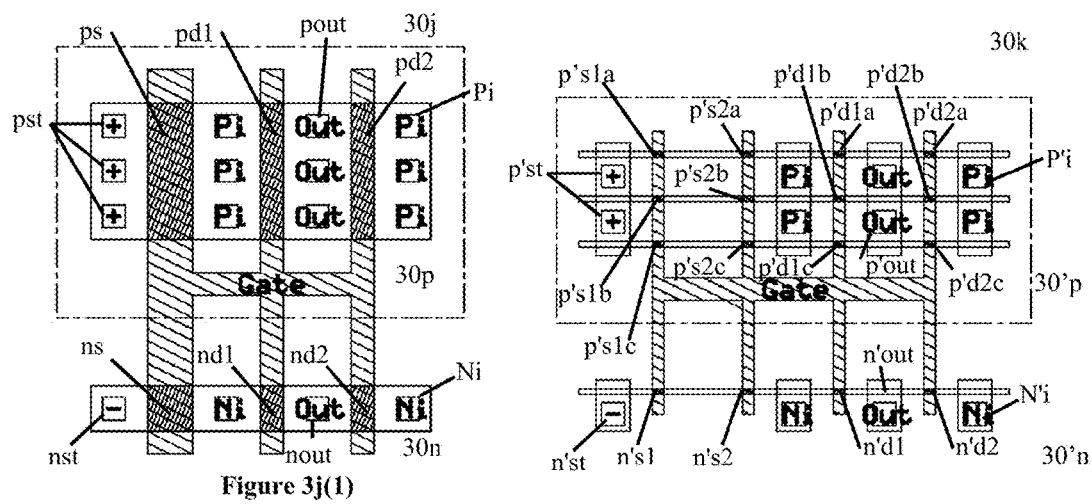
Figure 3j(1)
Figure 3k
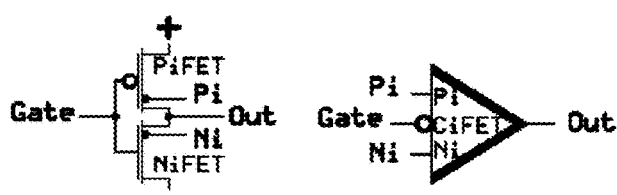
Figure 3j(2)    Figure 3j(3)

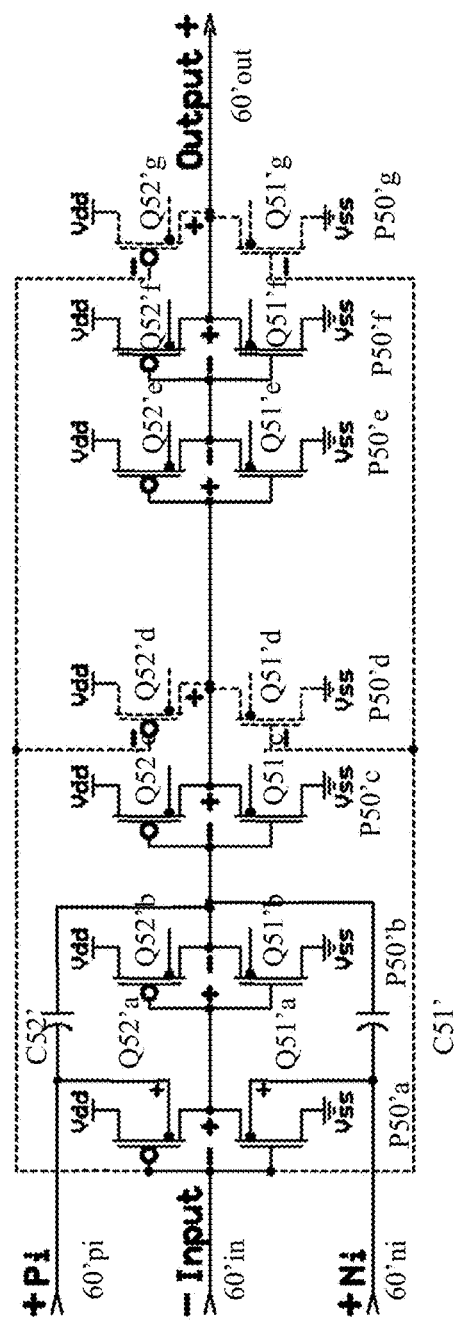
Figure 6a(1)
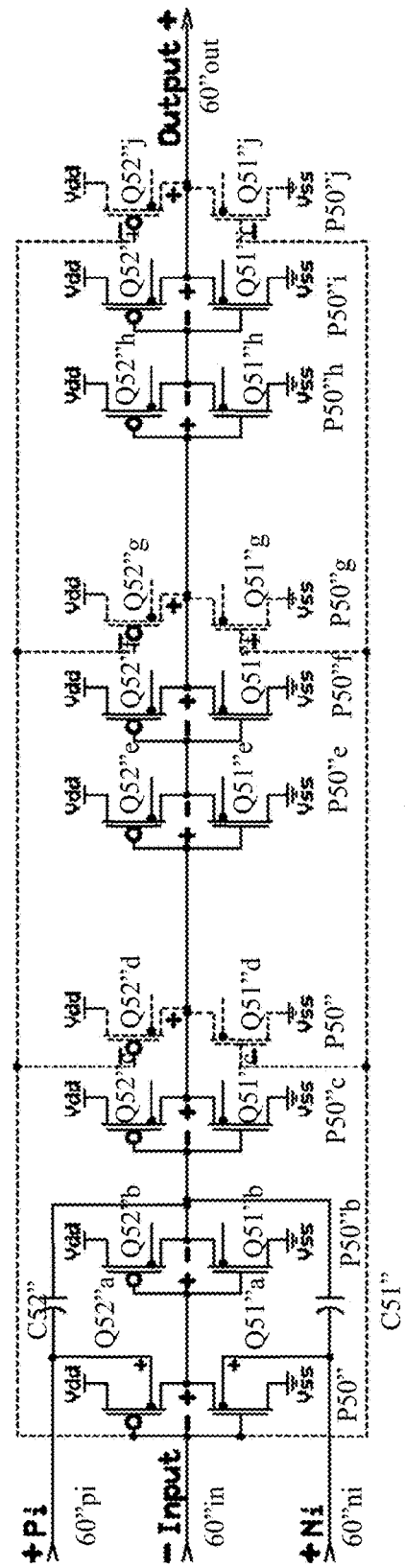
Figure 6a(2)

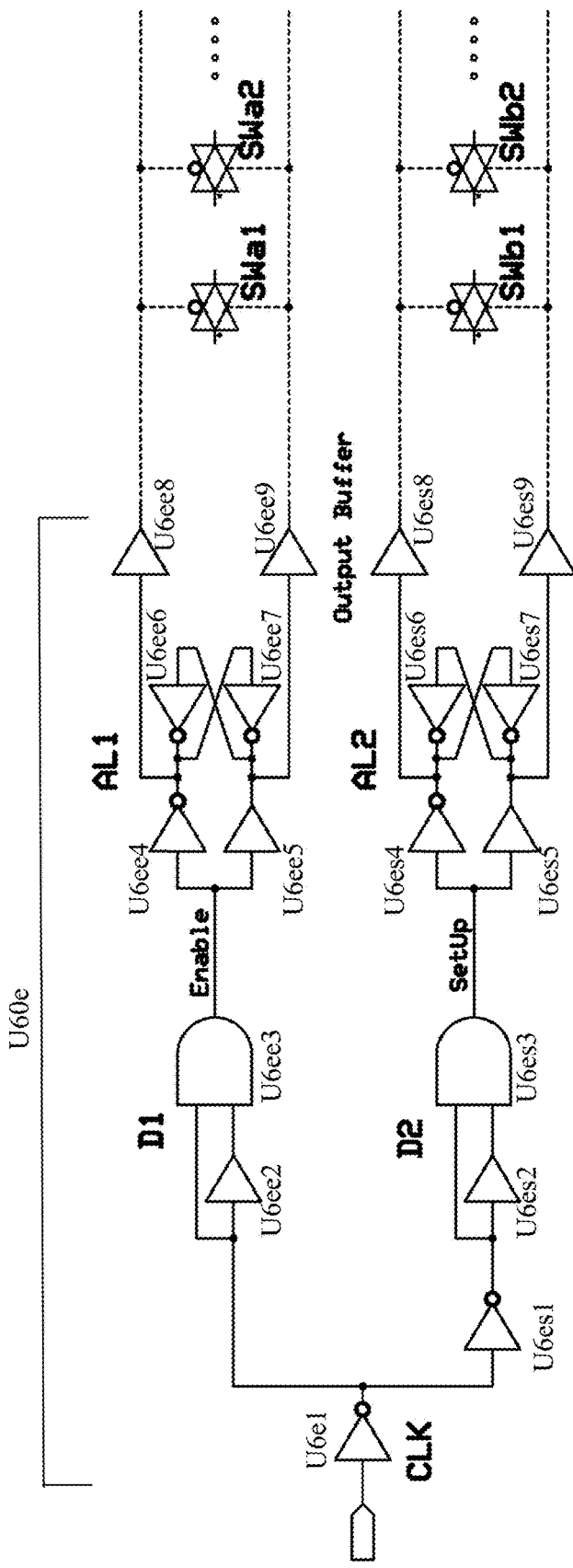
Figure 6e(1)
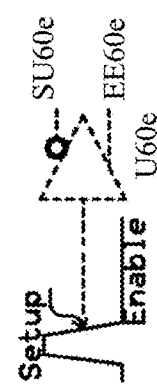
Figure 6e(2)

MULTI-STAGE AND FEED FORWARD COMPENSATED COMPLEMENTARY CURRENT FIELD EFFECT TRANSISTOR AMPLIFIERS

CROSS-REFERENCE TO RELATED APPLICATIONS

The present application is a 35 U.S.C. § 371 National Stage Entry of, and claims priority to, International Application No. PCT/US2016/044770, filed Jul. 29, 2016, which claims priority to U.S. Provisional Application No. 62/198,927, filed on Jul. 30, 2015; U.S. Provisional Application No. 62/268,983, filed on Dec. 17, 2015; and U.S. Provisional Application No. 62/309,903, filed on Mar. 17, 2016, the contents of which are incorporated herein by reference in their entirety.

BACKGROUND OF THE INVENTION

Field of the Invention

The present invention relates to a multi-stage and feed forward compensated complimentary current field effect transistor amplifiers, enabling a charge-based approach that takes advantage of the exponential properties incurred in sub-threshold operation.

Description of Related Art

The new millennium brings with it a demand for connectivity that is expanding at an extremely rapid pace. By the end of year 2015, the number of global network connections will exceed two times the world population and it is estimated that in 2020 more than 30 billion devices will be wirelessly connected to the cloud forming the Internet of Things (or "IoT"). Enabling this new era are the revolutionary developments in mobile computing and wireless communication that have arisen over the last two decades. Following Moore's Law, development of highly-integrated and cost-effective silicon complementary metal oxide semiconductor (CMOS) devices allowed incorporation of digital and analog system elements, such as bulky Analog-to-Digital converters or transceivers, into a more cost effective single chip solution.

In the last few years, however, while digital circuits have largely followed the predicted path and benefited from the scaling of CMOS technology into ultra-deep submicron (sub-µm), analog circuits have not been enabled to follow the same trend, and may never be enabled without a paradigm shift in analog design. Analog and radio frequency (or "RF") designers still struggle to discover how to make high-performance integrated circuits (or "ICs") for ultra-deep sub-µm feature sizes without losing the benefits of shrinking size; including reduced power, compact footprint, and higher operational frequencies. Truly a paradigm shift is needed to break through the established science of analog design to meet the system on chip (SoC) demands of the new millennium.

Prior Art

The core building block of analog circuits is the amplifier. Discrete component amplifiers are free to use resistors, capacitors, inductors, transformers, and non-linear elements as well as various types of transistors. Unwanted parasitics between various components are normally negligible. However, in order to build amplifiers within an integrated circuit, the normal analog circuit components are not readily available, and often take special IC process extensions to obtain these circuit elements if at all. The parasitics on integrated circuit amplifiers are severe due to their close proximity and being coupled together through the silicon wafer they are integrated into. Moore's law IC process advancements are focused on digital, microprocessor, and memory process development. It takes a generation (~18 months) or two to extend the IC process to incorporate analog components, thus analog functionality is generally not included on the latest process single chip systems. These "mixed-mode" IC processes are less available, vender dependent, and more expensive as well as being highly subject to parametric variation. It takes substantial engineering to include sparse analog functionality on any IC which becomes specific to its IC vender and process node. Because analog circuitry is carefully and specifically designed or arranged for each process node, such analog circuitry is highly non-portable. Reprobating this limitation, analog circuit design engineers are becoming scarce and are slowly retiring without adequate replacements.

Operational Amplifiers (or OpAmps) are the fundamental IC analog gain block necessary to process analog information. OpAmps make use of a very highly matched pair of transistors to form a differential pair of transistors at the voltage inputs. Matching is a parameter that is readily available on an integrated circuit, but to approach the required level of matching, many considerations are used: like centroid layout, multiple large devices, well isolation, and physical layout techniques among many other considerations. Large area matched sets of transistors are also used for current mirrors and load devices. OpAmps require current sources for biasing. OpAmps further require resistor and capacitor (or RC) compensation poles to prevent oscillation. Resistors are essential for the "R" and the value of the RC time constant is relatively precise. Too big value for a resistor would make the amplifier too slow and too small results in oscillation. Constant "bias" currents add to the power consumed. In general, these bias currents want to be larger than the peak currents required during full signal operation.

As IC processes are shrunk, the threshold voltages remain somewhat constant. This is because the metal-oxide-semiconductor (or MOS) threshold cutoff curve does not substantially change with shrinking of the IC processes and the total chip OFF leakage current must be kept small enough to not impact the full-chip power supply leakage. The threshold and saturation voltage tends to take up the entire power supply voltage, not leaving sufficient room for analog voltage swings. To accommodate this lack of signal swing voltage, OpAmps were given multiple sets of current mirrors, further complicating their design, while consuming more power and using additional physical layout area. This patent introduces amplifier designs that operate even better as power supply voltages are shrunk far below 1 volt.

The conventional MOS amplifier gain formation is an input voltage driving a trans-conductance ($g_m$) which converts the input voltage into an output current. This output current then drives an output load which is normally the output of a current source for the purpose of establishing a high load resistance. This high resistance load converts the output current back into an output voltage. The equivalent output load resistance is actually the parallel combination of the load current source transistor and the amplifier output transistors. In order to keep this equivalent load resistance high to provide the required voltage gain, these load transistors must be very long, but to drive enough current these transistors must be very wide also, thus very large transistors are necessary. It also might be noted that the load resistance the amplifier output drives is additional parallel resistance that reduces the voltage gain. It should also be noted that a load capacitance interacts with the amplifiers output resistance, modifying the AC performance. What is actually needed is exactly the inverse operating principle, which the present invention is about. FIG. 1a is a transistor level schematic diagram of a high-quality MOS IC OpAmp as a baseline reference (from the Wiley textbook: Analysis and Design of Analog Integrated Circuits by Gray and others, 4$^{th}$ edition pg. 482) which is used for comparison in the description of the amplifiers illustrated herein.

The baseline comparisons are (all made in an 180 nm IC process) in the form of performance plots as in: a Bode Gain-Phase plot over frequency FIG. 1b, when $V_{dd}$=1.8 Volts and $R_{cmp}$=700 ohms. Wherever possible all the axis scales for each of these three comparison plots are kept the same. A readily available 180 nm process was selected for comparison of all the comparative examples in this document because the conventional prior art amplifiers work best and have had the most usage and have mature mixed-mode IC process extensions offered which are required for conventional analog. Also as the IC process is shrunk and the power supply voltage is decreased, this is where the implementations of the present invention become highly beneficial.

Normally MOS amplifiers operate within a square-law relationship due to the strong inversion MOS transistor square-law characteristics; these are not very well defined or predictably stable to the degree that analog circuits need. Exponential-law operation, like bipolar transistors operation is higher gain, stable, and well defined. At very weak operating conditions, MOS transistors convert to exponential operation, but they are too slow to be of very much use. Furthermore, the "moderate-inversion" transition between these two operating mode provide non-linarites that lower the quality of analog MOS circuits. At the threshold voltage, where MOS transistors operate around, is where 50% of the current is square-law and the other 50% is exponential. This is the definition of threshold voltage in the latest MOS simulation equations. Full exponential MOS operation at high speed would provide higher gain that is predictable, stable, and well defined. This patent is about amplifiers that operate in the exponential mode.

To understand the prior art, let's begin with a discussion of Weak vs. Strong inversion. Referring to FIGS. 1e and 1f, weak inversion is the range where most designers would consider the transistor to be OFF:

Drain to Source voltage is small (on the order of 100 mV);
The gate G (or 17s) is at a similar small potential (typically less than 300 mV);
This creates a surface conduction layer, of uniform depth from source S to drain D;
The conductivity of this surface layer is exponential with respect to the Gate G voltage;
This allows operation over many decades (about 6) of dynamic range;
The channel appears as a moderate value resistor (100$^+$s of K-Ohms); and
The uniform depth conduction channel promotes an exponentially higher gain but with a speed penalty (due to low charge density in the conduction channel).

Strong inversion (referring to FIGS. 1g & 1h) is characterized by a graduated conduction channel, deeper near the Source and shallow near at the Drain:

Drain to Source voltage is larger than the Gate to Source voltage Vg of FIG. 1g and threshold $V_{threshold}$ in FIG. 1h (typically in excess of 400 mV);
The Gate 17u is operated above its threshold voltage $V_{threshold}$;
This creates a conduction channel that is deeper at the Source and tapers to near pinch-off at the Drain 12u;
The resulting conduction layer behaves with a Square-law response to the gate voltage at the Gate 17u;
Dynamic range is limited to about 3 decades as compared to weak inversion;
The channel 12g appears as an adjustable current source (high value resistor); and
The wedge shape of the conduction channel 12g provides higher speed than weak inversion because of higher charge density in the conduction channel.

Now, referring back to FIG. 1e, which shows the channel 12e development under weak inversion conditions. The conduction channel 12e has a relatively even distribution of carriers over its entire length and width. Note that the conduction depth 10s of the entire channel is the same as the pinch-off area 12u on the right side of FIG. 1g. This thin conduction layer contributes a significant amount of noise because the channel current travels along the surface where charge carrier defect traps are concentrated. The Gate 17s to channel voltage $V_g$ in FIG. 1e has a strong (exponential) effect on the density of carriers in this conduction layer.

FIG. 1g shows the channel 12u development under Strong inversion conditions. The higher potential difference between Source and Drain over the gate 17u causes "channel length modulation" (the flat part of the channel 12u), resulting in pinch-off near the drain diffusion where the channel reaches a thin layer near 12u. The pinch-off region 12u (where the carriers are forced to the top of the channel) imparts significant noise by means of surface defect carrier traps. The higher the drain voltage $V_d$, the longer the pinch-off region and thus the higher the contributed noise, thus it is desired to keep this voltage low for low noise contribution to the channel current. Other effects such as velocity saturation and hot electron jumping over into the gate oxide are noted around this thin saturated pinch-off region, thus it would be highly desirable to minimize this region by lower voltage and semiconductor doping profiles.

FIG. 1h shows a characteristic plot which approaches a "constant current" relationship between drain current $I_d$ and drain voltage $V_{ds}$ with a fixed Gate voltage $V_g$ on the gate G. It is to be noted that the drain voltage $V_{ds}$ spans a large range of nearly the power supply voltage $V_{dd}$, while maintaining the same current as opposed to the limited drain voltage range of FIG. 1f.

FIG. 1i to 1k illustrate a prior art MOS structure, commonly known as a CMOS inverter, that turns out to actually combine both modes of operation. A pair of MOSFETs with opposite conductivities, PFET and NFET, are complementary connected with each other. For example, the input 10i, 10j, 10k is connected to both the gate control terminal of PFET and the gate control terminal of NFET, the source of PFET is connected to power supply (+), while the source terminal of NFET is connected to power supply (−); and the drain of PFET and the drain of NFET connected together for $V_{out}$ 19i.

FIG. 1j shows the structure related to a physical layout abstraction shown in FIG. 1k, which is 2×strength CMOS or two-finger inverter of prior art. As stated above, gate terminals of PFET and NFET are connected together to receive $V_{input}$ 10j and 10k and the drain terminals of PFET and NFET are connected together for producing $V_{output}$ 19j and 19k. The layout shown in FIG. 1k structurally corresponds to that of FIG. 1i. As it can be seen, to minimize various shortcoming from the conventional FET layouts, such as minimizing parasitic output capacitance, the source terminal of PFET, for example, is split into two source terminals S+ and S+, and the drain terminal D+ 12k is displaced therebetween for forming a pair of parallel channels 14k and 16k between S+ and D+ 12k; p-channel region of the gate G covers the parallel channels 14k and 16k. Divided by the well border WB, NFET is also provided with a pair of source terminals, S– and S–, and the drain terminal thereof, D– 11k is displaced therebetween for forming a pair of parallel channels 13k and 15k between S– and D–; n-channel region of the gate G further covers the parallel channels 13k and 15k. Drains 12k and 11k are connected therebetween through metal work 18k and forms $V_{output}$ 19k.

A 3-dimensional prospective view of this MOS transistor structure is shown in FIG. 1m, while cross sectional view at section AA in FIG. 1m is shown in FIG. 1n. This structure is inherent in a 2× or two-finger inverter as shown in FIGS. 1j and 1k. As it can be seen therein at the parallel channels 14k and 16k in PFET and the parallel channels 13k and 15k, all of these channels taper from the drains D+, D– to the sources S+, S–.

Although similar MOS structures appear in prior art, no significant exploitation of many of its unique properties are known or published. In addition, proper biasing remains as a problem(s) for its operation(s). A deeper understanding of the internal mechanisms resulted in discovery of many desirable applications (enabling superior operation at deep-sub-micron scale), including an approach to proper biasing that takes advantage of natural equilibrium. This natural equilibrium is the result of a "Band-Gap" voltage reference mechanism, again functional at deep-sub-micron scale.

Referring to FIGS. 1p and 1q, some references show a MOS field effect transistor device with two identical regions 13p/13q and 15p/15q of like "conductivity type" separated by a diffusion region 11p (designated as Z for Low Impedance in the prior art). Multiple papers by Bedabrata Pain/R Schober, Jet Propulsion Lab and Jacob Baker/Vishal Saxena, Boise State University, including Pain, Bedabrata et al., "A Self-Cascoding CMOS Circuit for Low-Power Applications", Center for Space Microelectronics Technology Jet Propulsion Laboratory, California Institute of Technology, contain such references, but these references do not exploit any opportunities as shown in this document, especially when complementary devices like this are combined into a single composite device as will be explained in this invention. Such configurations have been called self-cascading or split-length devices. The two regions of such a configuration are arranged between source and a drain diffusions and have both a high impedance common gate connection and a low impedance connection to the mid channel regions. This low impedance mid channel control input, when exploited as outlined in this document, enables an entirely new set of analog design methods.

Although a cascade amplifier can be found in prior art, the prior art does not contain a complementary pair of cascade transistors connected as a totem-pole. With this simple compound structure, feedback from the output to the input can be used to self-bias the resulting inverter into its linear mode. As mentioned above, biasing of an amplifier has always been problematic; however, the novel and inventive self-biasing structure of the present invention addresses such an issue. Advantages of the configuration of the present invention (referred to as a complementary iFET or CiFET) are many, including, but not limited to:

Gain of the single stage is maximum when the output is at the midpoint (self-bias point);

The gain of a single CiFET stage is high (approaching 100), therefore, while the final output may swing close to the rails, its input remains near the midpoint. The stage before that, because of the high gain, operates its input and output near the mid-point ("sweet-spot") where the gain is maximized. So too for each of the preceding stages;

Slew rate and symmetry are maximized where the channel current is highest (near the mid-point);

Noise is minimized where the channel current is highest (near the mid-point); and Parasitic effects are negligible where the voltage swing is small.

When the gate input signal moves in one direction, the output moves in the inverse direction. For example; a positive input yields a negative output, not so much because the N-channel device is turned on harder, but rather because the P-channel device is being turned off. Thevenin/Norton analysis shows that the current through the P and N devices must be exactly the same, because there is nowhere else for drain current in one transistor to go except through the drain of the complementary transistor; however the voltage drop across those devices does not have to be equal, but must sum to the power supply voltage. Due to the super-saturated source channel, these voltages are tied together exponentially. This is even more evident at low power supply voltages where the voltage gain peaks. This means that the gate-to-source voltage is precisely defined by the same and only drain current going through both transistors. Exponentials have the unique physical property like a time constant, or "half-life;" It does not matter where we are at a given point of time, a time constant later we will be a fixed percentage closer to the final value. This is a "minds-eye" illustration of the primary contributor to output movement in response to input change. This same current balance of gate-to-source operating voltages also indicates why the "sweet-spot" in the self-biased amplifier is so repeatable. In effect it is used as a differential pair-like reference point to the amplifier input signal.

It is to be noted that during the transition from vacuum tubes to bipolar transistors the industry underwent a major paradigm shift, learning to think in terms of current rather than voltage. With the advent of FETs & MOSFETs the pendulum swing is back toward thinking in terms of voltage, but much knowledge has been lost or forgotten. Herein is contained the rediscovery of some old ideas as well as some new ones, all applied to the up-coming "current" state of the art. It is believed that the inherent simplicity of the present invention speaks to their applicability and completeness.

A first issue may be that there is always a need for a little analog functionality, yet nearly all analog performance metrics of a MOS transistor are remarkably poor as compared to that of a Bipolar transistor. The industry has made MOS devices serve by employing extensive "work-arounds." Conventional analog design is constrained by one or more of the followings:

Power supply voltages sufficient to bias the stacked thresholds, and transistors large enough to supply the necessary output drive current while still providing the high output impedance required for linearity and gain ($g_m*R_L$).

Lack of analog IC process extensions (unavailable at nanometer scale) are required for linear signals, let alone with the enhanced performance demonstrated herein.

Resistors, inductors, and large capacitors are mostly non-existent for analog designs in newer IC processes.

In contrast, bipolar transistors can be made to have high gain ($\beta$), wider bandwidth, wider dynamic range (many decades, from near the rails down to the noise floor), better matching (found in differential pairs), and band-gap references. Junction FETs, which operate with sub-surface channel conduction below the surface defects, have lower noise than bipolar transistors. Likewise the CiFET super-saturated source channel operates primarily below the defects at the channel surface underneath the gate oxide.

MOS designs are poorer in the above areas but have their own extreme advantages, including, but not limited to:
  MOS devices are small and relatively simple
  highly scalable
  high speed
  low power
  ultra-dense/high functionality systems on a chip, where Bipolar designs cannot go (deep sub-µm scale).

Accordingly, building analog circuits on an IC has always been problematic. Engineering around poorly performing analog components has been the overriding objective for analog IC designers since analog circuits have been integrated. This drove the need for digital signal processing with algorithm development yielding digital magic.

Today the real-world of analog circuit design, signals still need to be converted on both the front and back end of signal processing systems. This need has become a road-block at deep sub-µm scale.

Another problem may be that solid-state amplifiers have been notoriously non-linear since their inception. To make them linear, increased open loop gain (with levels significantly higher than is ultimately needed) is traded for control over actual circuit gain and linearity through the use of a closed loop (feedback). A closed loop amplifier requires negative feedback. Most amplifier stages are inverting, providing the necessary negative feedback. A single stage inverter, with a closed loop, is stable (does not oscillate). Increased loop gain requires stages be added such that there are always an odd number of stages (sign is negative), to provide the necessary negative feedback. While a single stage amplifier is inherently stable, three stages and most definitely five stages are unstable (they always oscillate—because they are ring oscillators).

The problem then is how to properly compensate a multi-stage closed loop amplifier while maintaining a reasonable gain-bandwidth product. This is particularly difficult at deep-sub-micron scale where circuit stages must be simple in their design. The severely limited power supply voltages preclude the use of conventional analog design approaches. Additionally, it is desirable to avoid reliance upon analog extensions but rather to accomplish the necessary analog functions using all digital parts, to improve yields and decrease costs. Using all digital parts allows analog functions at process nodes that do not yet have analog extensions, and may never have them.

There is a long felt need for low-cost/high-performance systems integrated on a single chip for affordable high-volume devices such as the Internet of things, smart-sensors, and other ubiquitous devices.

SUMMARY OF THE INVENTION

The present invention relates to circuits built out of a novel and inventive compound device structure, which enables a charge-based approach that takes advantage of exponential relationships of a super-saturated source channel described in relation to FIGS. 2a, 2b, 2c and 2d below which possesses sub-threshold-like operation when used for analog CMOS circuit designs. The present invention is an evolution of an ordinary CMOS inverter. It provides extremely high precision, speed, linearity, low noise, and a compact physical layout, using an all-digital nanoscale or deep sub-µm IC process. In addition to the expected digital inverter function, five classes of analog circuits are exemplified: a voltage input amplifier, a current input amplifier, a current inverter as opposed to a current mirror, an adjustable delay circuit, and a voltage or current reference source. Take special note that analog functionality is realized, in a digital IC process, using a single optimized digital logic circuit cell.

A preferred embodiment of the present invention, it provides a stacked pair of transistors with a common gate, mirrored with a complementary pair (like a digital inverter), with the option of feedback from its own output to establish an optimum bias point. This configuration offers additional control inputs that respond to current rather than voltage and so provides an ideal connection for roll-off compensation in a multi-stage amplifier. Drawing inspiration from the past, concepts developed for the chopper stabilized amplifier are rediscovered and may be applied to lend an element of parametric tolerance and stability uncommon in the industry.

According to one aspect of the present invention, it provides a CiFET amplifier, which is a basic Analog-in-DIGITAL building block. It is impractical to try to construct analog systems at small scale using the same system design techniques that have been previously applied at larger scales. The solution is to convert analog signals to digital as early as possible and take advantage of digital signal processing techniques that are available today. To accomplish this it is necessary to have a reliable, precision front-end and that requires a high-precision amplifier. The techniques in this specification point to such a solution. On the way several unexpected yet desirable discoveries have appeared, and there is no reason to think all possible applications of these techniques have yet been discovered.

According to another aspect of the present invention, it takes advantage of the Doping Profile and Ratioing. Not everything in optimizing a circuit has to do with the circuits' electrical configuration. Proper device sizing and especially adjusting the size relationship between complementary transistors provides considerable performance benefits. The iFET, being a compound structure, offers extensive opportunity to establish impedance matching and gain control through proper ratio of the physical device parameters. Other important characteristics, like noise, speed, and power, can be tailored through careful specification of the physical construction and doping of the transistors, rather than relying solely on circuit configuration.

According to yet another aspect of the present invention, it provides certain noise advantages. In the end, it comes down to signal-to-noise ratio. Low power supply voltage requirements in ultra-deep-sub-micron IC processes limit the maximum signal swing to a much smaller number than most analog designers are used to. So with a smaller signal, the low-noise techniques embodied herein must be employed in order to maintain the desired signal to noise ratio.

Additional Advantages may be provided by the present invention. The primary advantage delivered by this technology is the ability to produce analog building blocks constructed entirely from digital parts, without analog extensions. Equally important is the fact that it actually operates at ultra-deep-sub-micron scale, and operates best at reduced power supply voltages below one volt as required for ultra-deep sub-µm IC processes. These three factors contribute to an unprecedented portability of designs across process nodes. Entirely new circuit designs will be realized because of a FET that has more than one control input. The CiFET offers a high-impedance voltage control on the gate while simultaneously offering a low-impedance current control at the iPorts. These two inputs operate independently of each other and their independent response is summed at the output.

According to yet another aspect of the present invention, it provides complementary iFET technology that can be configured as a multi-stage voltage input to voltage output amplifier (or CiAmp). For example, a multi-stage amplifier using the CiFET compound device is quite simply a string of inverters. It has considerable open loop gain, but as is the case with high gain open loop amplifiers, linearity suffers. Closing the loop from output to input trades some of that gain for improved linearity. At the same time, closing the loop causes multiple inverter stages to oscillate, after all it is a ring oscillator. This problem is overcome by causing one of the stages to be significantly slow (the dominant pole). An inverter stage, constructed from CiFETs, provides a termination point for capacitive feedback to accomplish this roll-off. The circuit shown in this section allows the use of extraordinarily small capacitors to provide the necessary compensation, but their small size contributes to rapid step response recovery time, as well. This application of the CiFET for roll-off control is adaptive in that as gain increases due to parametric variation, increased roll-off is needed, but this is self-taken care of by the increase in CiFET gain. Also using CiFETs in all of the stages improves the gain and symmetry, allowing a minimum number of stages for any accuracy requirement.

According to yet another aspect of the present invention, it provides a complementary iFET compound device, which can be configured as a current input trans-impedance amplifier (CiTIA). For example, the CiTIT compound device, used as a current amplifier, offers an unexpectedly wider dynamic range with great linearity over an extreme frequency range. This CiTIA provides constant gain and input resistance in its passband. The CiTIA of the present invention does not suffer from phase shift in the passband. The input resistance on the iPort current input can be matched to a transmission line impedance offering an unprecedented distortion-free Low Noise Amplifier (LNA) which has a constant linear transfer function without phase-shift from a pico-level input signal up to output saturation signal level which is incurred when a minute signal rides on background signals that are a million times higher. This CiTIA operates with power supplies down to the millivolt level with a reasonable bandwidth. The CiTIA is not dependent on operation above the normal MOS threshold voltages. A skilled reader in the art would appreciate and find it useful in many applications as a gain block that is unencumbered by the surrounding parasitics, due to the fact that CiTIA of the present invention exhibits an incredibly higher signal to noise ratio. Such a performance is seldom seen, even in state-of-the-art LNAs.

According to yet further aspect of the present invention, it provides a surprisingly simpler scheme to provide a voltage controlled gain. In another configuration, two inputs are summed with low, or NO intermodulation distortion.

According to further aspect of the present invention, it provides a complementary iFET compound device, which can be configured as a Voltage Controlled Delay or Voltage Controlled Oscillator (or CiVCO). For example, the CiFET compound device can be operated as an analog version of the tri-state digital inverter, in that the output can be switched on or off, but can also find itself at any drive level in between on and off. This variable strength output allows slew rate control into a fixed capacitive (perhaps parasitic) load which means variable delay in an open loop configuration or variable frequency in a closed loop configuration. Unlike prior art, where output amplitude suffers as a result of varying the delay, this approach provides a full output amplitude at any delay or frequency.

According to yet further aspect of the present invention, it provides a CiFET "Band-Gap" Voltage Reference Generator. For example, the CiFET compound device self-biases, because of inherent process matching, can be used to Bias other circuitry in the vicinity.

According to yet another aspect of the present invention, it provides many other different applications, where the CiFET may improve performance. It is not to be construed as an exhaustive list but rather a glimpse at the far ranging possibilities for the future. Several illustrative circuit examples are provided to illustrate the CiFET compound device flexibility.

BRIEF DESCRIPTION OF FIGURES

FIGS. 1b to 1d are a baseline set of representative performance plots illustrating frequency domain performance and power supply dependency of the prior art OpAmp of FIG. 1a;

FIG. 1m shows a three (3) dimensional perspective view of the two (2) finger inverters of prior art;

FIG. 1n shows cross-sectional view at Section AA shown in FIG. 1m;

FIG. 2c shows a graph of drain voltage $V_{ds}$ and drain current $I_s$ when there is no iPort injection current, while

FIG. 3a illustrates a schematic diagram of complimentary pair of iFETs of the present invention;

FIGS. 3b and 3c illustrate a physical layout abstraction of a complementary iFET (or CiFET) compound device of the present invention;

FIGS. 3i illustrates a physical layout of NOR gate of a prior art;

FIGS. 3j(1) 3j(2) and 3j(3) show a physical layout, corresponding schematic diagram and the corresponding symbol of a CiFET of the present invention;

FIG. 3k shows a physical layout of the CiFET of the present invention, using Fin field effect transistor technology;

FIGS. 5c and 5d show Gain and Power Consumption of the 3-Stage CiFET Amplifier (as shown in FIG. 4a with feed-forward), where Composite Amplifier Voltage Gain for the ±1 volt p-p Step input of FIG. 5a;

FIGS. 6a(1) and 6a(2) shows schematic diagrams of other preferred embodiments of multi-stage CiAmp of the present invention;

FIG. 6e(1) shows a schematic diagram of a preferred embodiment of a break-before-make switch control signal generation circuit;

FIG. 6e(2) shows a symbol representation of the switch control shown in FIG. 6e(1);

DETAILED DESCRIPTION OF THE INVENTION

A MOS structure referred to herein as an iFET, where the letter "i" refers to a current and "FET" refers to a Field Effect Transistor, is the enabling element of several high performance and novel designs of the present invention. The present invention is based on the addition of a direct connection to a mid-point in a Field Effect Transistor (or FET) channel and the realization that this is a low impedance port (current port, or herein referred to as "iPort") providing a bidirectional current sink/source mid-channel with a very low input impedance at a low saturation voltage, and additionally connecting reciprocal iFETs pairs of opposite "conductivity type" (P-type & N-type) interconnected to take advantage of their complementary nature to operate as a team and symmetry to self-bias near the midpoint between power supplies. In addition, the relative strength of the first and second channels of the iFETs can be adjusted (threshold choice, relative sizing, and doping profiles) to tailor the gain, speed, quiescent current and input impedance of such a complementary iFET (or CiFET) compound device of the present invention.

The iFET, with its iPort provides an uncommon and unexpected solution to the compensation problem, and then continues to provide new or alternative solutions to other old problems, exceeding industry expectations. The advantages of operating circuits in "weak inversion" have long been known but, so also have the problems. The CiFET enables circuits to exploit the high gain and wider dynamic range available in "weak inversion," without sacrificing superior speed performance. The CiFET compound device provides a standard active IC gain device that is superior to ordinary analog MOSETs making digital ICs host analog functionality. It is not a tradeoff.

The following is a list of some of the unusual aspects of a CiFET based circuit, including, but not limited to:
  Operates at low power supply voltage;
  High gain;
  Extremely linear;
  Very high speed (wide band);
  Self-Biasing;
  Low noise;
  Quick recovery (DC);
  Uses all digital parts and processes;
  iPorts respond to charge (things in nature are charge based) rather than Volts across a Resistance; and
  iPort has wide dynamic range with constant gain in an open loop.

Figure 2A:
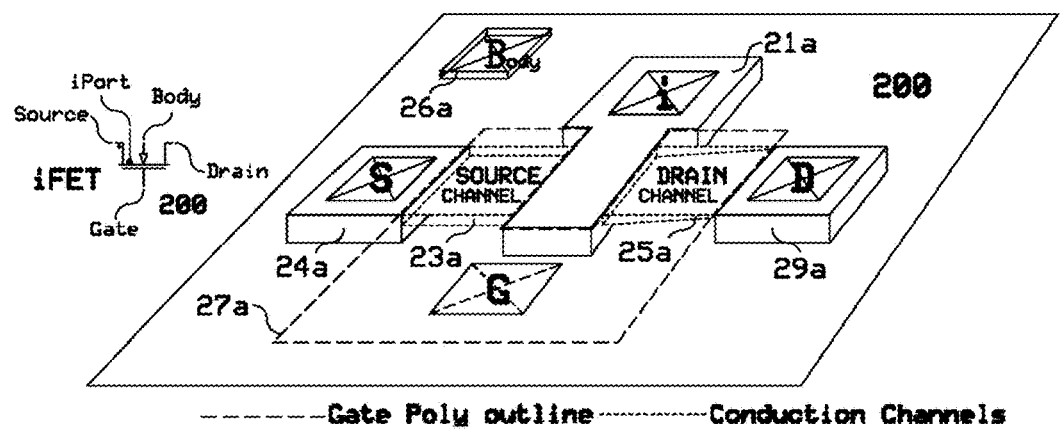
FIG. 2a illustrates a three (3) dimensional prospective view of a MOS field-effect transistor (or iFET) with a new mid-channel bi-directional current port (iPort) of the present invention.
Figure 2B:
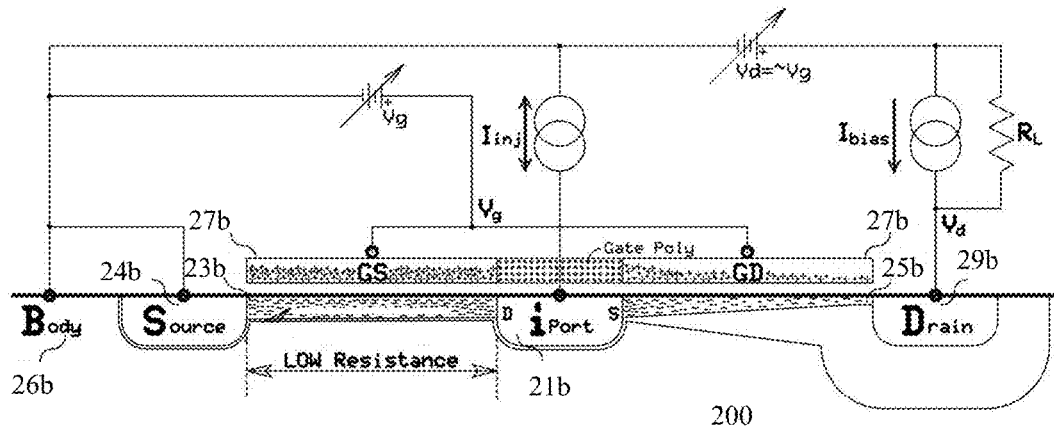
FIG. 2b illustrates a cross-sectional view of iFET of the present invention with visualized channel charge distributions.

Referring to FIGS. 2a and 2b, according to a preferred embodiment of the present invention, it provides a current FET (or iFET) 200, which is comprised of substrate 26a or 26b, source terminal 24a or 24b, and drain terminal 29a or 29b, defining therebetween two channels 23a and 25a, or 23b and 25b on the substrate 26a or 26b, respectively, typically the first (source channel 23a, or 23b) is connected to the power supply (not shown) while the second (drain channel 25a, or 25b) connects to the load (not shown). The substrate 26a or 26b is N- or P-type. The two channels, source and drain channels 23a and 25a, or 23b and 25b, respectively, are connected to each other as shown in FIGS. 2a, and 2b, at the iPort control terminal 21a or 21b, and the channels 23a and 25a, or 23b and 25b, share a common gate control terminal 27a or 27b, respectively. This configuration means that the iFET 200 has more than one control input terminal.

The gate control terminal 27a or 27b operates like a conventional MOSFET insulated gate, with its high input impedance and a characteristic Trans-conductance ($g_m$) transfer function. Typical values of ($g_m$) for a small-signal MOSFET transistor are 1 to 30 millisiemens (1 millisiemen=1/1 K-ohm) each, a measure of Trans-conductance.

The iPort control terminal 21a or 21b is low impedance with respect to the source terminal 24a or 24b, and has a transfer function that looks more like beta (β) of a bipolar transistor, but is actually Trans-resistance (or $r_m$), or more generally, especially at high frequencies, Trans-impedance, measured in K-ohms, where the output voltage is a consequence of an input current. Depending on the channel sizing ratio of the CiFET the typical resistance values (or values of $r_m$) for a small-signal iFET transistor 200 are from 1 KΩ to 4 MΩ, a measure of Trans-resistance. Current input to voltage output (Trans-impedance) is the basis for the assertion that 1 µA in will yield an output of 100 mV (or a gain of 100,000:1) at a large signal level, or 1 pA in will yield an output of 100 nanoV (or a gain of 100,000:1) in a low noise amplifier (or LNA) (both results from the same circuit and linear over this dynamic range).

These values have been shown to remain true for a single minimum sized iFET, with inputs from 1 pico-ampere to 10 micro-amperes, using the same circuit in simulation. In 180 nm CMOS construction the noise floor limits measurements below about 10 pico-amps. iFETS can be constructed with different length to width proportions with very predictably differing results.

High gain, uncharacteristic or surprising results differing from the state of the art designs, is the result of the "Weak inversion" characteristics of the source channel 23b of the iFET 200 operating in a highly ionized super-saturation mode of FIG. 2b.

Speed in this super-saturated source channel 23b is not limited by the transit time of carriers along the channel 23b, but the high concentration of ionized charge carriers in the active channel only have to push the surrounding charge a little as charge is either added or removed from the channel 23b by means of the iPort control terminal 21b, resulting in a diffusion current which is defined by exponential relationship as has been realized when a MOSFET is operated in weak-inversion. This is in contrast to an electric field causing the charge to transit the channel, which is a square-law function of the gate control voltage. In this configuration, speed is faster than logic built from the same fundamental transistors and unhampered by the "Weak inversion" stage that has higher gains like bipolar transistors. As opposed to bipolar transistors, control current can go either in or out of the iPort control terminal 21b as well as operate with no iPort current, which is useful for creating a self-bias operating point.

Lower noise is facilitated by the self-biased operating point. Here the potential at drain terminal 29a or 29b is the same as potential at the gate control terminal 27a or 27b, greatly reducing the pinch-off effect found in conventional analog circuit designs.

The iFET 200, because of the common gate connection over the source channel 23a/23b and the drain channel 25a/25b, places a higher than expected voltage on the gate control terminal 27a/27b (or GS) of the source terminal 24a/24b or source channel 23a/23b. This higher than expected voltage is responsible for a much thicker and deeper (lower resistance highly ionized) conduction layer, allowing the majority of carriers to avoid the traps in the surface of the crystal lattice, hence—much lower noise similar to the manner in which a junction field effect transistor (or j-FET) conduction channel is located below the surface.

Trans-resistance ($r_m$) is the "dual" of Trans-conductance ($g_m$). When you look up Trans-resistance, most of the references are to inductors and capacitors, suggesting that the iFET may be useful in synthesizing inductors.

The iFET works in the following ways: A low noise amplifier requires a low impedance channel. A low impedance channel is low in voltage gain while high in current gain. To establish voltage gain, a second stage, operating as a current to voltage converter, is required. A cascaded pair provides such a configuration. Biasing requirements for a cascaded pair preclude its use at low voltage unless a solution for the biasing problem is found. The iFET provides the solution to this problem through self-biasing of a complementary pair. The impedance of the channel can be designed to accommodate the impedance of the particular signal source driving it (see later section on ratio).

Regarding FETs in general, carriers are attracted to the surface by the gate field, a low gate voltage creates a thin surface-layer on the channel (where the conductivity takes place) while a higher gate voltage creates a thicker underlayer. The thin layer of carriers is impeded by the non-uniform surface defects resulting in electrical noise, while a thicker layer of carriers finds a smoother path below the surface, thus reducing total electrical noise. This indicates that higher gate voltage translates to lower noise.

Referring to FIG. 2b, in the iFET 200, the electric field created by the gate voltage Vg on the gate control terminal 27b causes carriers to rise from the substrate 26b into the source channel 23b region converting the semiconductor material to a conductor with a relatively large number of carriers per volume or at saturation, thus establishing a level of conductivity.

Injection current $I_{inj}$ introduced into the iPort control terminal 21b increases the diffused charge (number of carriers per volume) over and in the source channel 23b, thus making the source channel 23b even more conductive. The rate of conductivity change is exponential, similar to that found in "weak inversion." This exponential rate of conductivity change is due to the low voltage gradient along the source channel 23b (source terminal 24b to iPort control terminal 21b voltage gradient).

The iFET exponential relationship between source channel 23b charge and gate voltage 27b provides access to log functionality, where the addition of two log functions is equivalent to multiplication. A reverse anti-log, or reverse-exponential, operation recovers the analog output through the opposing complementary iFET channel. Such exponential relationship may be used for various low noise amplifier applications. The exponential relationship is also responsible for the wider dynamic range of these iFET circuits.

Again, referring to the source region in FIG. 2a, removing charge from the gate control terminal 27a or/and iPort control terminal 21a (number of carriers per volume) results in reduced conductivity of the semiconductor material in the source channel 23a. In this respect, the iPort control terminal 21a-to-source terminal 24a connection operates in a manner similar to the base-region of a bipolar transistor (which is exponential): the more control current to the iPort control terminal 21a, the more the device conductivity ($g_m$).

The drain channel 25a of the iFET 200 of FIG. 2a operates more like a conventional FET, in that the thickness of the drain channel 25a is greater near the iPort control terminal 21a (same thickness as the source channel 23a) and tapers as it reaches its diffusion region around the drain terminal 29a (the decreasing voltage differential between drain channel 25a and gate control terminal 27a diminishes the field) establishing the output resistance of the transistor as set by the gate voltage $V_g$. A lower drain voltage $V_g$ (close to the voltage found on the gate), decreases the drain channel output resistance (thicker channel at the drain diffusion). Along with a thicker conduction layer, this lower drain channel resistance results in lower noise and a high output drive capability to establish the desired drain voltage at the drain 29a with a low impedance drive offered by the thick conduction layer.

Diffusion regions around the source region 24a of the iFET 200, operating at a low voltage, has lower voltage gain but it also has low noise. Diffusion region around the drain terminal 29a, operating at a higher voltage, provides the desired voltage gain with a minimal noise contribution, due to the drain voltage being the same as the gate voltage $V_g$. This voltage equality is contributed by a unique biasing construct, to be explained hereinafter.

Figure 2C:
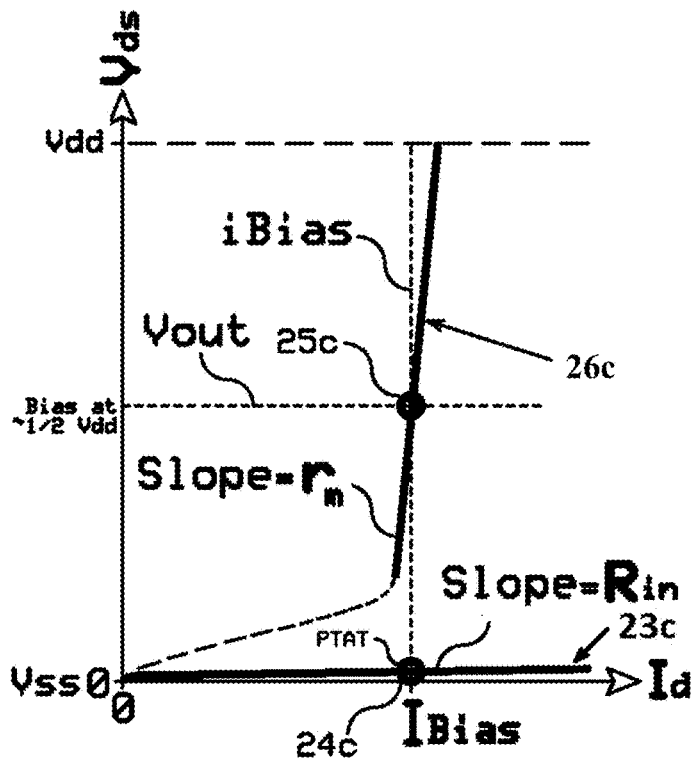
Figure 2D:
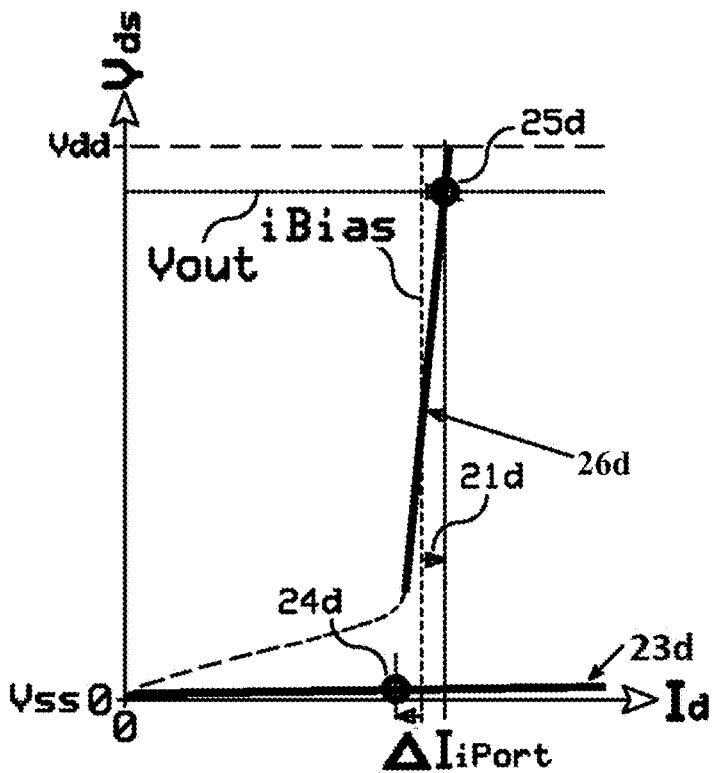
FIG. 2d shows another graph when max iPort injection current is provided.

FIG. 2b further shows iFET channel charge distributions, according to the present invention, with their operating points or iFET's characteristics without iPort injection current graphed in FIG. 2c, where the source channel current level 24c and voltage level 25c at the drain channel 25b with no input current is applied to iPort control terminal 21b. Slope 26c represents drain channel 25b am dots transresistance $r_m$, while slope 23c is for source channel 23b which is super saturated, and iPort input resistance $R_{in}$. FIG. 2d illustrates iFET's V-I characteristics with iPort injection current, where slope 26d represents drain channel 25b and its transresistance $r_m$, while slope 23d is for source channel 23b which is super saturated, and iPort input resistance $R_{in}$. It is to be noted that how a small amount 21d of iPort current greatly disturbs the drain channel output voltage $V_{out}$ 25d. As it can be seen, $V_{out}$ can swing to almost at full power supply ($V_{dd}$). This is the converse or dual of a normal voltage controlled current source use of the MOS device where large changes in the drain-to-source voltage yield minimal changes in the drain current during saturation as shown in FIG. 2d. This gives an analog IC designer insight as to the usefulness of the iFET as an amplifier which does not require a typical large, bulky analog planar transistor for the needed transconductance to obtain gain. Instead, the NiFET in a current-controlled voltage source configuration uses transresistance to boost the gain of the MOS-based device to new heights.

Non-Inverting Nature

Regarding the iPort control terminal, in the case of both the N-channel and P-channel devices, a positive current into the iPort control terminal displaces an equivalent current coming in through the drain channel, causing the drain (output) connection to move in a positive voltage direction—thus the non-Inverting nature of the iPort input.

The iPorts also operate as a current inverter as opposed to a conventional current mirror. Interestingly, unlike other semiconductor devices, a negative current can be extracted from the iPort, causing a drain (output) shift in the negative direction. Zero input current is also valid.

Proper Bias

An iFET 200 (as shown in FIG. 2b) has both gates connected together and requires a proper bias voltage on the gate to establish the desired operating point.

Symmetry

A P-channel device can be constructed and behaves in a similar fashion to its N-channel counterpart.

It should be emphasized that while the gate input is inverted with respect to the drain, the iPort is NOT inverted. The CiFET Amplifier is the Basic Analog-in-DIGITAL Building Block:

While a single iFET has interesting characteristics on its own, a complementary pair of iFETs (or CiFET) prove to be much more beneficial. Using the opposite semiconductor type iFET as a load device conveniently provides the opposing iFET its bias and in addition has the advantage of balancing out (linearizing) the inherent non-linarites of MOSFET operation. For instance, the high-gain exponential characteristics of the source channel's super-saturated operation are linearized over an extremely wide dynamic range.

The resulting complementary device (the seminal CiFET cell) is arguably the highest possible power gain-bandwidth MOSFET amplifier stage possible. For instance, looking into either iPort, the super-saturated source channel input impedance is a relatively low number constant resistance. This converts any input current into a small input voltage, which calculates out to be a very high voltage gain transfer function implemented by the high number $r_m$ trans-resistance. In addition, the sub-surface operation of the super-saturated source channel may operate with the lowest noise possible for any MOS device. The drain channel also maximally operates below its surface defects for low noise. In the end it is all about signal-to-noise ratio.

Figure 3D:
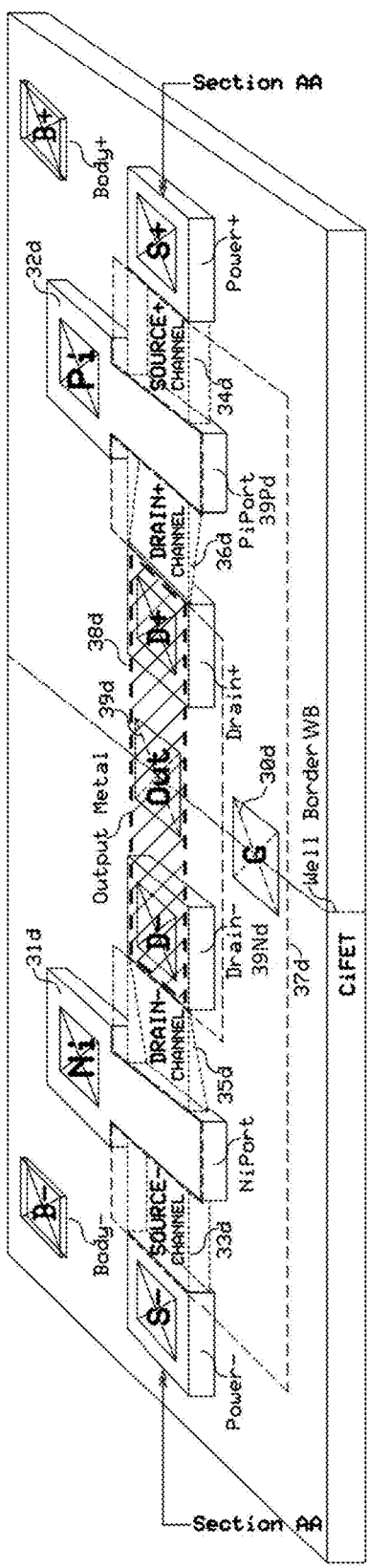
FIG. 3d shows a three (3) dimensional perspective view of the CiFET compound device.
Figure 3E:
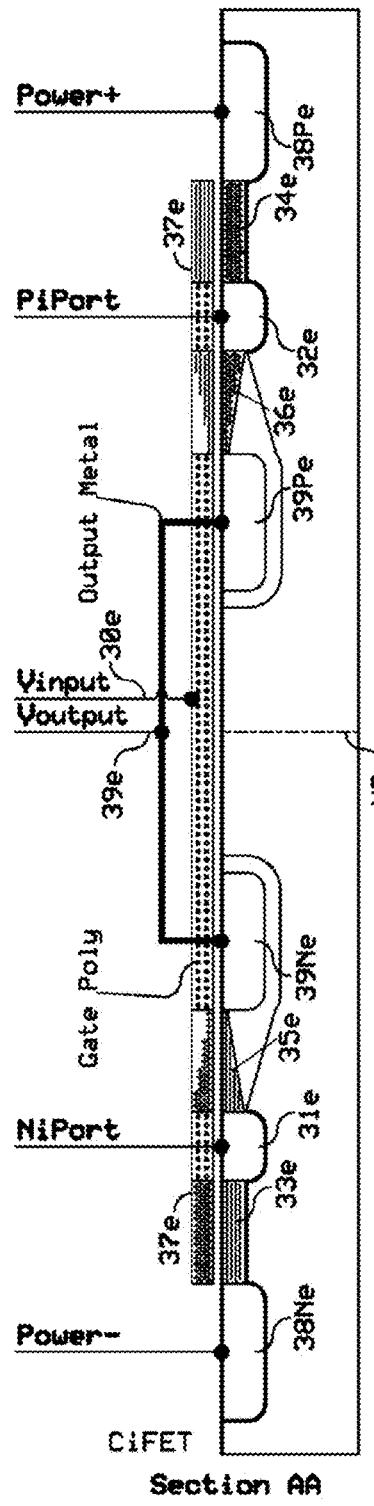
FIG. 3e illustrates cross-sectional view at Section AA of FIG. 3d.
Figure 3F:
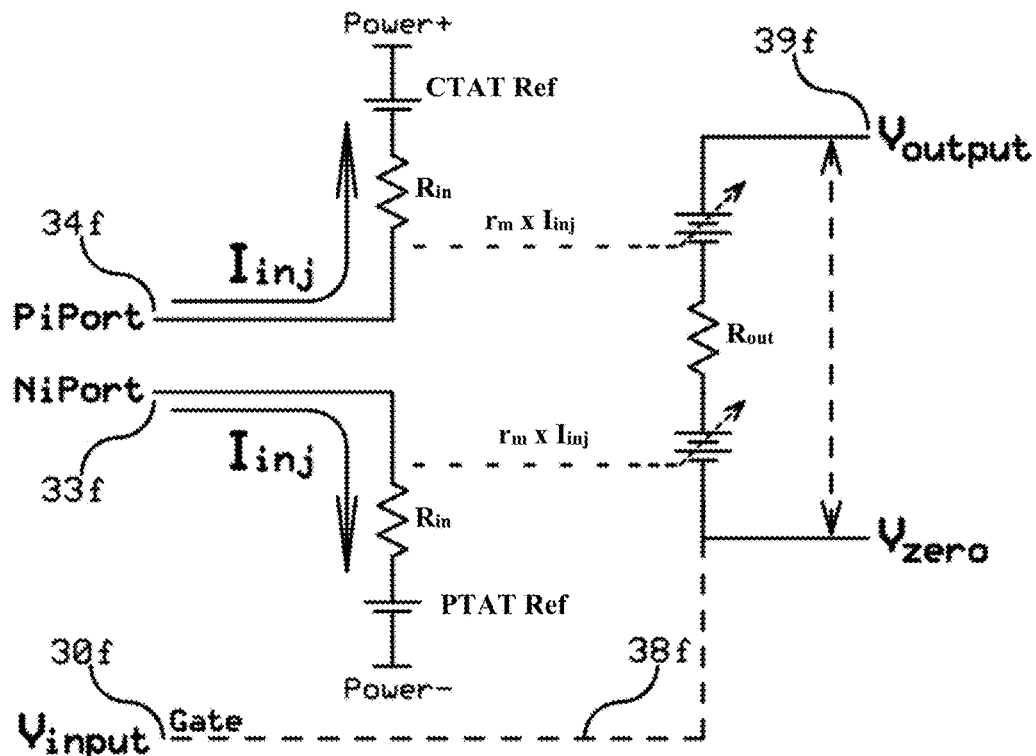
FIGS. 3f, 3g and 3h illustrate a CiFET operational modeling, self-bias schematic and symbol therefor.
Figure 3G:
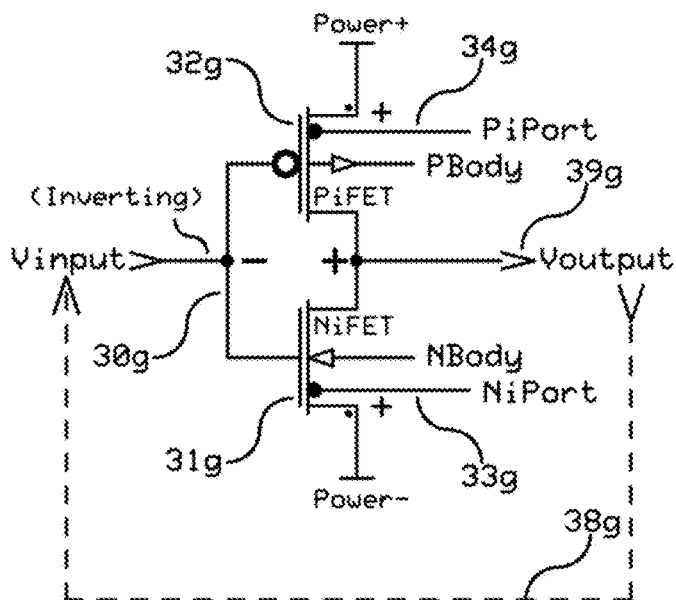

FIG. 3a presents the seminal CiFET symbol and FIGS. 3b and 3c show a diagrammatically similar physical layout abstraction; FIG. 3d shows three (3) dimensional perspective view and FIG. 3e illustrates cross-sectional view at Section AA in FIG. 3d; and FIGS. 3f and 3g illustrate iPort control terminal behavioral model of a CiFET device of the present invention, self-bias schematic, and symbol therefor of a complementary pair of iFET of the present invention, which is a radical improvement from the state of the art in high gain, high precision, small scale, analog primitive building blocks. The complementary pairs of iFETs are built entirely from logic components, without analog extensions, while enabling scaling and portability. Both the footprint and the power consumption per gain/bandwidth are drastically reduced from the present state of the art, while retaining superior noise performance.

Referring to FIG. 3a, the complementary pair of iFETs (or CiFET) 300 comprises P-type iFET (or PiFET) 301 and N-type iFET (or NiFET) 302, comprising input terminal 30a connected to both the gate control terminal 37p of PiFET 301 and the gate control terminal 37n of NiFET 302, function as the common gate terminal 30a. CiFET 300 receives power, Power – and Power +, where Power – is connected to the source terminal of NiFET 302 and Power + is connected to the source terminal of PiFET 301. Each of PiFET 301 and NiFET 302 comprises iPort control terminals (31a and 32a) for receiving injection current. The drain terminal of PiFET 301 and NiFET 302 are combined to provide output 39a.

FIG. 3b stretches out the CiFET 300 PiFET and NiFET devices 301 and 302 of FIG. 3a to visually correlate to the physical layout abstract of FIG. 3c.

Referring to FIG. 3c, the CiFET 300 comprising PiFET 301 and NiFET 302, laid out on the substrate (or body B+ and B– respectively) like a mirror image along well border WB' shown therein; PiFET 301 comprises source terminal S+, drain terminal D+, and iPort control terminal Pi, defining source+channel 34c between the source terminal S+ and the iPort control terminal Pi diffusion region 32c, and drain channel 36c between the drain terminal D+ and the iPort control terminal Pi diffusion region 32c. NiFET 302 comprises source terminal S–, drain terminal D–, and iPort control terminal Ni, defining source—channel 33c between the source terminal S– and the iPort control terminal Ni diffusion region 31c, and drain channel 35c between the drain terminal D– and the iPort control terminal Ni diffusion region 31c. CiFET 300 further comprises a common gate terminal 30c over source+channel 34c, drain+channel 36c, source–channel 33c and drain–channel 35c. Accordingly, the common gate terminal 30c is capacitively coupled to the channels 34c, 36c, 35c, and 33c.

Figure 3H:
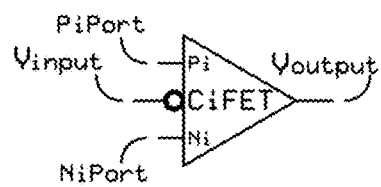

FIGS. 3d is a 3-Dimensional representation of the CiFET physical layout of FIG. 3c and FIG. 3e is a cross-section AA of FIG. 3d. The corresponding pinpoint numbers relate the same feature between each of FIGS. 3a, 3b, 3c, 3d, 3e, 3f, and 3g where the same feature is represented by the reference number with the figure letter annexed. FIG. 3h shows a symbol diagram for a CiFET device of the present invention. FIGS. 3d and 3e further points out the active channel charge conduction regions 34d, 34e, 36d, 36e, 33d, 33e, 35d, and 35e that exist for the biased CiFET which has its gate voltage at about half the difference between that on the S+ and S– terminals.

In many analog circuits, biasing is a problem. Using iFETs in complementary pairs (31g & 32g) as shown in FIG. 3g allows them to "self-bias" (38g), thus eliminating drift problems and additionally, the amplifier finds the maximum gain point on its operating curve.

In the "Behavioral Model" as shown in FIG. 3f, the current at the iPort control terminals, NiPort 33f and PiPort 34f is converted to a voltage by a trans-resistance ($r_m$), whose value determines the gain. Self-bias path 38f to $V_{input}$ 30f is provided for eliminating drift problems. This "Trans-resistance" ($r_m$) is established by the ratio of the "drain channel" to "source channel" strength, and remains constant throughout the entire operational range. Here the iFET operation is derived from different current densities in the source and drain channels, which is similar to a dual of the band-gap method of generating a reference voltage made by running the same current value through a single transistor and a parallel combination of multiple instances of an identical transistor. Simulation has shown this resistance ($r_m$) to typically be in the range of 1 KΩ to 4 MΩ with a typical value of 100 KΩ, as set by the relative channel sizing. $r_m$ is the dual of $g_m$.

The output ($V_{out}$ 39f) is a low-impedance source follower common-gate FET configuration that can deliver its voltage with the necessary current to drive the following circuit.

The iPort input is a constant low resistance termination (related to $r_m$ but much lower) with a constant offset voltage, CTAT Ref, PTAT Ref, of about 1 mV to 100 mV from their respective power supply rail. This offset voltage is a "band-gap" reference, established by the ratio of the "drain channel" to "source channel" strength.

A standard CiFET compound device cell can be physically constructed and instantiated like a logic cell for designing analog. Normally this is the only active circuit component needed. Like a transistor, but the CiFET cell does everything needed for an active component.

How then is the proper bias voltage produced? The simplest way of generating the bias voltage is to use iFETs in complementary pairs, NiFET 31g and PiFET 32g, creating an inverting device as shown in FIG. 3g, and then using the output 39g to provide negative feedback 38g to the input 30g. The CiFET compound device will "self-bias" at a point between the power supplies, where the gain is maximized and the speed or slew rate is poised for its most rapid changes. At this self-bias voltage point, the current through both of the complementary iFET devices 31g and 32g is exactly equal, there is no other DC current path for the PiFET (32g) drain except into the NiFET (31g) drain, and thus a specific gate voltage is established for this equality of currents (or conductivity). Also since both iFETs 31g and 32g have the same current, the pull-up ability is exactly equal to the pull-down ability, which defines the maximum slew rate bias point. The current at the iPort control terminals, NiPort 33g and PiPort 34g is, then, converted to a voltage by a trans-resistance ($r_m$) (not shown), whose value determines the gain.

Since the complementary pair of iFETs 31g and 32g is self-biased, any parametric factors are auto-compensated, for changes in operating environment. Because of inherent matching between adjacent parts on an IC, the bias generator can be used to bias other iFETs nearby. The real-time self-biasing circuit corrects for parametric changes (in various forms).

Each of the transistors in an inverter of the present invention acts as a "dynamic" load for its complement, allowing the gate voltage to be significantly higher than the traditional bias point of an analog circuit gate. With the complementary iFET compound device's higher than normal gate voltage, the source conduction channel is deep, yielding lower noise.

The dominant noise source in a traditional analog circuit is related to "pinch-off." Biasing the drain (or output) at the same voltage as the gate (zero differential) causes the drain conduction channel to avoid the channel pinch-off (shallow channel) phenomena usually encountered in analog circuits. Another way of stating this is: a transistor gets noisier as the drain approaches its design maximum voltage, the self-biased inverter operates its transistors at around half the design maximum voltage and the gate is at the same voltage as the drain (zero differential), therefore the self-biased inverter is MUCH quieter.

Figure 1A:
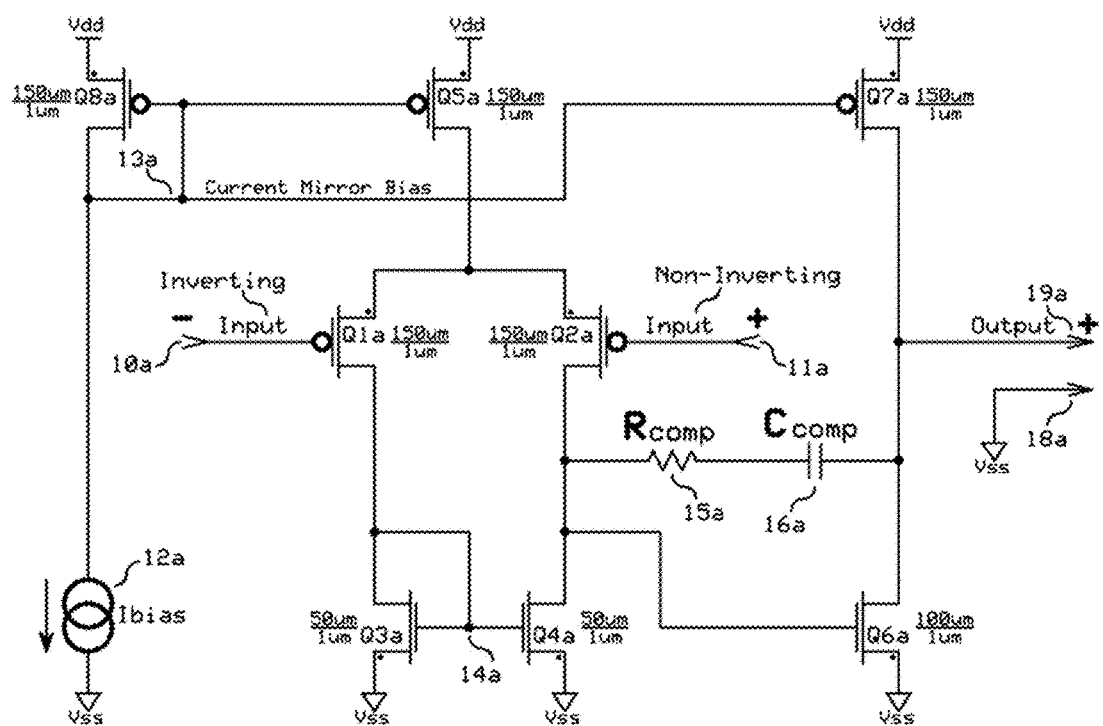
FIG. 1a illustrates a high quality CMOS OpAmp prior art transistor schematic from a prominent textbook "Analysis and Design of Analog Integrated Circuits," $4^{th}$ Ed, by Gray, Hurst Lewis and Meyer, p482 as a prior art amplifier for comparison.
Figure 1B:
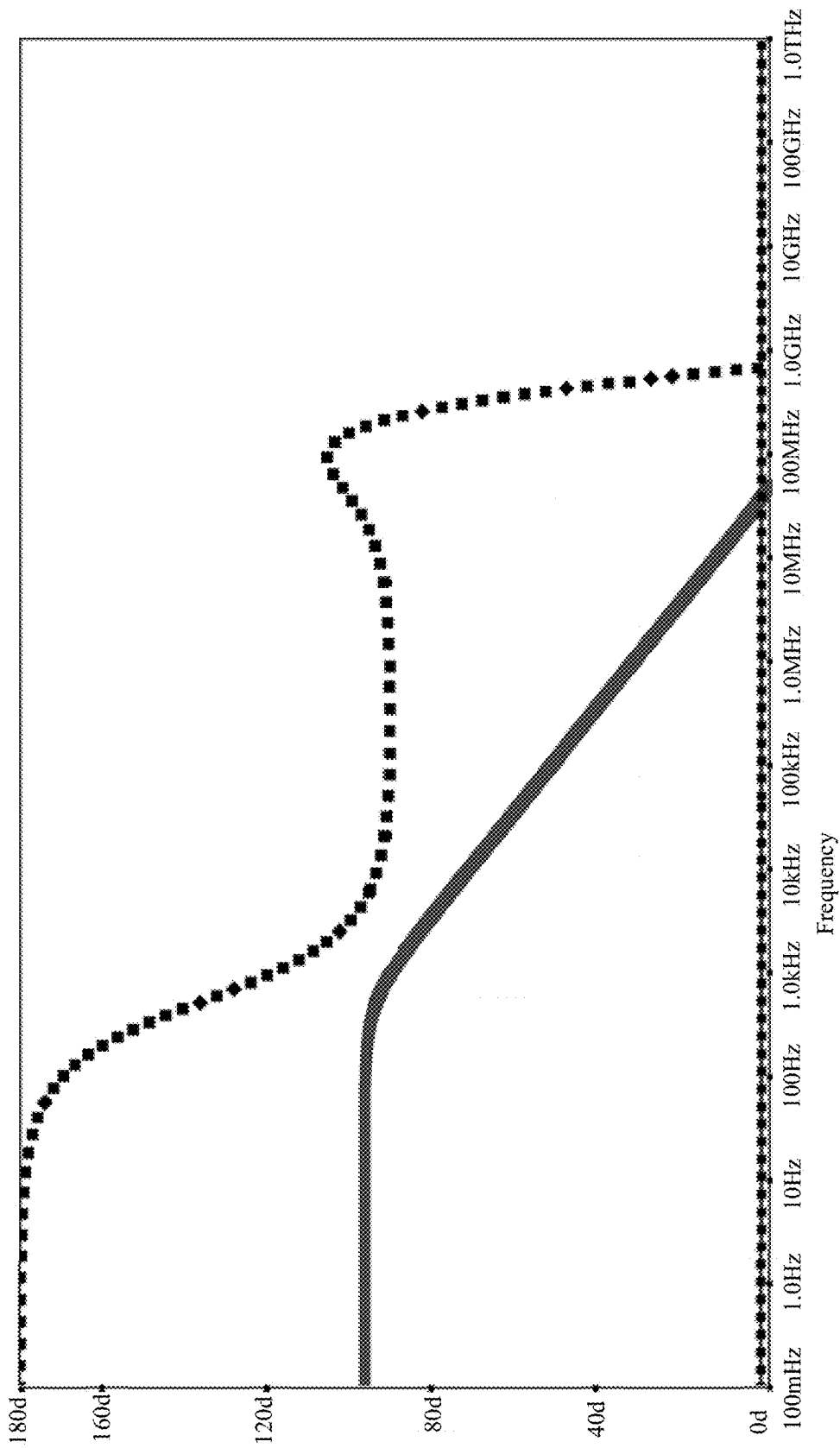
Figure 1C:
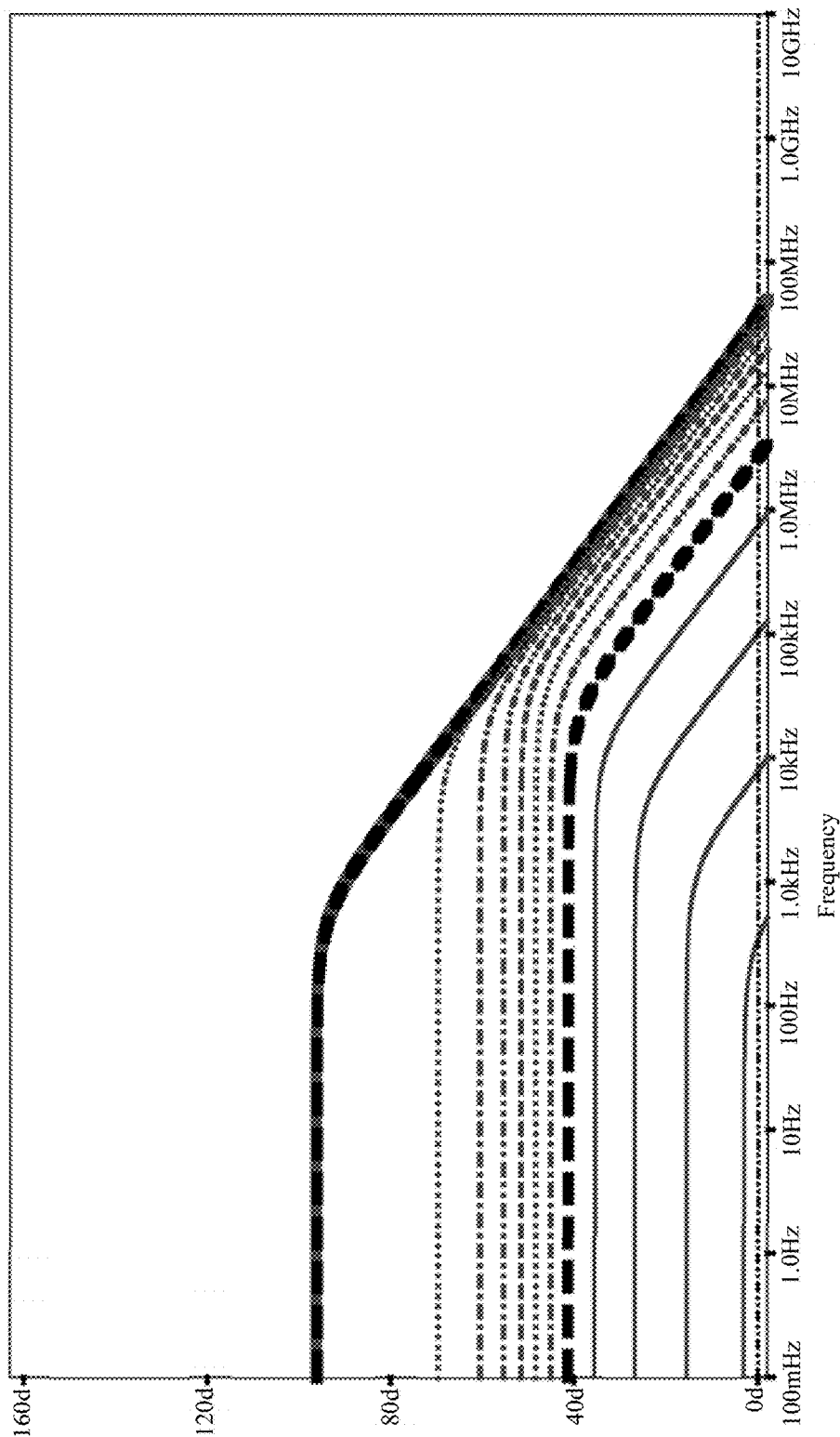
Figure 1D:
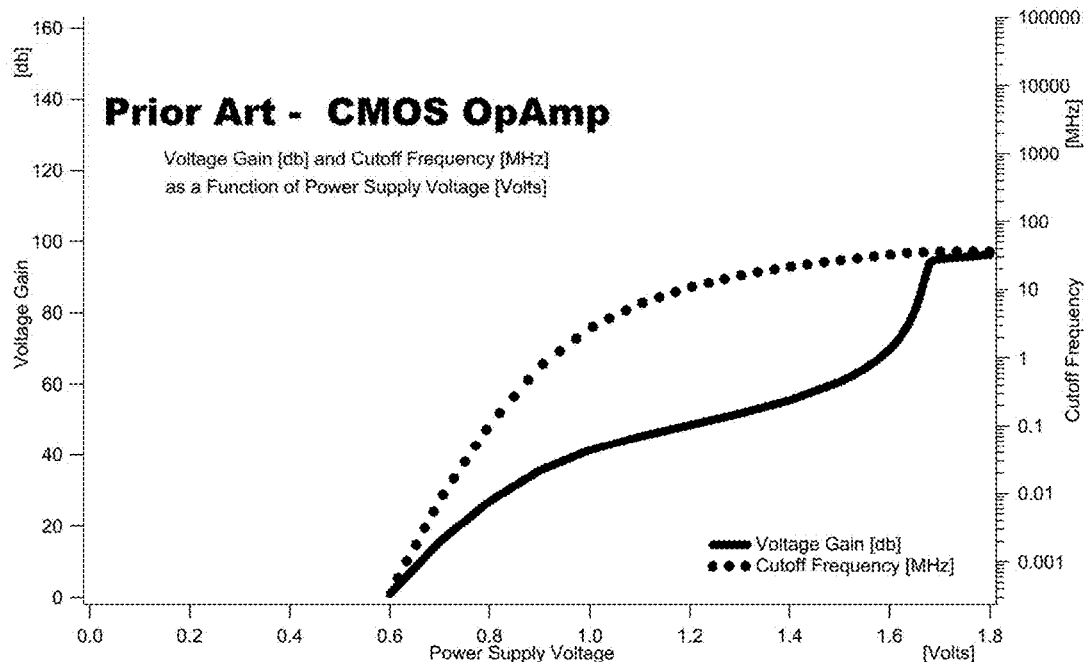
Figure 1E:
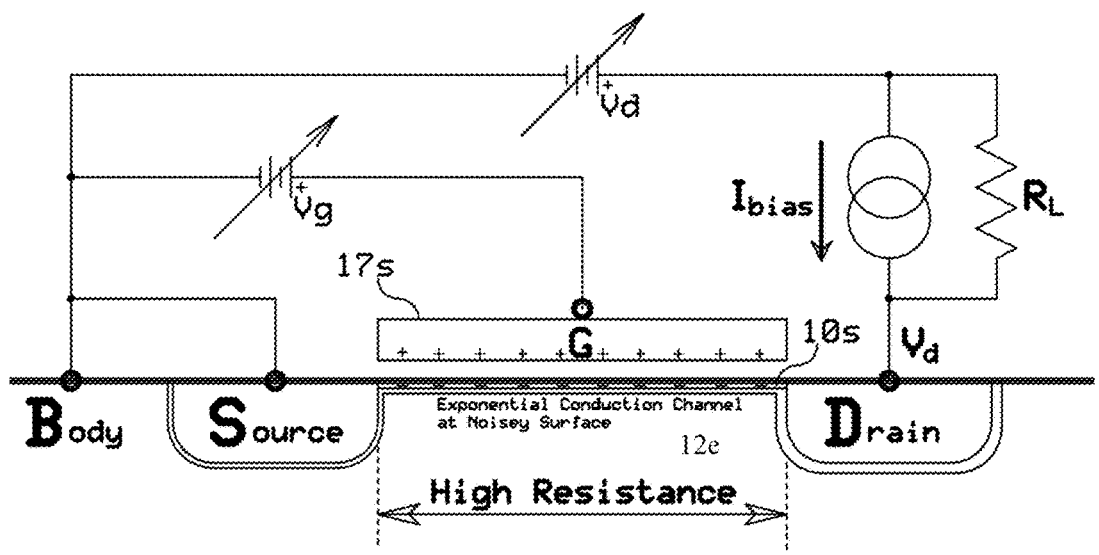
FIGS. 1e and 1g show cross-sectional views of prior art MOSFET channel conduction in weak inversion and in strong inversion, respectively.
Figure 1F:
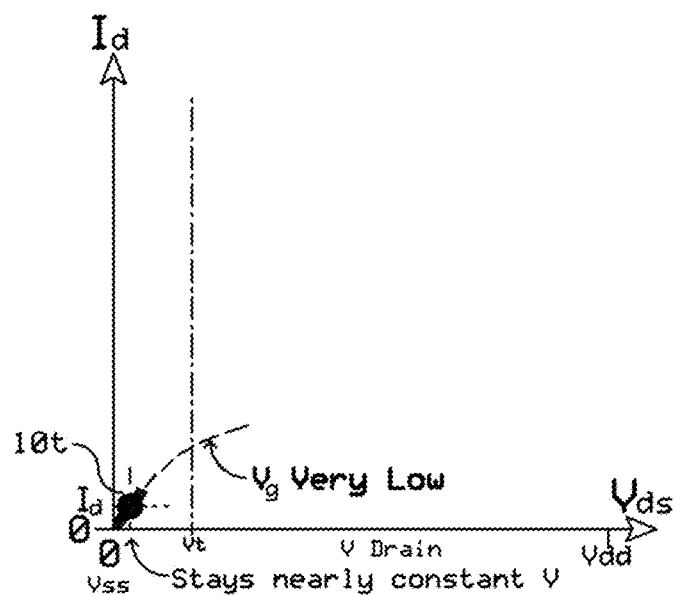
FIGS. 1f and 1h show plots bearing exponential relationship between drain current and gate voltage when in weak inversion and quadratic relationship when in strong inversion, respectively.
Figure 1G:
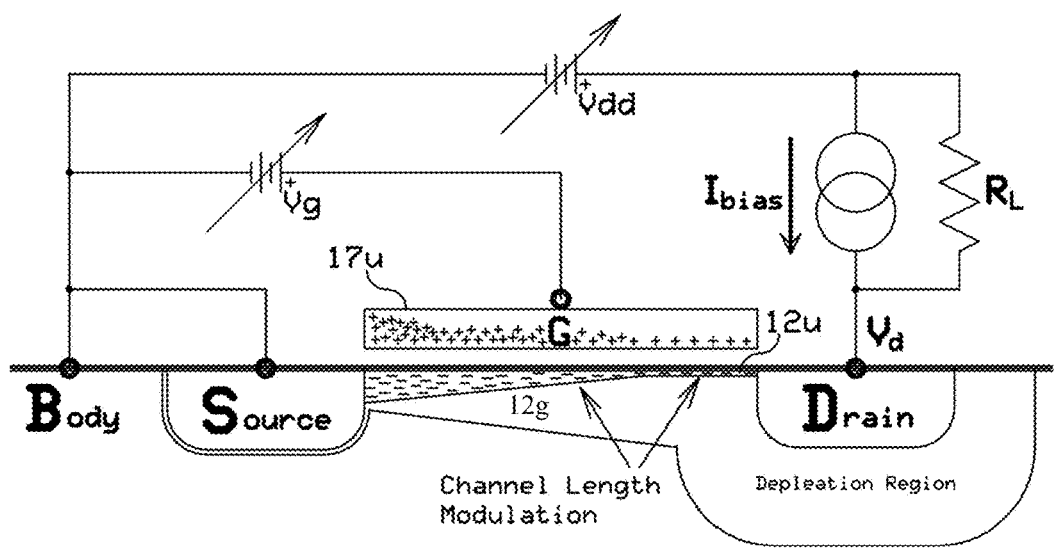
Figure 1H:
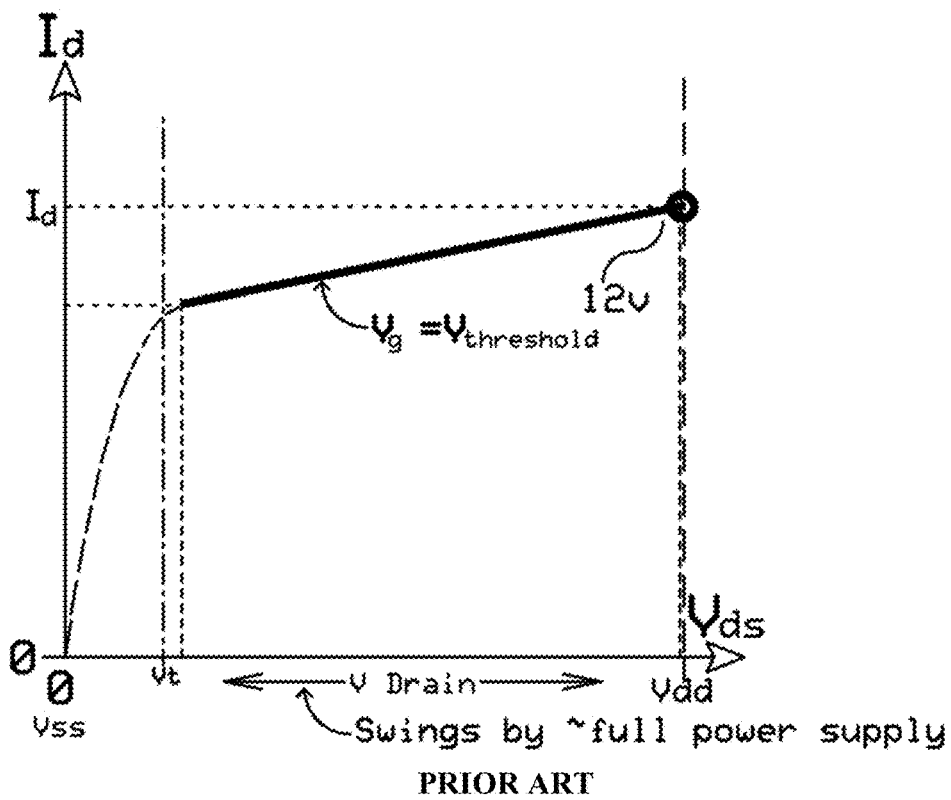
Figure 1I:
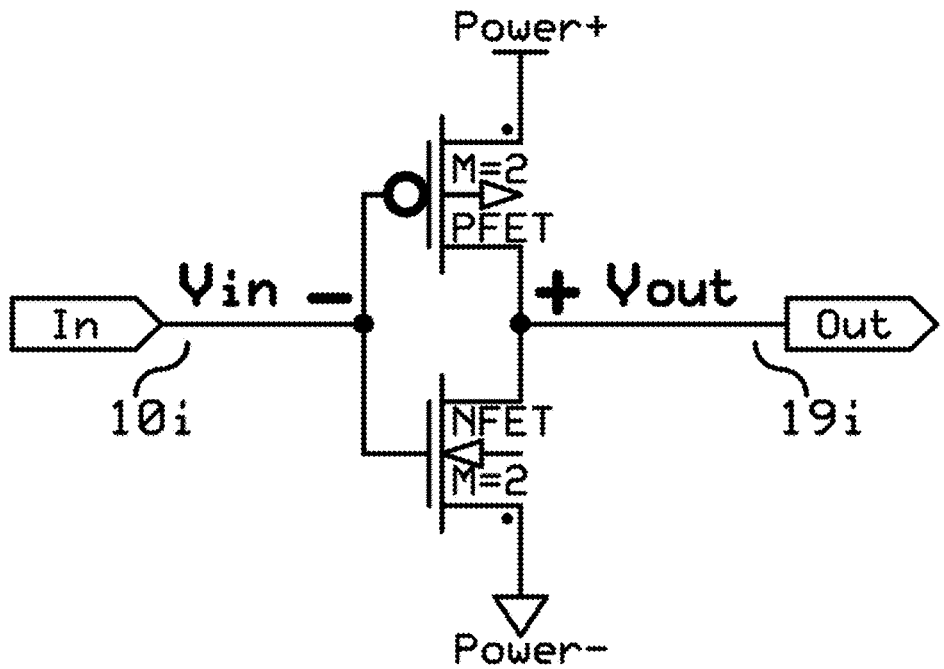
FIG. 1i shows a transistor schematic of two (2) finger inverters of prior art.
Figure 1J:
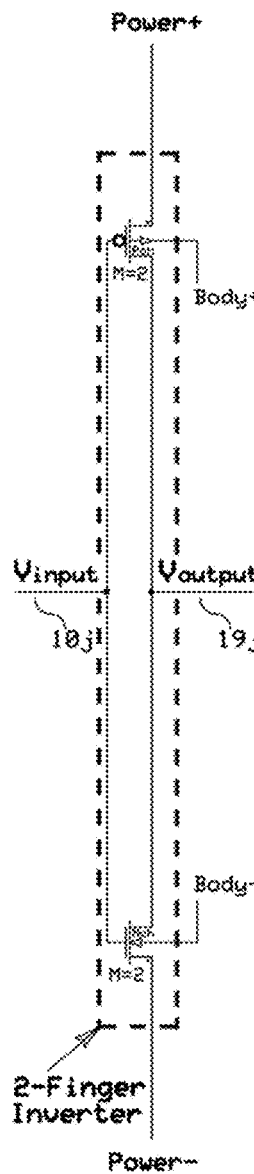
FIGS. 1j and 1k show physical layout abstractions of the two (2) finger inverters of prior art.
Figure 1K:
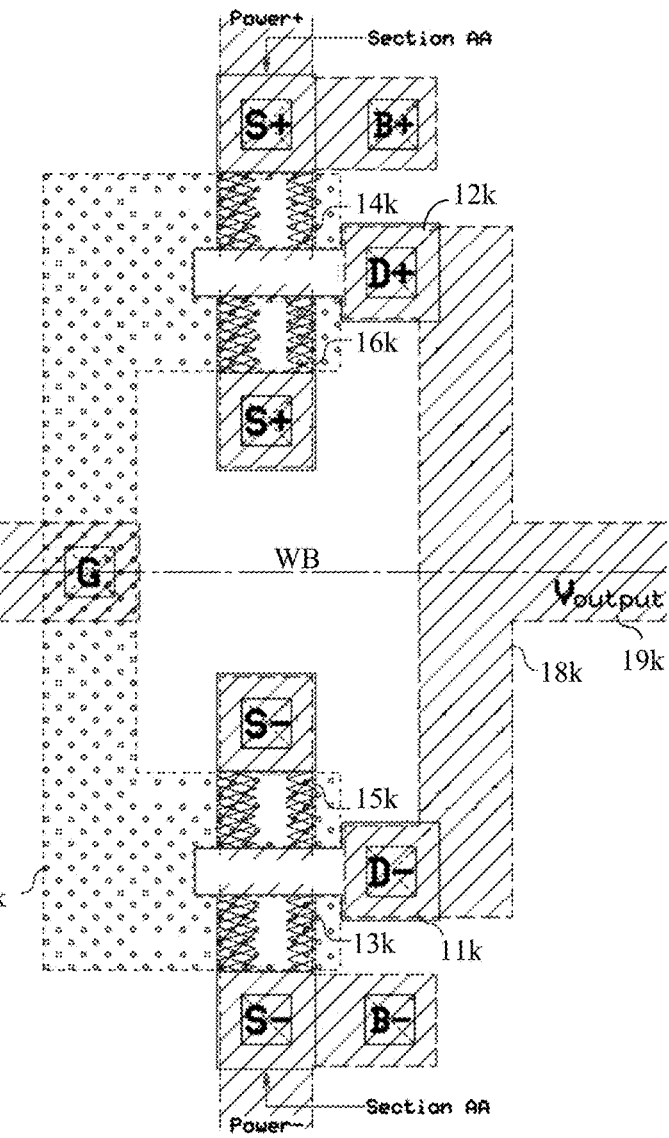
Figure 1P:
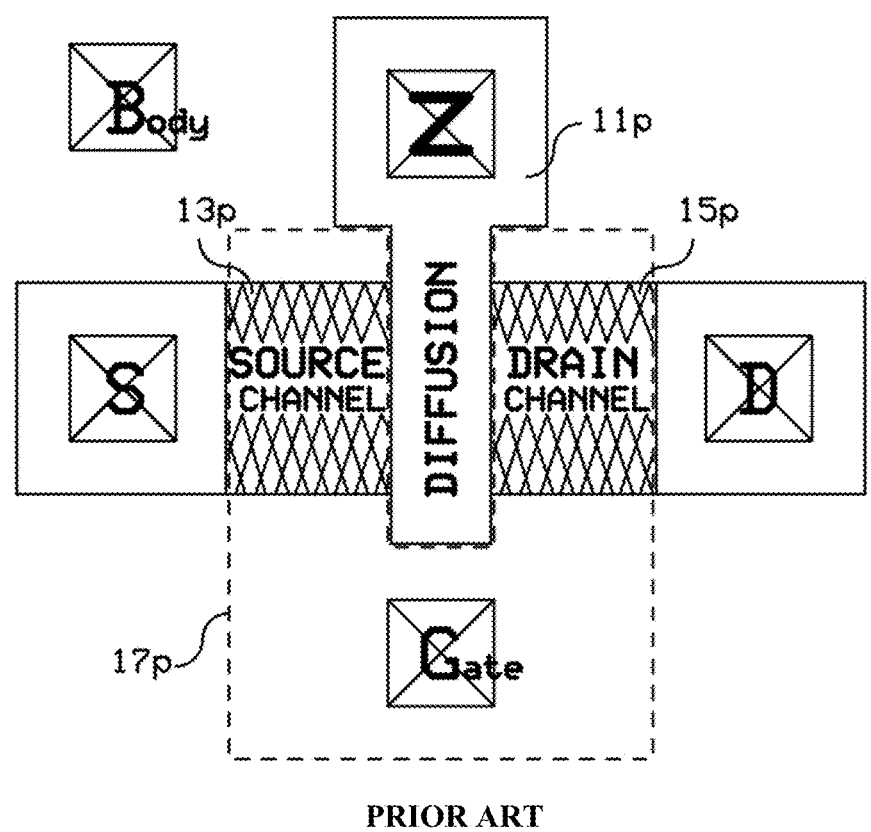
FIG. 1p shows a physical layout of a split channel CMOS transistor of prior art.

The operation of the CiFET amplifier differs from the operation of a conventional analog amplifier, with its current mirror loads, in that:

The "Source" channel has an extremely small (~100 mv) voltage from source terminal to iPort control terminal while the "Gate terminal" is at ~½ $V_{supply}$. This puts the iFET Source channel into "Super-Saturation," a condition similar to weak inversion but with high Gate overdrive. Gate overdrives resulting in an unusually thick conduction layer and along with a low Source to iPort voltage resulting in that conduction layer remaining thick all the way along the channel. Notice the differences in the thickness between the conduction channel 10s in FIG. 1e from that of 23b in FIG. 2b.

The "Drain" channel 25b operates with its' drain terminal 29b at ~½ Vmax, greatly reducing the pinch-off (and DIBBL) effect. This reduced pinch-off condition is further enhanced by the fact that the "Gate terminal" is operated at ~½ $V_{supply}$ (same as ½ Vmax), meaning no potential difference between the Drain 29b and the Gate 27b.

Another important aspect of the CiFET compound device is its current input that frees it from the speed robing effects of parasitic capacitance.

This subtle but significant difference is one of the enabling features that makes weak inversion work and gives the complementary iFET amplifier its superior low noise, wider dynamic range, and speed advantages.

MOSFETs do not make particularly good amplifiers compared to equivalent bipolar circuits. They have limited gain, they are noisy, and their high impedance makes them slow.

Bipolar Diff-Amps developed to the point where the input offset is pretty good, but the move to CMOS never really delivered as good a result.

It has long been known that superior performance can be had from CMOS operated in weak inversion but complications arising from high impedance, due to impractically low currents, preclude taking advantage of the superior gain (equivalent to that of bipolar transistors), dynamic range (exceeding that of bipolar transistors), and logarithmic performance (allowing numerous decades of amplification) found in weak inversion. Because of weak inversion the CiFET brings the noise benefits of majority carriers in a deep channel found in junction-FETs to the MOSFET.

While a MOSFET in weak inversion, working into a current source load, delivers a logarithmic transfer function, the same MOSFET working into an anti-log load cancels the nonlinearity, yielding a perfectly linear transfer function. The CiFET amplifier is such a circuit, i.e.: log input, antilog load, perfectly linear, wide dynamic range, low noise. The low noise is a consequence of the biasing, where the source channel gate potential is unusually high and the potential across the source channel itself is maintained at near zero volts. The drain channel is a level shifter, maintaining a very low voltage on the source channel while delivering high amplitude signal swings at the output.

The CiFET amplifier, implemented in a closed-loop, sample-data block delivers near perfect performance in terms of input offset because of its "flying capacitor" input. The CiFET amplifier, implemented in an open-loop, delivers unexpected levels of sensitivity (gain>1 million), even in the presence of high levels of background, this because of the extreme dynamic range.

FIGS. 3i, 3j(1) and 3k shows a comparison between NOR2 and CiFET physical layouts. In particular, FIG. 3i shows a physical layout of NOR2 device with a corresponding symbol. FIG. 3j(1) shows a physical layout of seminal CiFET, FIG. 3j(2) shows its corresponding schematic diagram, and FIG. 3j(3) shows its corresponding symbol, and FIG. 3k shows a physical layout of FinFET of complimentary pair of iFET (equivalent to the CiFET symbol shown in FIG. 3j(3)) of the present invention.

In the layout abstractions of FIGS. 3i, 3j(1), and 3k, a metal layer (not shown) is added to connect their source/drain diffusion contacts (small squares) together. Namely, in FIG. 3j(1), for example, drain terminals pout and nout are interconnected, one iPort Ni is connected to the other iPort Ni on NiFET 30n, and one iPort Pi is connected to other iPorts Pi on PiFET 30p. Parallel channels are used as needed to increase total channel width.

Referring to FIG. 3j(1), the layout 30j includes layout for PiFET 30p and NiFET 30n, PiFET 30p includes iPorts Pi, drain terminals pout and source terminal pst. Souce channel ps is formed between the iPort Pi and source terminals pst, and the drain channels pd1 and pd2 are formed between the drain terminals pout and iPort terminals Pi. In a similar manner, NiFET 30n includes iPorts Ni, drain terminals nout and source terminal nst. Souce channel ns is formed between the iPort ni and source terminals nst, and the drain channels nd1 and nd2 are formed between the drain terminals nout and iPort terminals Ni.

Referring to FIG. 3k, the layout 30k includes layout for PiFET 30'p and NiFET 30'n, PiFET 30'p includes iPorts P'i, drain terminals p'out and source terminal p'st. Souce channel p's is formed between the iPort P'i and source terminals p'st, and the drain channels p'd1a, p'd1b and p'd1c; and p'd2a, p'd2b and p'd2c are formed between the drain terminals p'out and iPort terminals P'i. In a similar manner, NiFET 30'n includes iPorts N'i, drain terminals n'out and source terminal n'st. Souce channels n's1 and n's2 are formed between the iPort n'i and source terminals n'st, and the drain channels n'd1 and n'd2 are formed between the drain terminals n'out and iPort terminals N'i.

Taking Advantage of the Doping Profile and Ratioing:

Traditionally engineers have avoided using digital logic in an analog configuration because it was believed to be unacceptably nonlinear and was difficult to bias. Digital logic also sacrifices drive symmetry for compactness. Restoring the symmetry through proper device ratioing (~3:1 p:n width) improves linearity, increases noise immunity, and maximizes dynamic range. Self-biasing solves the bias problem.

Figure 1Q:
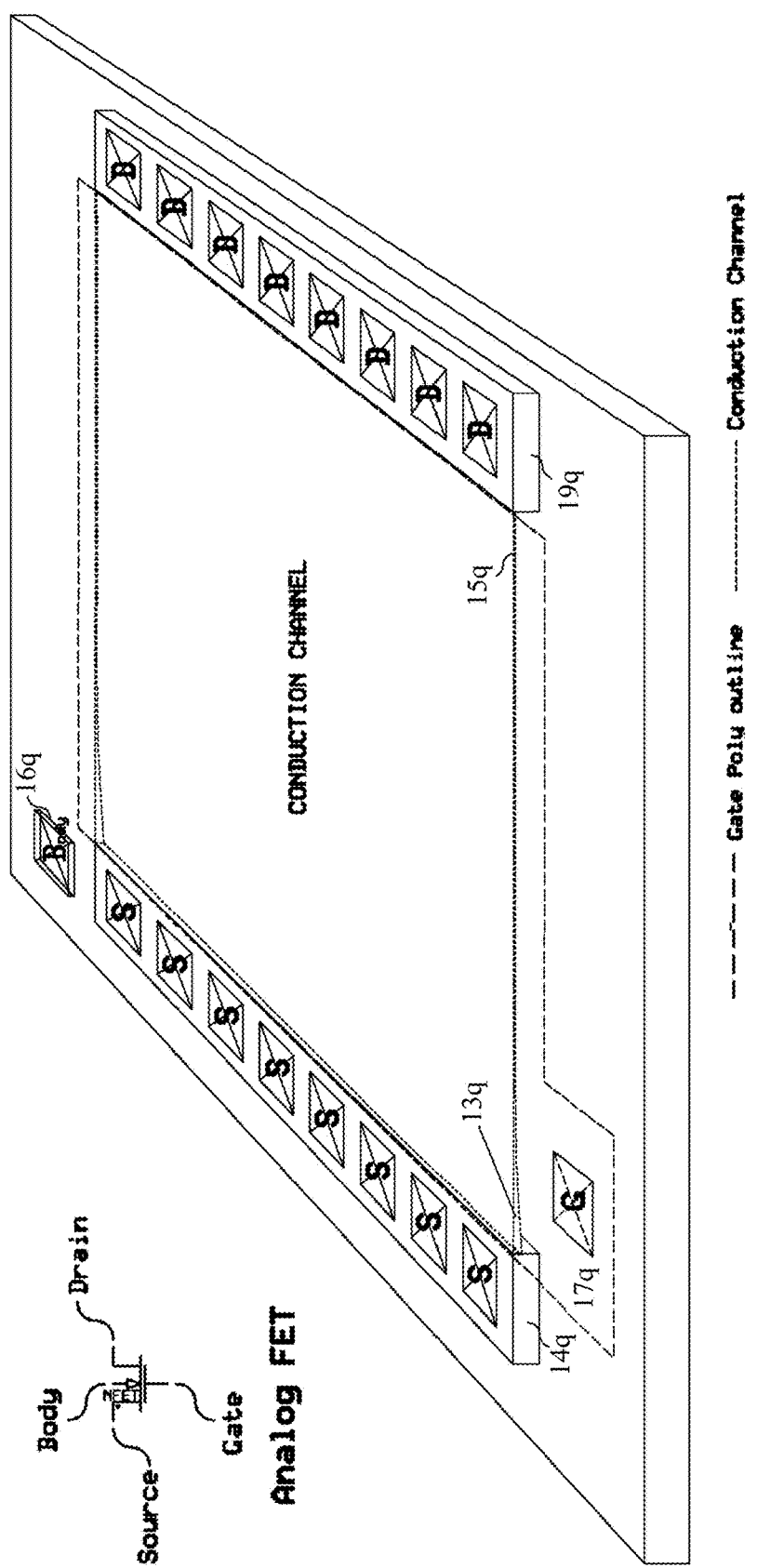
FIG. 1q shows a 3D perspective view of an analog-sized MOSFET of prior art.

FIG. 1q depicts the basic symbol and 3-dimensional view of the MOS transistor structure in saturation. The generic planar MOSFET here is shown with a typical longer/wider channel used in customary analog applications. The FET symbol and structure shown applies to either n- or p-type planar transistors which can further be related and applied to the wrapped-gate finFET structure as desired. Note that the FET has four ports including the gate (g) 17q, drain (d) 19q, source (s) 14q, and body (b) 16q. Typically, voltage is applied as input to the high-resistance gate port 17q, while a voltage or current may be applied to the physically similar (and interchangeable) drain 19q and source ports 14q. The bulk/body port 16q is generally attached to the lowest (or low) voltage potential for n-type FETs and highest (or high) voltage potential for p-type FETs to control/prevent forward biasing of the bulk-source junction and to give the lowest $V_{gs}$ relative to the supply voltage for normal operation (although there are exceptions and special uses for the bulk, they will not be covered here). Additionally, the planar 3-dimensional MOSFET structure in FIG. 1q is shown with a wider width, W, and longer length, L, commonly used for analog circuits, along with a channel in the pinch-off saturation region.

In order to maintain a high intrinsic gain, the MOSFET requires a high output impedance. This is obtained through long channel lengths necessary for high $r_o = R_{out}$. Since $g_m$ is proportional to the W/L ratio of the MOSFET, in order to keep $g_m$ high when the channel is long, the channel must also be proportionally wider. Gain here is ~$g_m R_L/R_{out}$. As the IC process shrinks $g_m$ increases, but $R_{out}$ decreases faster, ruling out short channel lengths for analog. This is why as IC processes shrink analog transistors do not scale accordingly in the newest double-digit CMOS technologies. Also, it is to be noted that the analog channel current travels close to the surface under the gate where the surface defect carrier traps create the characteristic MOSFET 1/f noise.

Figure 1R:
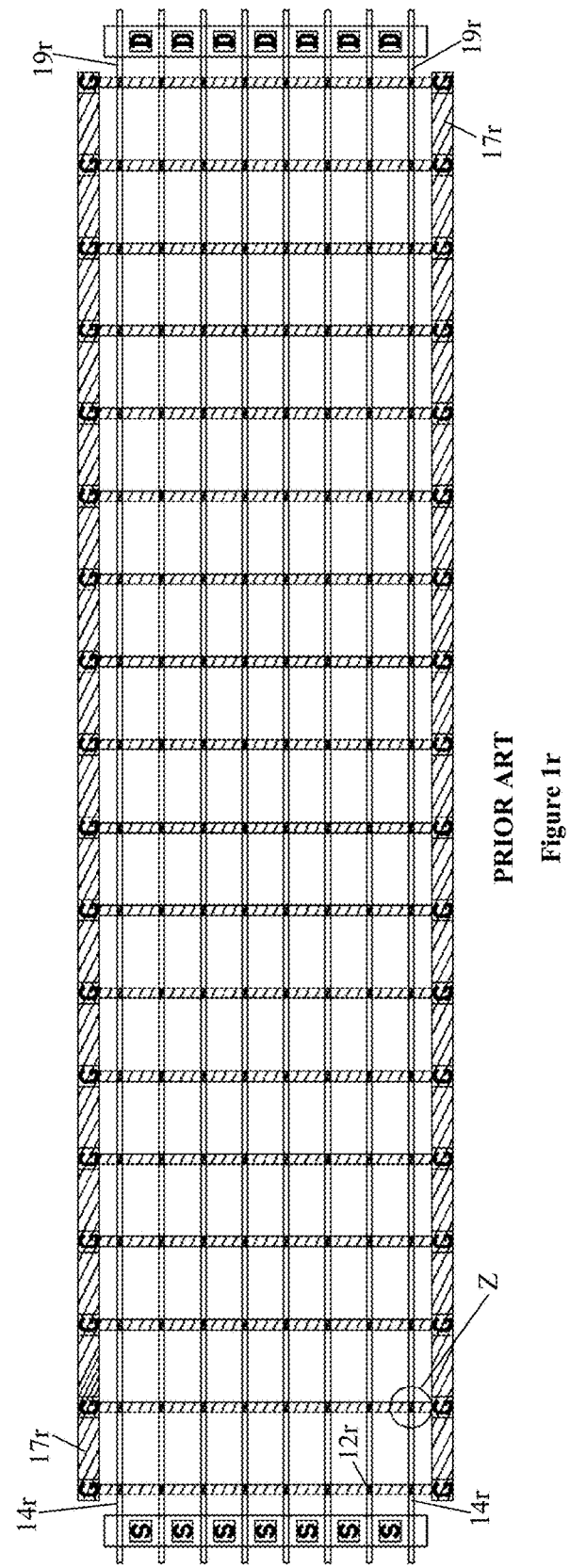
FIG. 1r shows a physical layout plan of an analog-sized array of Fin field effect transistors (FinFET) of prior art.
Figure 1S:
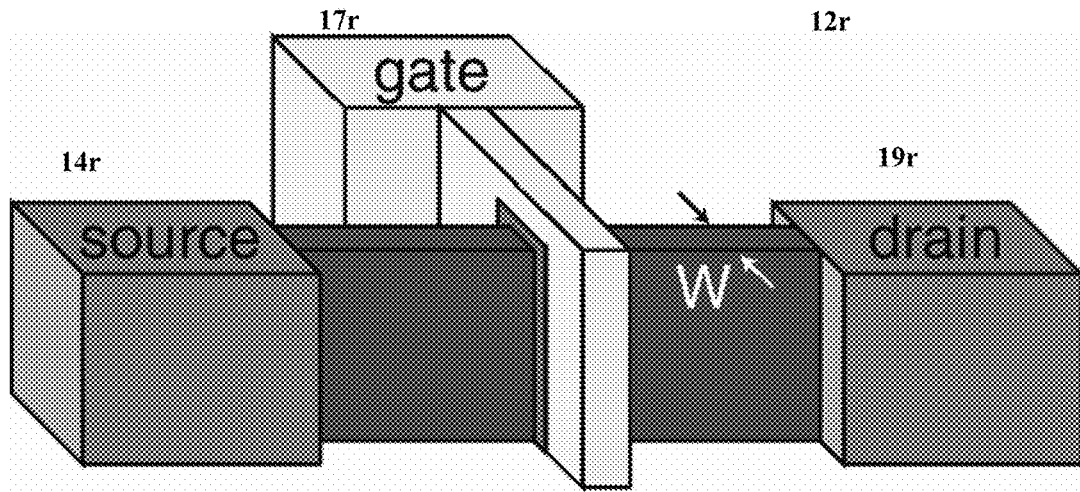
FIG. 1s shows a zoomed perspective view of inside the circle Z shown in FIG. 1r, showing a perspective view of a FinFET of prior art.

FIG. 1r shows a physical layout plan of an array of Fin field effect transistors (FinFET) of prior art. Sources 14r and drains 19r are stacked and forms fins, and an array of gates 17r are disposed therebetween to form FinFETs 12r. Zoomed in view of the circle Z in FIG. 1r, which shows one of prior art three (3) dimensional perspective view of FinFET 12r is shown in FIG. 1s.

Figure 1T:
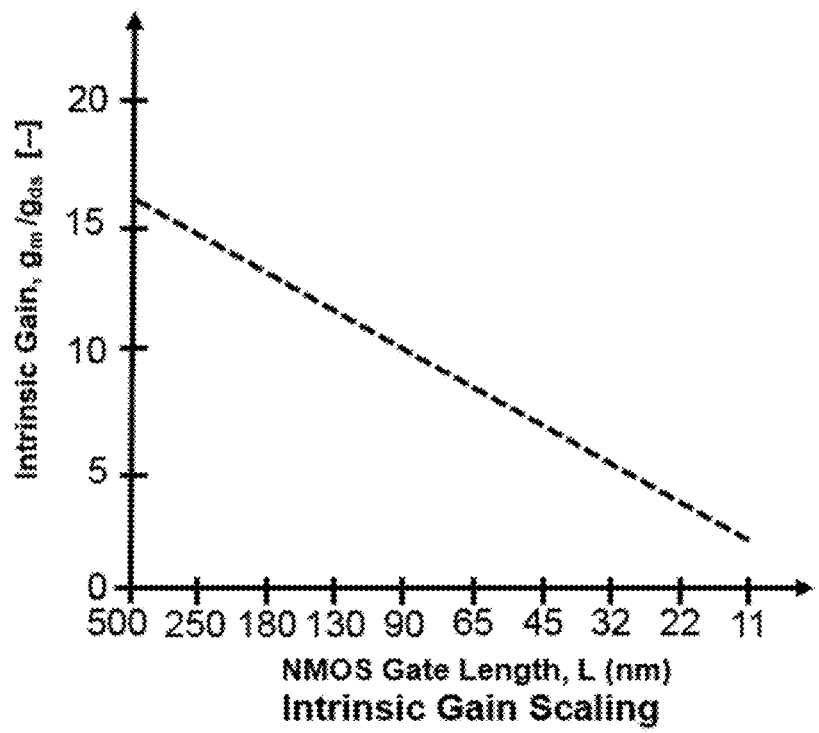
FIG. 1t shows a plot representing intrinsic gain scaling of nMOS transistor of prior art.

FIG. 1t shows a plot representing intrinsic gain scaling of nMOS transistor of prior art. As it can be seen, the steadily decreasing intrinsic gain of nMOS transistors alerts analog designers of impending difficulty that they face when attempting to scale the design of an amplifier that may have run efficiently at 65 nm or 90 nm to the 14 nm CMOS process, where it will most likely fail. Therefore, other methodologies which depart from conventional procedures must be explored in order to find a viable tactic to harness inherent transistor gain in the newer ultra-deep sub-μm CMOS technologies.

FinFETs have short nanoscale channel lengths that increase $g_m$ while lowering the drain output resistance of the bare field effect transistor. Higher $g_m$ provides better control over channel conductance, but the close proximity of the drain to the source makes them talk to each other making the output resistance low. This yields a low intrinsic gain of the MOSFET at nanoscale dimensions. Conversely the CiFET is a low output resistance device and improves with deep scaling.

According to the preferred embodiment of the present invention, noise figures can be particularly optimized on front end amplifiers through proper ratioing. The iFET's electrical characteristics can be enhanced by modifying the combined and relative strength of the source and drain channels, without modifying the available IC process (without analog extensions). There are several approaches to realizing this optimization (adjusting length, width, and threshold among others).

Nearly any source and drain channel size will make a functional iFET, but varying the individual iFET channel size, both relative and cumulative, increases the iFET performance depending on the objective.

Fundamentally:

Lower iPort impedance is achieved with a lower current density (wider) source channel as compared to the drain channel.

Higher voltage gain is obtained through a higher resistance (longer) drain channel as compared to the source channel, which makes a higher output impedance looking into the drain terminal (iFET Voltage gain=Drain channel resistance/Source channel resistance).

The power verses speed tradeoff is controlled by the cumulative sum of all of the channel strengths used to set the idle current through the complementary iFET amplifier. This establishes the output slew rate (or output drive capability).

To be clear, the strength of the iFET channels are a function of the individual channel width and lengths, as well as their thresholds. Each of the iFET channels can have individually selected sizes and/or threshold relationships to the other channel.

Figure 2E:
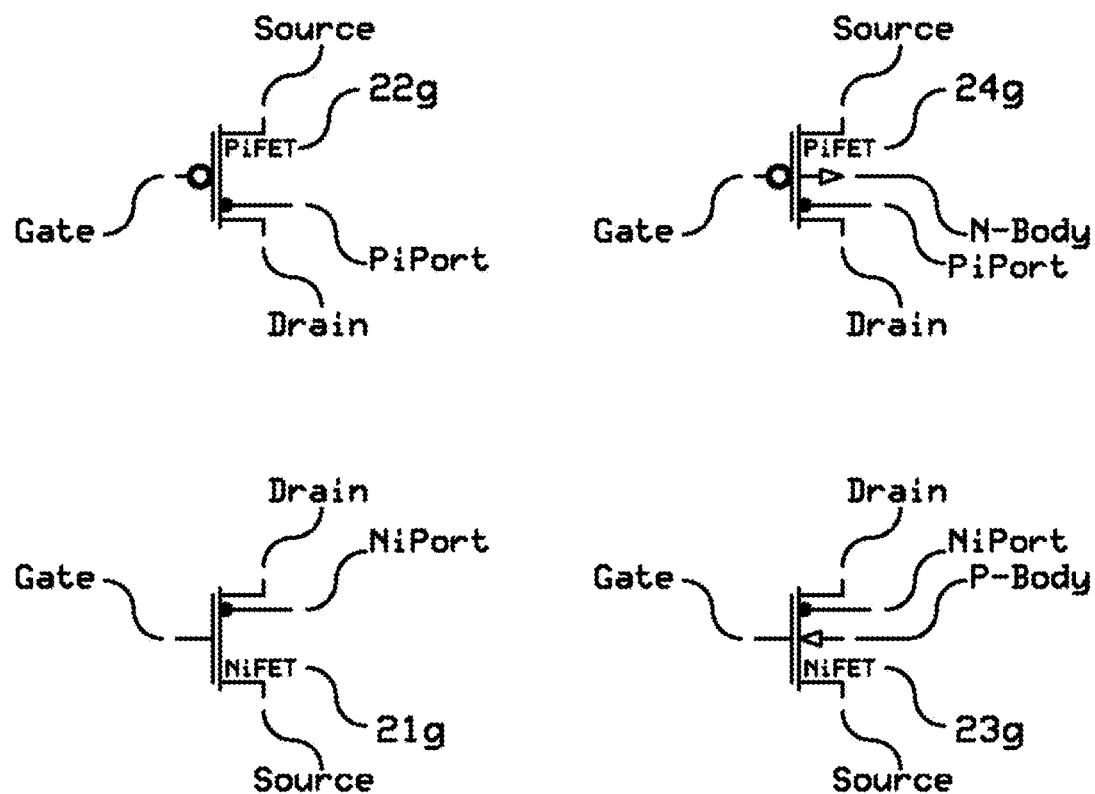
FIG. 2e shows various iFET symbols of the present invention.

FIG. 2e shows various conventions/symbols for iFET devices of the present invention. Symbols 22g and 24g for PiFET, and symbols for NiFET 21g and 23g are shown. For example, NiFET 21g or 23g represents an n-type iFET (or NiFET) with longer source channel as previously described, and thus, as it can be seen, NiPort is shown near the Drain. An example sizing of the device 21g may be, for drain channel with 2XWmin/Lmin while the source channel is Wmin/2XL$_{min}$ for an iFET ratio of 1/4. This NiFET would allow for higher input iPort resistance for higher gain uses, which is useful for voltage input amplifier applications. Similarly, PiFET 22g or 24g is shown to have PiPort near the Drain as well, which signifies longer source channel.

While iFET amplifiers can be constructed with minimum sized devices which do provide ample current at the output for very fast response and high accuracy, care must be exercised so that the complementary iFET amplifier does not pass too much current, subjecting it to mechanical failure. The physical layout requires enough contacts and metal for the required DC and transient currents.

Noise Advantages:

In the end, it comes down to signal-to-noise ratio. Low power supply voltage requirements in ultra-deep-sub-μm IC processes limit the maximum signal swing to a much smaller number than most analog designers are used to. So with a smaller signal, the noise must be equally small in order to maintain the desired signal to noise ratio. It is imperative that noise issues be reduced. This iFET amplifier technology not only reduces noise by an amount as would be necessary, but performs far beyond expectations, delivering ultra-quiet front ends.

1/f noise in the source channel is reduced because the self-bias scheme provides a high field strength on the source channel's gate, forcing carriers in the channel to operate below the surface where there is a smoother path (fewer obstructions) than along the surface where crystal lattice defects interfere.

1/f noise in the drain channel is also low. Unlike conventional analog designs, the gate is self-biased at the half-way point between the power supply rails as is the drain, while the iPort is within ~100 millivolts of the power rail. With the high electric field along the drain channel, and the gate voltage equal to the drain terminal voltage, the carriers are constrained to flow mostly below the channel surface. This keeps the drain channel out of pinched off conditions, where unwanted 1/f noise would be generated.

Resistor noise is reduced because the self-bias configuration puts the complementary pair at its lowest channel resistance operating point. Resistance is caused by collisions, between carriers and the surrounding atoms in the conductor. The lower the resistance is, the fewer the collisions are.

Wide band noise (white-noise) would always be an issue in high gain for high frequency circuits. While conventional designs adjust the gate voltage to establish suitable operating point(s), the designs of the present invention establish the gate voltage at the optimum point (the "sweet-spot") and then adjust the load to establish the desired operating point. This approach establishes a higher quiescent current where (for reasons explained above) higher current density circuits have lower wide band noise.

High common mode power supply rejection is inherent in the complementary iFET circuit of the present invention. Signals are with respect to the mid-point instead of being with respect to one of the power supply rails, (similar to an op-amp with its "virtual" ground). Power supply noise is from one rail to the other, equal and opposite in phase with respect to each other; thus canceling around the mid-point.

Ground-Loop noise is diminished because the circuit ground is "virtual" (just like in many op-amp circuits), rather than ground being one or the other power supply connections. . . . In the closed-loop case, "Flying capacitors" (or "input voltage sampling capacitors") are employed. With "flying capacitors" there is no direct electrical connection between stages, so there is no common ground; virtual or otherwise. The use of "differential decoupling" (flying capacitors) offers transformer like isolation between stages, with the compactness of integrated circuit elements.

Coupled noise from "parasitic induced crosstalk" increases by the square of the signal amplitude. Unintended capacitive coupling with a 1 volt signal causes a lot more trouble than with a 100 mV signal, by a factor of 100:1 (square law effect). The small voltage signals employed in the analog sections, reduce this capacitive coupled interference substantially. Nearby Digital signals will, by definition, be high amplitude (rail-to-rail). Good layout practices are still the best defense against this digital source of noise.

Additional Advantages:

There are a number of additional advantages. For example, bi-directional control on the iPort means that current can flow in-to as well as out of this connection; both directions having a significant control effect on overall channel current. The iPort has about five (5) orders of magnitude more dynamic control range than the gate.

The iFET of the present invention yields an analog structure that is significantly faster than logic using the same MOS devices. This speed improvement is due to the fact that the complementary structure expresses its maximum gain (and highest quiescent current) at its natural self-bias point, midway between the power supplies.

Since the iPort voltage does not significantly change, it is immune to the R/C time constant effects of the surrounding parasitics, thus the iPort (current) input responds faster than the gate (voltage) input.

Since in most applications of the CiFET compound device of the present invention, the output voltage (drain connection point) does not vary greatly, and thus making the output immune to the R/C time constant effects of the surrounding parasitics. A logic signal is slower than analog here because logic signals have to swing from rail to rail.

Drain-induced barrier lowering or (DIBL) threshold reduction is avoided in the CiFET compound device operating in the analog mode. When gain and threshold voltage is important, the drains are operating around half of the power supply voltage, thus eliminating the higher drain voltages where DIBL effects are prevalent.

Figure 4A:
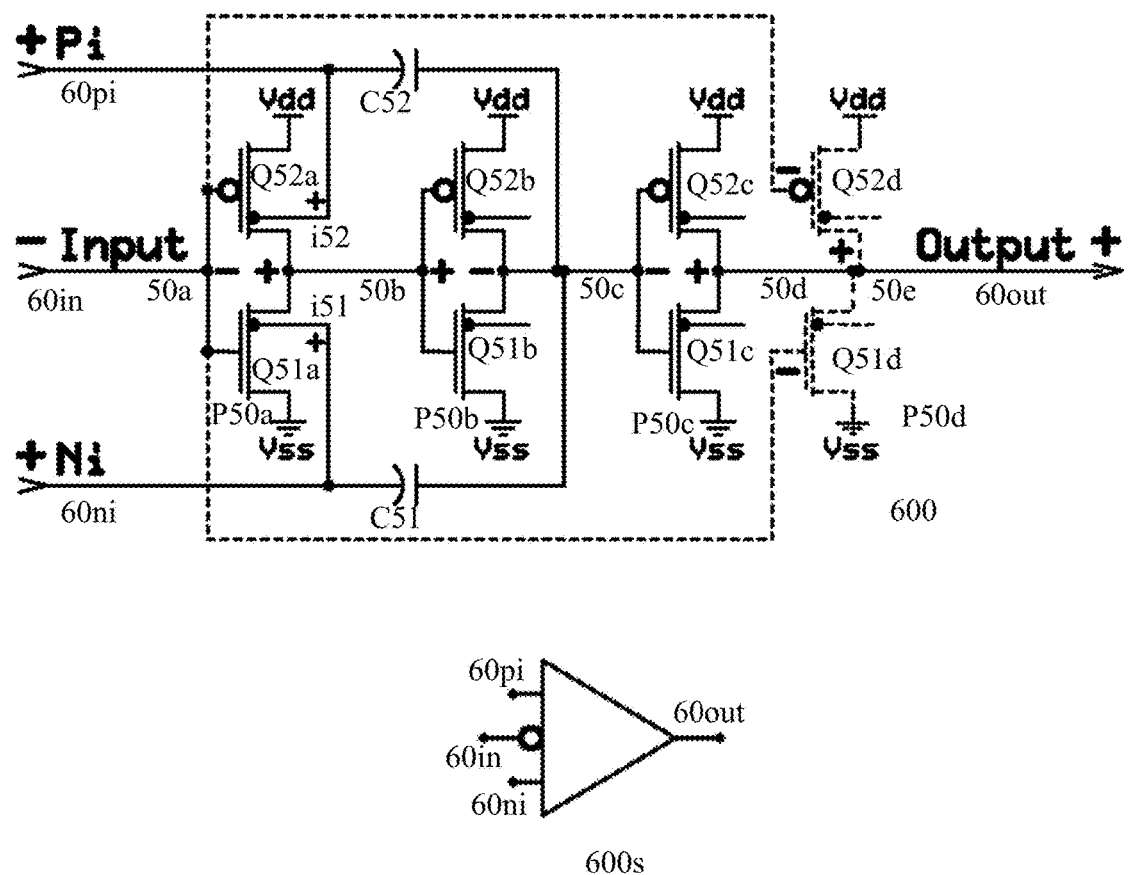
FIG. 4a illustrates a schematic diagram of a 3-Stage compensated CiFET amplifier (or CiAmp) transistor of the present invention.

FIG. 4a shows a three (3) stage voltage amplifier of a preferred embodiment of the present invention, including a first pair P50a of CiFETs, NiFET Q51a and PiFET Q52a, second pair P50b, NiFET Q51b and PiFET Q52b, third pair P50c, NiFET Q51c and PiFET Q52c, which are connected in series where the input of the subsequent pair is fed from the output of the previous pair as shown therein. Input of the multistage amplifier 600 is connected to input 50a of the first pair of CiFETs Q51a and Q52a, which are, in turn, connected to the gate ports thereof, the drain from the first pair of CiFETs Q51a and Q52a is connected to the input 50b of the second pair P50b of NiFET Q51b and PiFET Q52b; then the drain of the second pair P50b of Q51b and Q52b is connected to the input 50c of the third pair P51c of NiFET Q51c and PiFET Q52c. Drain of the third pair P51c of NiFET Q51c and PiFET Q52c forms as output 60out. Now, the output of the second pair P50b of NiFET Q51b and PiFET Q52b may be connected through roll-off capacitors C51 and C52 as injection current i51 and i52 of the first CiFET pair P50a of NiFET Q51a and PiFET Q52a.

The circuit in the FIG. 4a may optionally comprise a "feed-forward" CiFET pair P50d of NiFET Q51d and PiFET Q52d for enhanced speed and improved stability. The input of the feed-forward pair P50d of NiFET Q51d and PiFET Q52d are connected to the input 60in of the amplifier, and the output 50e of the feed forward pair P50d of NiFET Q51d and NiFET Q52d is joined with the output 50d of the third pair P50c of NiFET Q51c and NiFET Q52c.

The third pair P50c of NiFET Q51c and PiFET Q52c provides the necessary sign inversion for a functional high gain, closed loop amplifier. In addition, a "feed forward" circuit P50d including NiFET Q51d and PiFET Q51d provides early movement on the output (with lower gain) while the first three CiFET stages provide a more accurate output signal (with higher gain) later on.

Upon initial inspection of the circuit configuration, it appears that transistors Q51c and Q52c compete with transistors Q51d and Q52d. However, the ultimate output voltage destination for both paths is the same except with a higher accuracy for the longer (later) path.

All but the input stage could be realized with ordinary MOSFETS, however there is a significant gain and bias point matching advantage when employing iFETs for all stages.

In FIG. 4a with feed forward pair P50d, the result is a 3 stage, compensated, high gain amplifier; with "feed forward" for enhanced speed, with a dominantly slow stage Q51b and Q52b for stability.

Because the stages are self-biased to operate at their maximum gain point, this configuration operates at speeds in excess of the logic transition time of the surrounding digital neighbors without employing any analog process extensions.

The entire circuit is constructed with small size devices; so the footprint is unexpectedly small, the physical circuit layout parasitics are minimized, the speed is greatly enhanced, and the power consumption is extremely small as compared to prior art.

Operation at the self-biased maximum gain point contributes to a welcomed improvement in signal to noise ratio. Based on further gain requirements, adding further gain stages may be desirable. FIG. 6a(1) shows five (5) stage gain with optional feed forward compensation, and FIG. 6a(2) shows seven (7) stage gain with optional feed forward compensation. As shown in FIG. 6a(1), first three stages thereof, including a first pair P50'a of NiFET Q51'a and PiFET Q52'a, a second pair P50'b of NiFET Q51'b and PiFET Q52'b, a third pair P50'c of NiFET Q51'c and PiFET Q52'c, and configuration of capacitors C51' and C52' are similar to that of FIG. 4a. Additional two stages, a fourth pair P50'e of NiFET Q51'e and PiFET Q52'e, and a fifth pair P50'f of NiFET Q51'f and PiFET Q52'f are connected further in series. Optionally, feed forward pair P50'g of NiFET Q51'g and PiFET Q52'g may be added for similar reasons as shown for FIG. 4a. In addition, further feed forward pair P50'd of NiFET Q51'd and PiFET Q52'd, may be added for further improvement in speed/response.

FIG. 6a(2) includes the first (5) stages (including optional feed forward compensation) as shown in FIG. 6a(1), including a first pair P50"a of NiFET Q51"a and PiFET Q52"a, a second pair P50"b of NiFET Q51"b and PiFET Q52"b, a third pair P50"c of NiFET Q51"c and PiFET Q52"c, a fourth pair P50"e of NiFET Q51"e and PiFET Q52"e, and a fifth pair P50"f of NiFET Q51"f and PiFET Q52"f with optional feed forward stages, a first feed forward pair P50"d of NiFET Q51"d and PiFET Q52"d and a second feed forward pair P50"g of NiFET Q51"g and PiFET Q52"g. The additional two gain stages, a sixth pair P50"h of NiFET Q51"h and PiFET Q52"h and a seventh pair P50"i of NiFET Q51"i and PiFET Q52"i may be further connected in series with an optional feed forward pair P50"h of NiFET Q51"h and PiFET Q52"h. Accordingly, a person of ordinary skill in the pertinent art would appreciate flexibility in designing multi-stage amplifier and improvement therefor may be made by optionally adding one or more feed forward compensation therein.

Figure 4B:
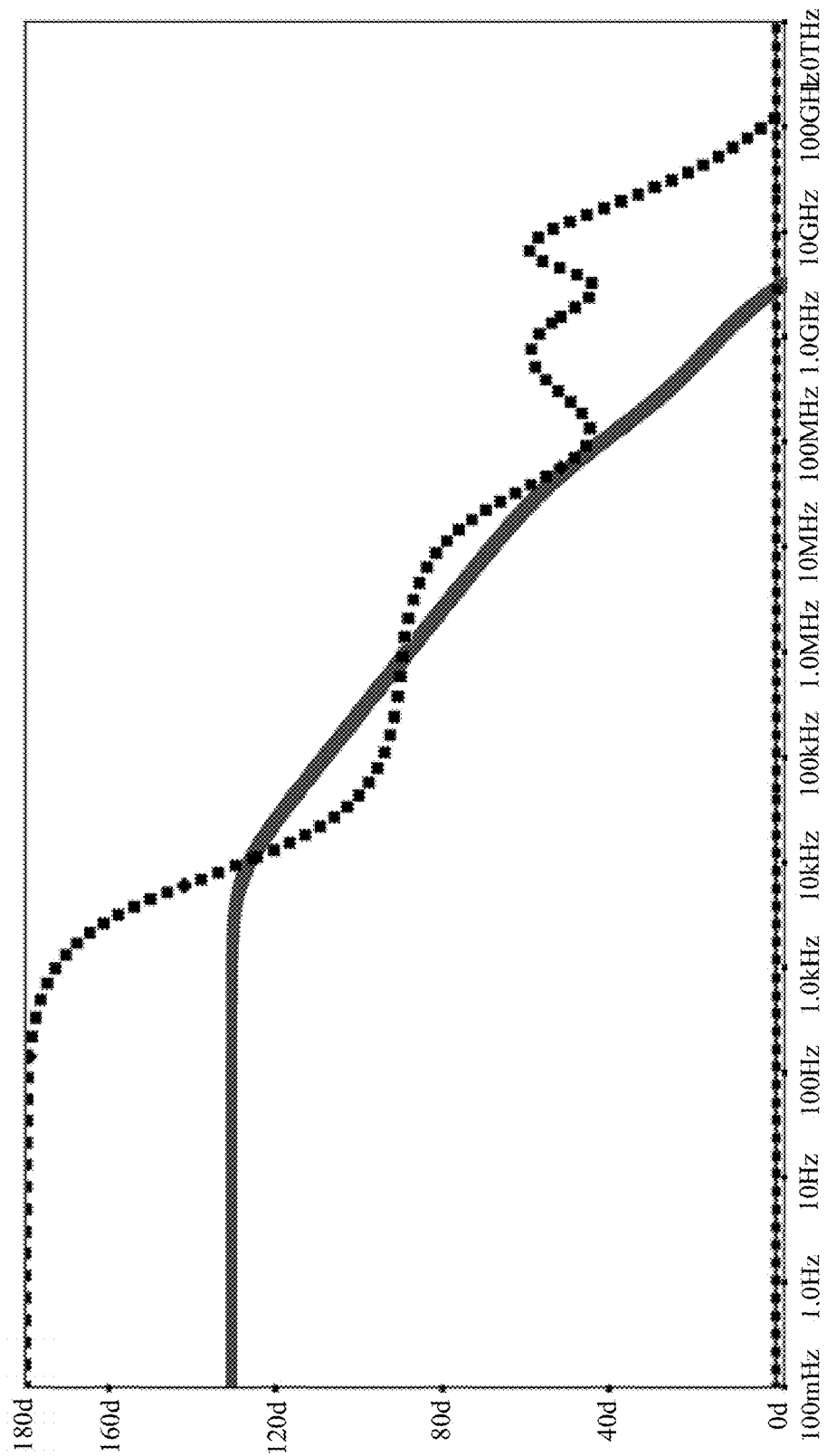
FIGS. 4b to 4d are representative performance plots of frequency domain and power supply dependence illustrations for 3-Stage CiAmp of the present invention.

FIG. 4b plots the small-signal AC voltage gain in dB and phase shift in degrees over frequency from 1 mHz to 1 THz as commonly rendered as a Bode plot. For these plots in FIGS. 4b, 4c, 4e, and 4f, the gain and phase shift shared the same vertical scaling numbers with gain in dB and phase shift in degrees. Here a small roll-off capacitor over 40 degrees of phase margin as indicated by the dotted horizontal line. The gain plot of FIG. 4b was rerun with differencing power supply voltages from 1.8-volts down to 0.12 volts in 0.1-volt increments to create FIG. 4c. FIG. 4d plots these voltage gains on the left axis over power supply voltage and adds 0 dB crossover frequency of FIG. 4c to the right axis of FIG. 4d; it can be seen that the gain peaks around a 0.8-volt power supply while the cutoff frequency still remains relatively high. This demonstrates that these CiFET amplifiers are not limited by a sum-of-threshold voltage as in conventional MOSFET amplifiers—a highly sought after design goal.

Figure 4C:
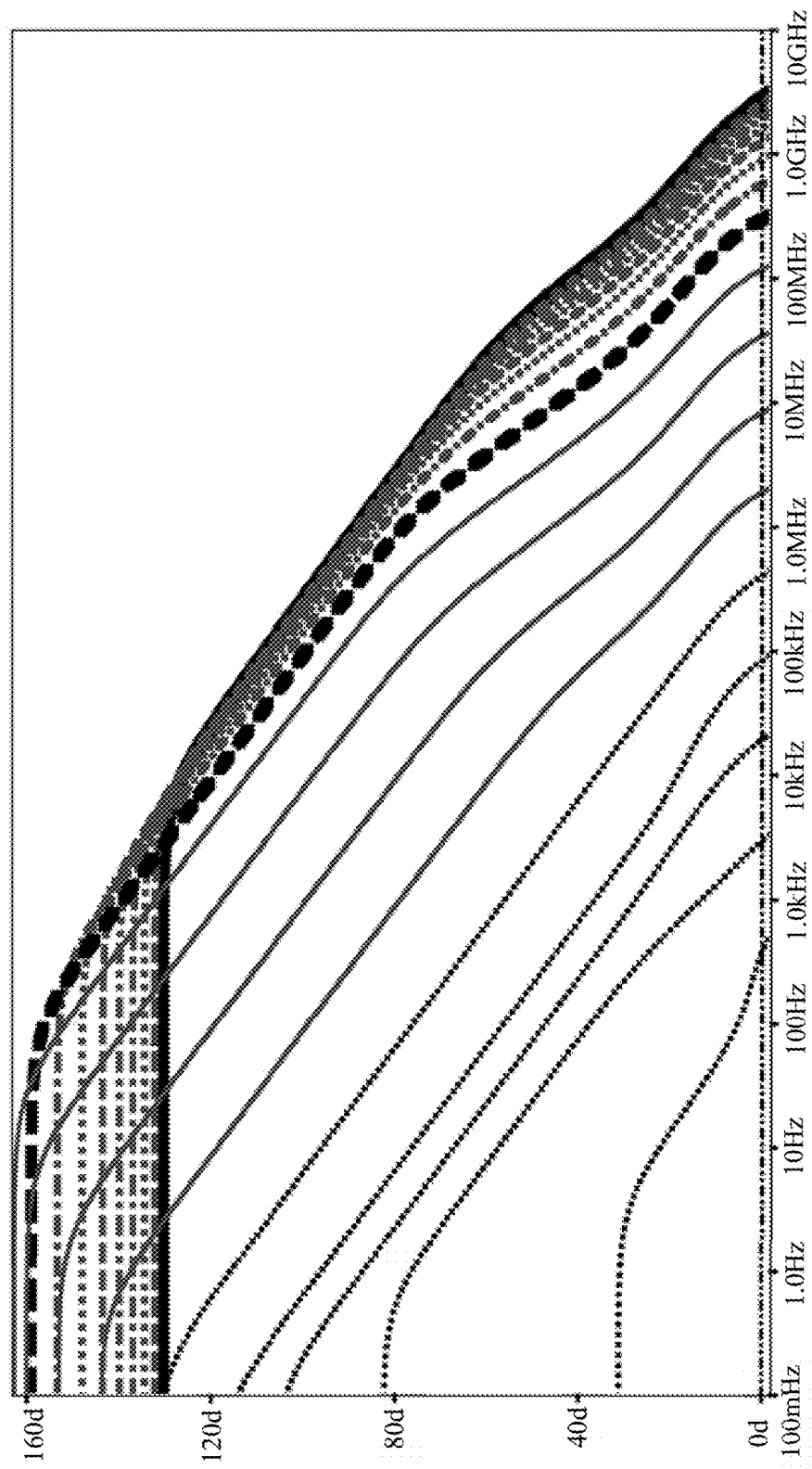
Figure 4D:
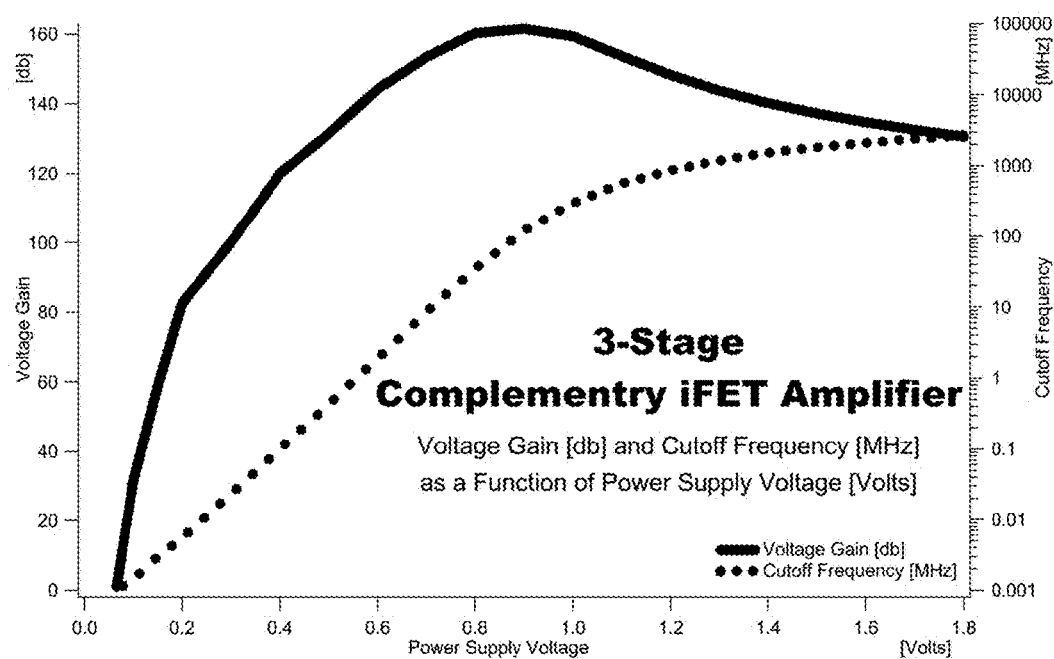
Figure 4E:
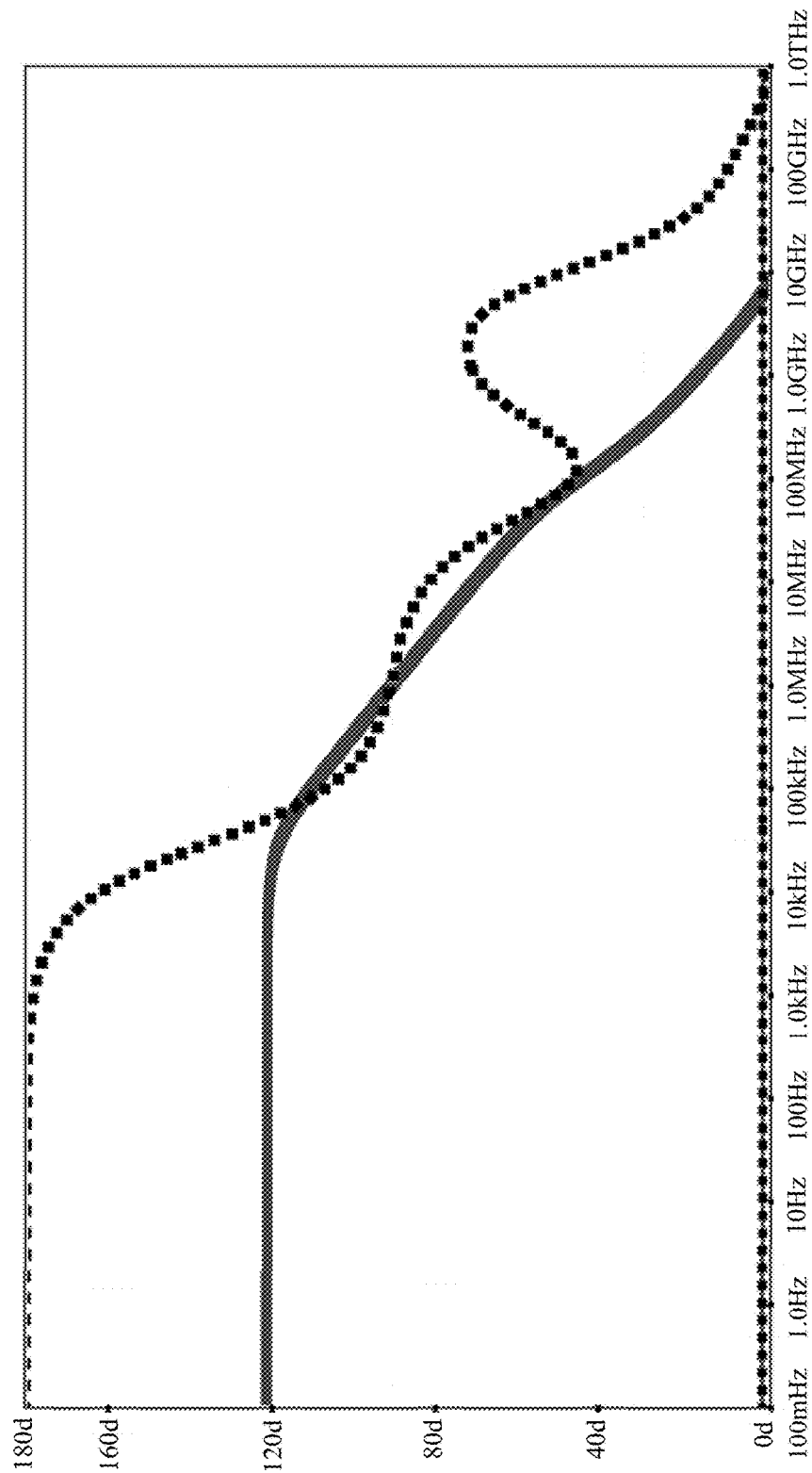
FIGS. 4e to 4g are representative performance plots/illustrations of frequency domain performance and power supply dependence for the 3-Stage Feed-Forward compensated CiAmp of the present invention.
Figure 4F:
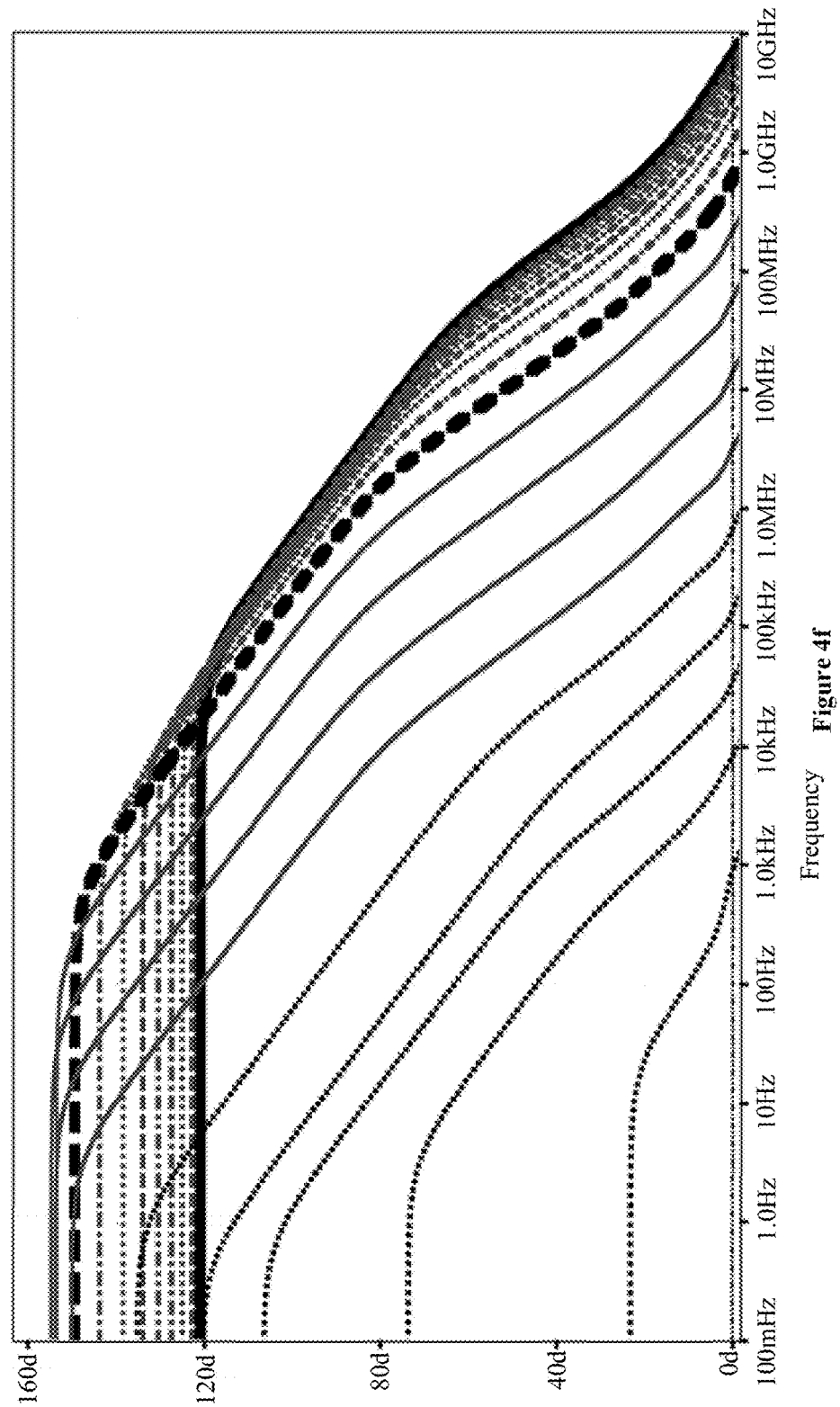
Figure 4G:
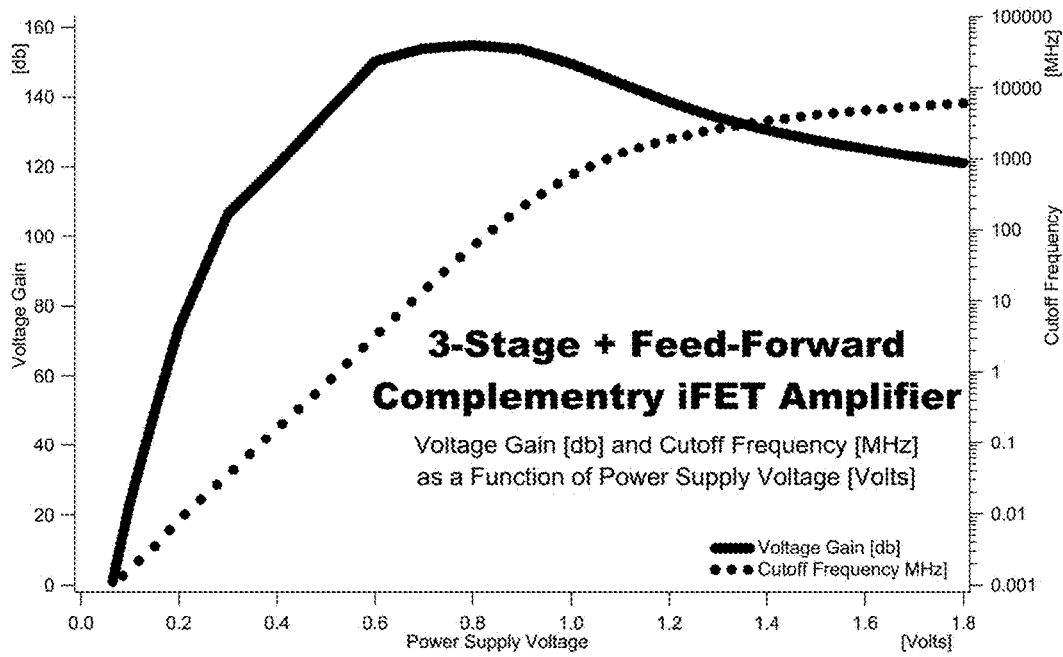

FIGS. 4e, 4f, and 4g correspond to FIGS. 4b, 4c, and 4d, but have the feed-forward stage included. Comparing FIG. 4d to FIG. 4g it is seen that the speed is a little higher at the expense of a little lower gain.

Figure 4H:
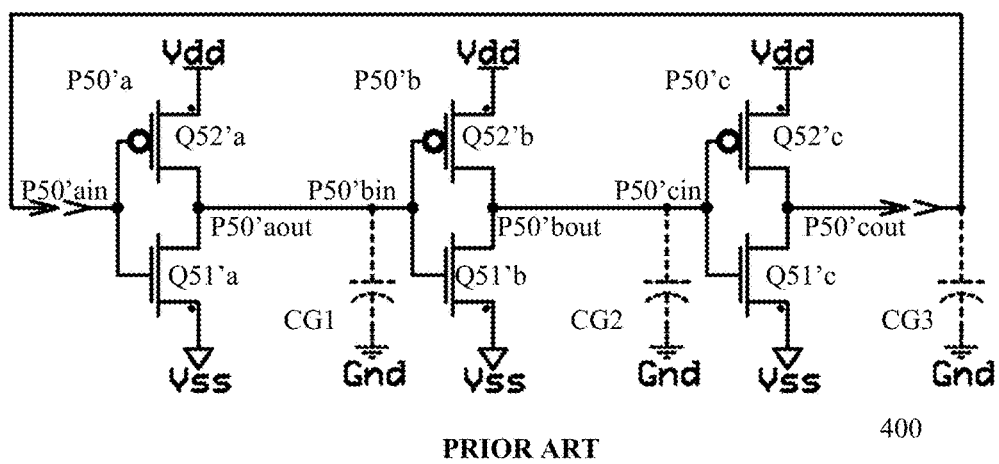
FIG. 4h shows a schematic diagram of a ring oscillator of prior art.
Figure 4I:
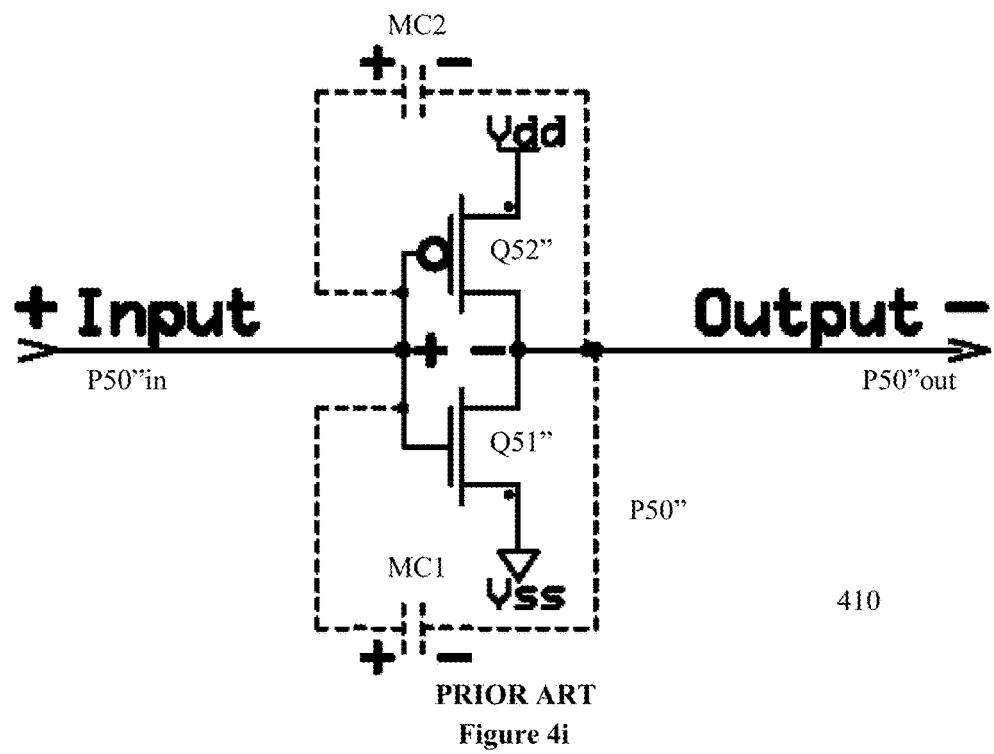
FIG. 4i shows a conceptual Miller capacitance from Miller effect on an inverter of of prior art.
Figure 4J:
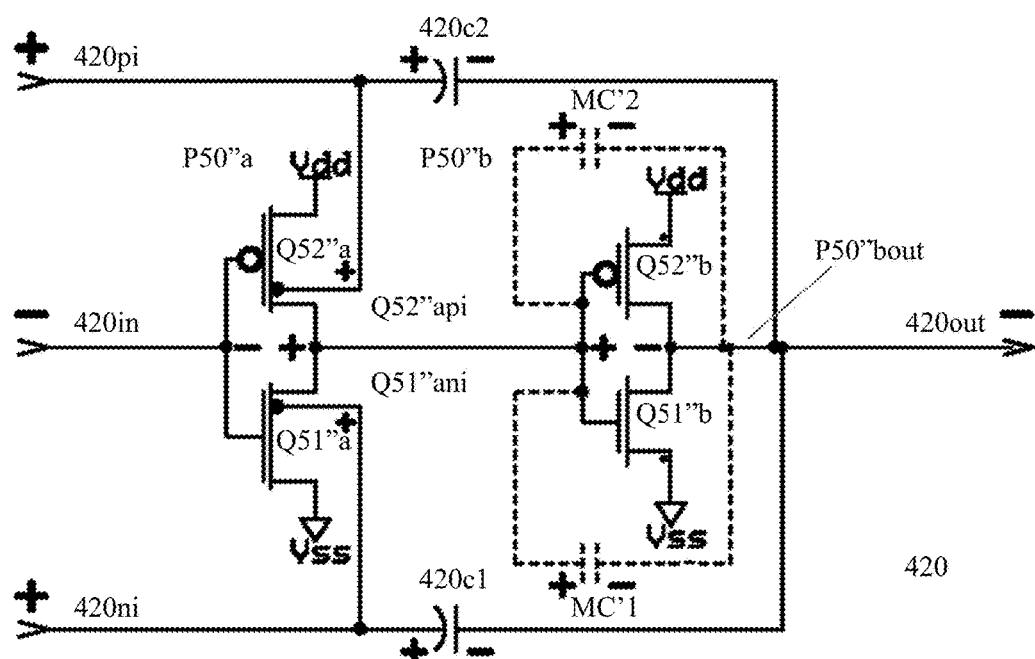
FIG. 4j shows a schematic diagram showing Miller capacitance augmented by a CiFET of the present invention.
Figure 4K:
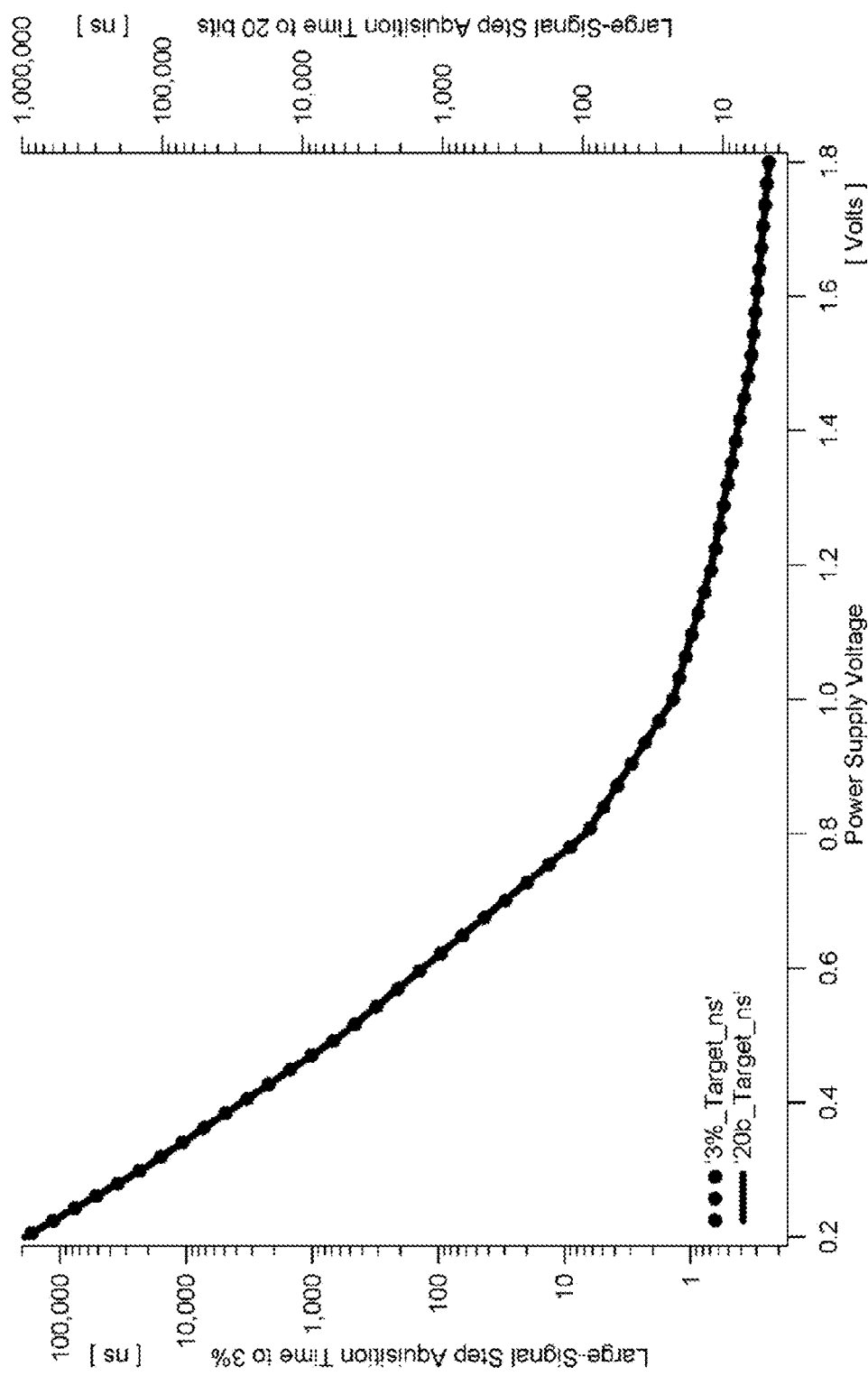
FIG. 4k shows a graph representing varying acquisition time versus supply voltage for the 3-stage feed-forward CiAmp circuit in accordance with the present invention.

FIG. 4k is a plot representing the varying acquisition time versus supply voltage for the 3-stage feed-forward CiAmp circuit for an example 180 nm CMOS process. Note that with a 1V power supply, this voltage gain stage requires about 1ns to acquire a large signal step in voltage to within 3% and 20 ns to settle to 1 ppm (20 bit equivalent) accuracy. Settling with a 0.8 volt power supply requires about 5 ns for 3% and 100 ns to 1 ppm. Note that FIG. 4k is from a 180 nm all-digital IC process using normal logic-core threshold voltages, showing that the CiFET is not restrained by threshold voltage as with state-of-the-art analog designs. Smaller IC process nodes perform corresponidgly faster; as related to the poroprionality of eqauivalent ring oscillator speeds.

Figure 4M:
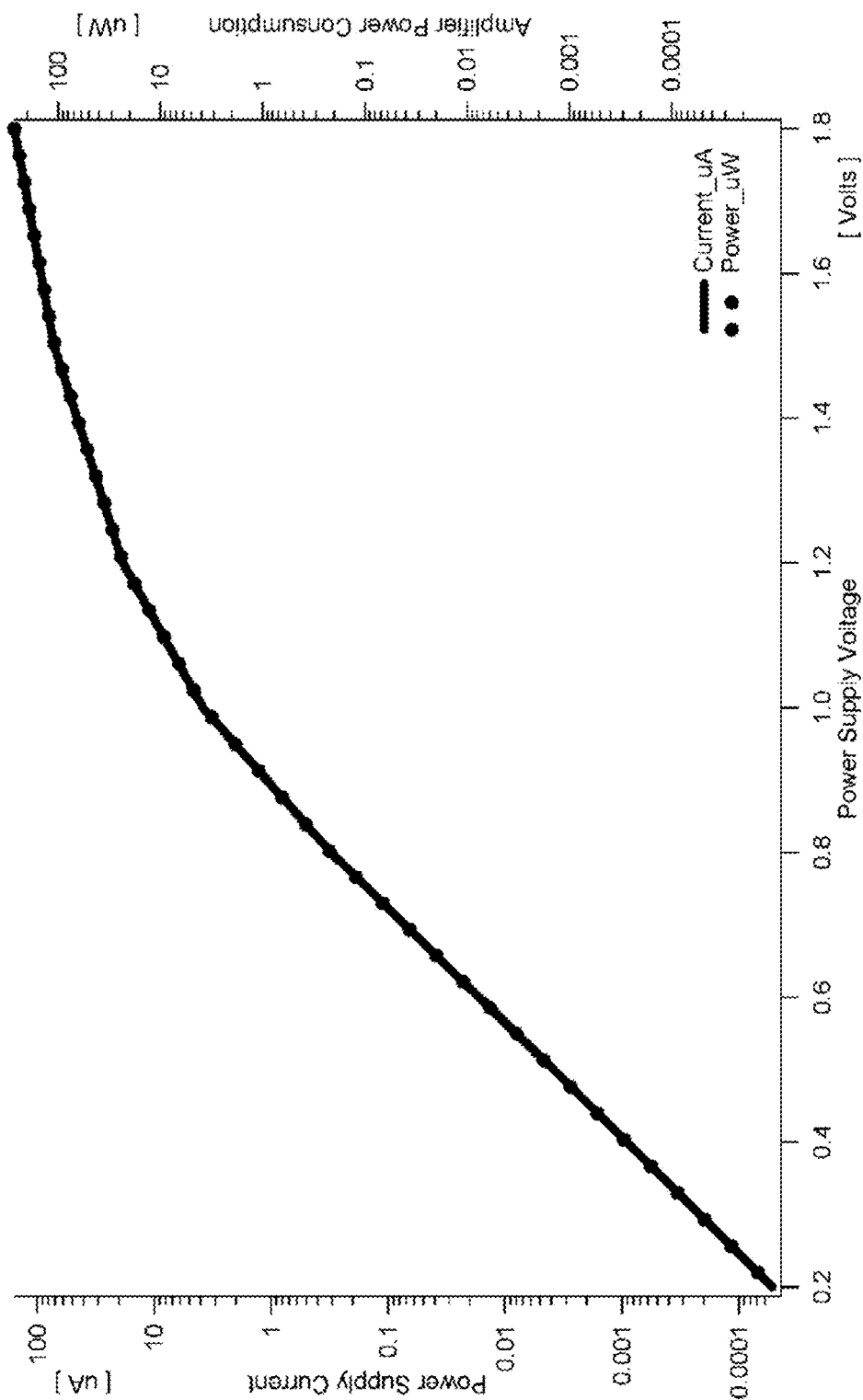
FIG. 4m is a power diagram for 3-stage CiAmp in accordance with the present invention.

FIG. 4m shows power consumption of a 3-stage differential CiAmp, over various power supply voltages for an example 180 nm CMOS process. For example, a total differential amplifier circuit (consisting of six CiFETs as in FIG. 6b, 6d, 6h, 6k, or 6m) consumes about 4 μa for a power of 4 μWatts, or ½ μWatt per CiFET. Nanoscale processes will be lower, primarily as a function of the small CMOS threshold voltage reduction with IC process shrink.

FIG. 4h illustrates an exemplary schematic diagram of a ring oscillator 400 using CMOS inverters P50'a, P50'b, and P50'c, each of inverters P50'a, P50'b, and P50'c comprises a complimentary pair of NFET Q51'a/Q51'b/Q51'c and PFET Q52'a/Q52'b/Q52'c. The oscillator 400 is constructed as an odd number of inverters, cascaded in series by connecting the output of a previous one of the inverters to the input of the subsequent one of the inverters. For example, the output P50'aout of the first inverter P50'a is connected to the input P50'bin of the second inverter P50'b, then the output P50'bout of the second inverter P50'b is connected to the input P50'cin of the third inverter P50'c. The last inverter's output P50'cout is connected back to the input P50'ain of the first inverter P50'a to form a closed loop. Thus, as the result, this circuit always oscillates in operation. It looks remarkably like the high gain version of a CiFET amplifier (for example, similar to one shown in FIG. 4a) when the output is tied back to the CiAmplifier's input for closed loop operation. This closed loop feedback is especially obvious in FIG. 6g for example when operated in the offset/noise setup phase where the switch 69ss2 is closed. The oscillation frequency is established through the accumulated phase delay through all the stages of inverters summing to 360 degrees of the oscillation frequency. The traditional approach to stop this oscillation is to ensure that the closed loop gain, at the frequency determined by the phase shift around the loop is less than unity.

A single inverter circuit does not oscillate because there is insufficient phase shift. By its nature, it always has a 180 degree phase shift when gain is present. Adding additional gain stages in the feedback path contributes additional phase delay and, thus, causes an uncompensated amplifier circuit to oscillate.

FIG. 4i shows a Miller capacitance of a CMOS inverter P50". CMOS inverter P50" comprises NFET Q51" and PFET Q52". Miller capacitance is due to the Miller Effect, where there is an increase in capacitance from the input to the output gain of an inverting amplifier P50" such that:

$$C_M = C_F(1 + A_{V1}),$$

where $C_M$ is the Miller capacitance at MC1 and/or MC2;

$C_F$ is the feedback capacitance; and $A_{vi}$ is the inverting gain (i.e. $-A_{vi}$) of the inverter P50".

Such Miller capacitance may affect performance of an amplifier.

FIG. 4j shows a Miller capacitance MC'1 and MC'2 augmented by CiFET, the circuit 420 includes input 420in, iPort input 420ni, 420pi, output 420out, and first CiFET P50"a and second CMOS inverter P50"b. As it can be seen, roll-off capacitors, 420c1 and 420c2 are placed between the voltage output P50"bout of the second stage P50"b and fed into the input iPort Q51"ani and Q52"api of the first stage P50"a. The iPort Q51"ani and Q52"api has a fixed $R_{in}$. resistance set by the ratioing of the CiFET, thus establishing a predictable fixed series resistance as required for the RC time constant. Since the input at the iPort Q51"ani and Q52"api has transresistance gain from the first P50"a to the second stage P50"b's voltage output, the added roll-off capacitance 420c1 and 420c2 is multiplied by $r_m$ making capacitance of the roll off capacitor 420c1 and 420c2 small (~10 to 100 fF) which will recharge quickly from an overdrive. Also, if the power supply voltage or IC parameters change/modify the CiFET ratio, the gain of this CiAmp circuit 420 will automatically self-adjust its effective RC time constant. This is because the transresistance gain, $r_m$, is proportional to $R_{in}$, for example, a higher $r_m$ gives a higher $R_{in}$. Therefore, temperature or any process variations, such as individual voltage threshold shifts in the transistors, are innately self-compensated for without any extra circuitry or power usage. Additionally, capacitance of the roll off capacitor is split into 2 separate capacitors 420c1 and 420c2 and placed between the complementary iPorts Q51"ani and Q52"api to include parametric variations for either polarity transistors while balancing noise and dynamic response maintaining symmetric response for the CiFET-based circuit 420. The second stage is illustrated with a CMOS inverter P50'b, but instead, using a CiFET second stage provides an improved balanced performance.

Figure 5A:
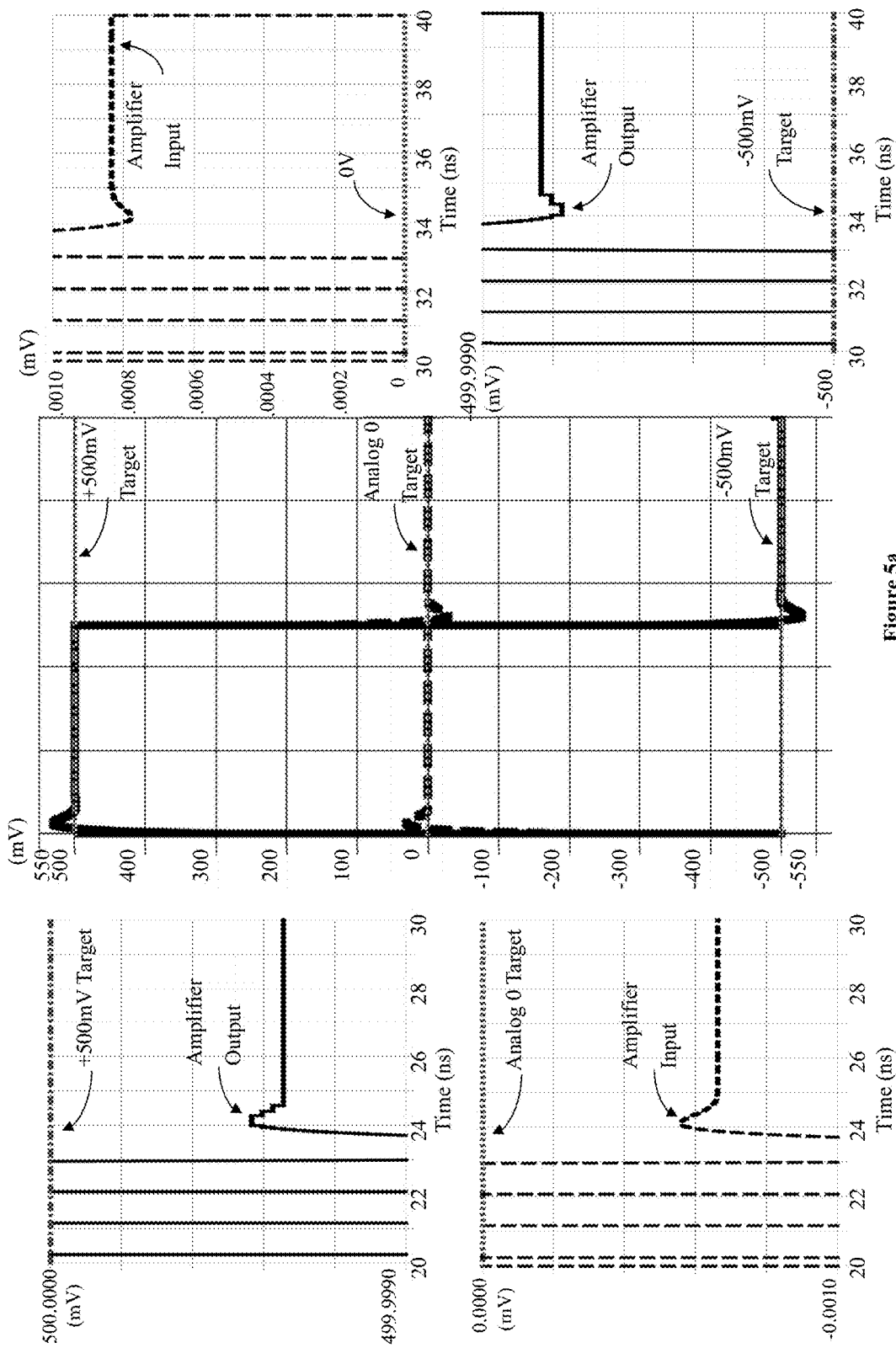
FIG. 5a shows transient response performance of the 3-Stage Feed-Forward CiFET amplifier of FIG. 4a, illustrating the slew and settling performance to a precise Peak-to-Peak (P-P)±1.000000 volt large-signal, where four inserts magnify the ring-out settling by 1,000,000 times (1 µv target windows) to show that the analog amplifier is accurate to 20 bits.

FIG. 5a illustrates large signal slew performance/the enormous gain-bandwidth product of the 3-stage feed-forward CiAmplifier shown in FIG. 4a with feed forward. A 10 ns Pulse of 1V Peak to Peak (or 1 $V_{p-p}$) takes the output to its target value within 1 ns, to an accuracy of 1%. The output continues to settle to an accuracy of 0.00001% within 4 ns. (Note: The 4 vertical lines in each of the four magnified inserts are dampened ring-out cycles, magnified million times, following their respective initial pulse transition overshoot). An accuracy of 0.00001% represents a gain of 120 dB or 1,000,000:1 for 20 bit digital accuracy having 6+ decades of resolution.

While our example is using at 180 nm, smaller process nodes will perform substantially better. The speed, or bandwidth, scales with the frequency of a ring oscillator. The small plots on the left and right have their voltage scale expanded by a factor of 1 Million, but have these inserts have the same time scale as the center plot, so the settling time can be seen to be within 0.00001% of the target within 4 ns. Each of the 4 expanded inserts are for the portion of the output waveform they are adjacent to.

It is to be noted that the 4 expanded inserts on the outside of FIG. 5a show the ringing that is expected in response to a step waveform input, but the magnitude and duration are so small that a magnification of 1 million times is required to see it. This is how 20 bits or 6 decades of accuracy can be attained.

Figure 5B:
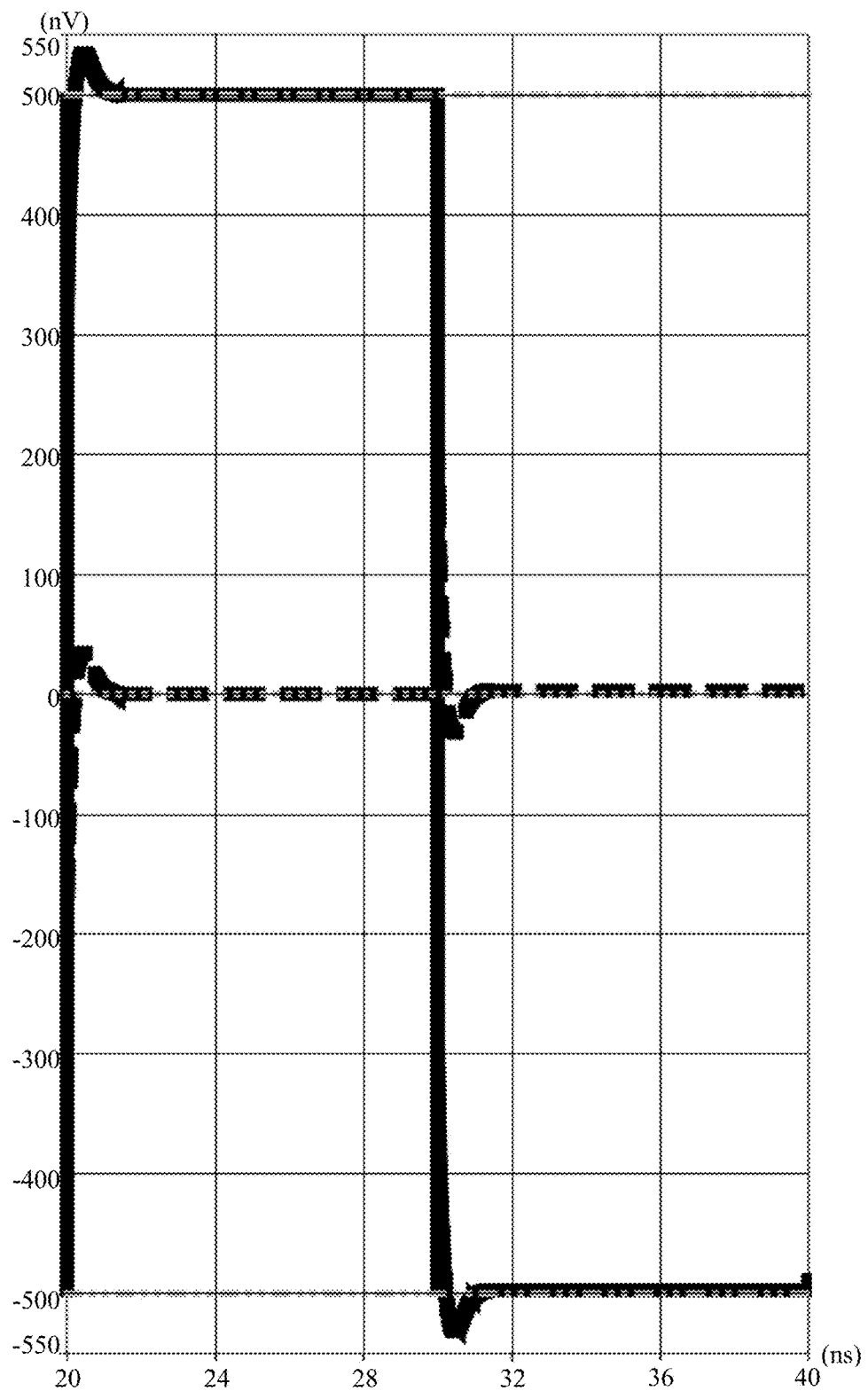
FIG. 5b shows Tiny-Signal Response @±1 µvolt P-P of the 3-Stage Feed-Forward CiFET Amplifier (as shown in FIG. 4a) of the present invention, which is similar to the waveforms shown in FIG. 5a, having the same time scale, except that the input amplitude is 1 million times smaller depicting well over 6 decades of dynamic range.

FIG. 5b illustrates tiny-signal response of the same circuit shown in FIG. 4a with feed forward, with an input step of ±1 μV P-P instead of ±1 V P-P. This is 1 million times smaller amplitude to demonstrate the amplifier dynamic range and linear precision. Surprisingly, the output waveform FIG. 5b looks identical to the large signal swing FIG. 5a at 1 millionth the signal level, thus the CiFET amplifier maintains its linearity and speed (gain-bandwidth) over greater than six decades of input signal dynamic range. The 1 ns response time means the (180 nm) amplifier is capable at frequencies in the GHz range. Smaller process nodes or larger transistors should extend the operational frequency at hi-resolution.

Substituting the 3-stage amplifier as shown in FIG. 4a without feed-forward increases gain to 130 dB which is 10,000,000:1 resolution yielding 7+ decades of dynamic range and linearity. This is approximately equivalent to 24 bits, which comes at a small cost in speed.

Figure 5C:
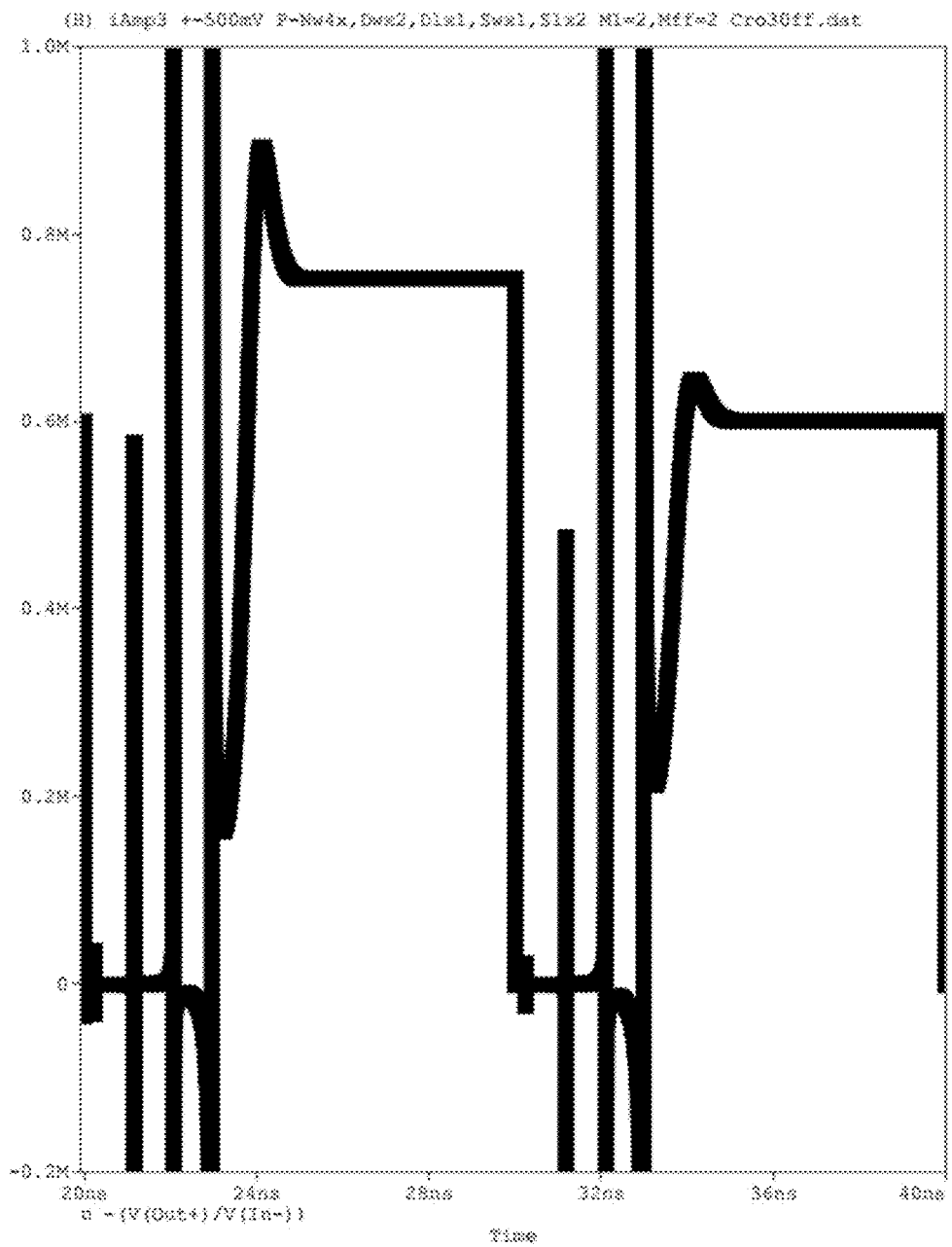

FIG. 5c shows the active large signal voltage gain (output/input) of the circuit shown in FIG. 4a with feed forward, resulting from the (±1 volt P-P) step plot FIG. 5a. The two wide horizontal lines in FIG. 5c show the voltage gain (about ¾ million) as the amplifier output settles into its target voltage (with ~20 bit accuracy) and the rest of the waveform is the result of the amplifier actively acquiring its step target. From 20 ns to 30 ns is a positive 1 volt step; followed by a negative 1 volt step from 30 ns to 40 ns.

Referring to FIG. 5a left inserts and FIG. 5c, once the signal has settled, the large signal open-loop gain would become almost 800 k for the P-Channel iFETs. For the N-Channel iFETs, the large signal open-loop gain is about 600 k.

At 20 ns to 22 ns the plot shows two short horizontal segments., This is where the feed-forward stage is dominant with a gain of about 100. These flat spots are followed by two slewing or transitioning segments. This is where the voltage is enhanced by the three "compensated" CiFET gain stages having a cumulative large-signal gain of approaching ¾ million. The behavior is repeated for the negative going input at 30 ns to 32 ns. Without the feed-forward stage, these 100× flat spots are not present.

Figure 5D:
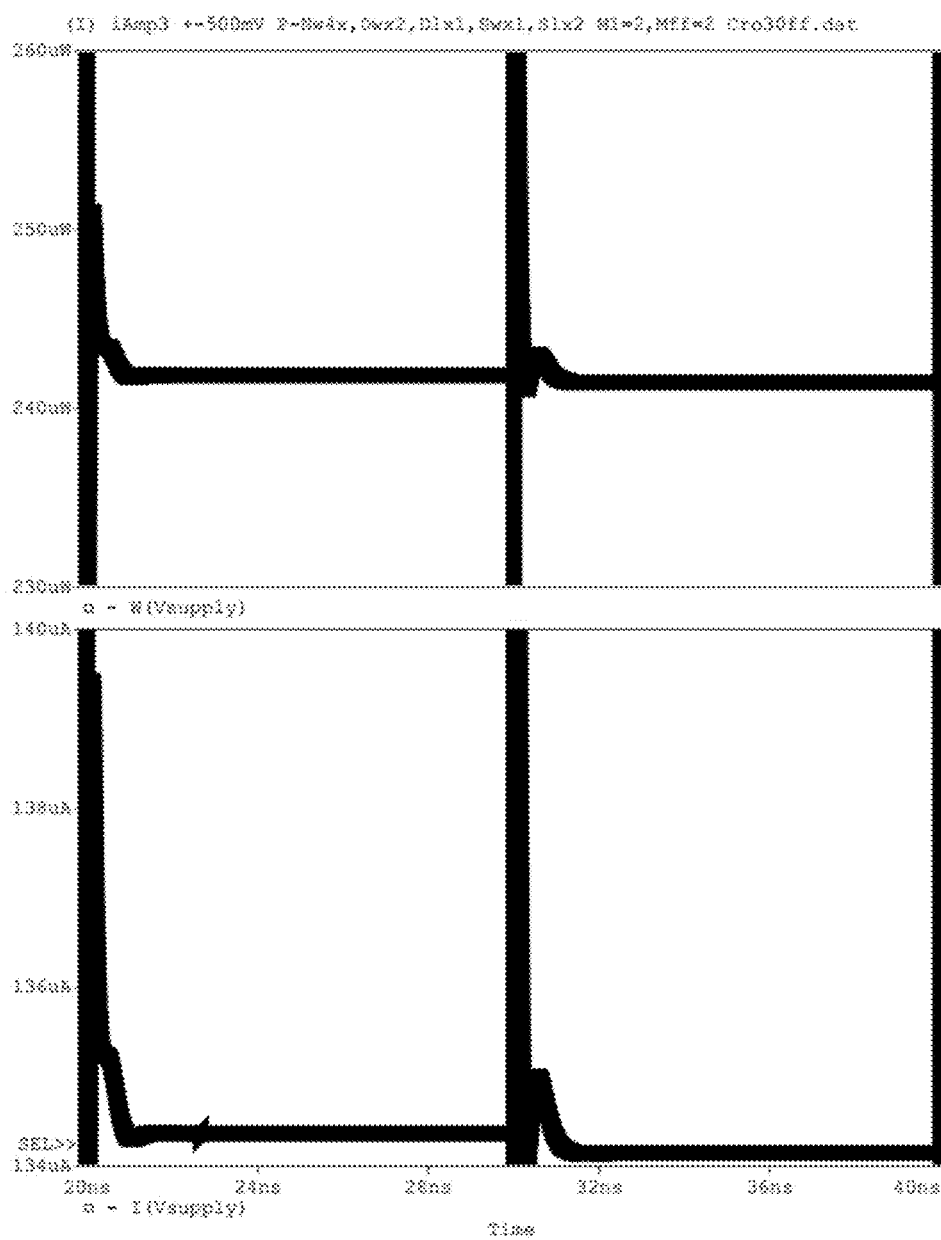

FIG. 5d shows the power consumption resulting from the (±1 volt) step plot FIG. 5a. Notice the only significantly small power (less than 135 μA & 245 μW @ 1.8 V supply) is required for a gain-bandwidth approaching 1 million @ 1 GHz. The amplifier would use whatever power is necessary to reach its target, then settles to about ¼ mW.

In accordance with another preferred embodiment of the present invention, it provides a current input trans-impedance amplifier (or "TIA").

Figure 6B:
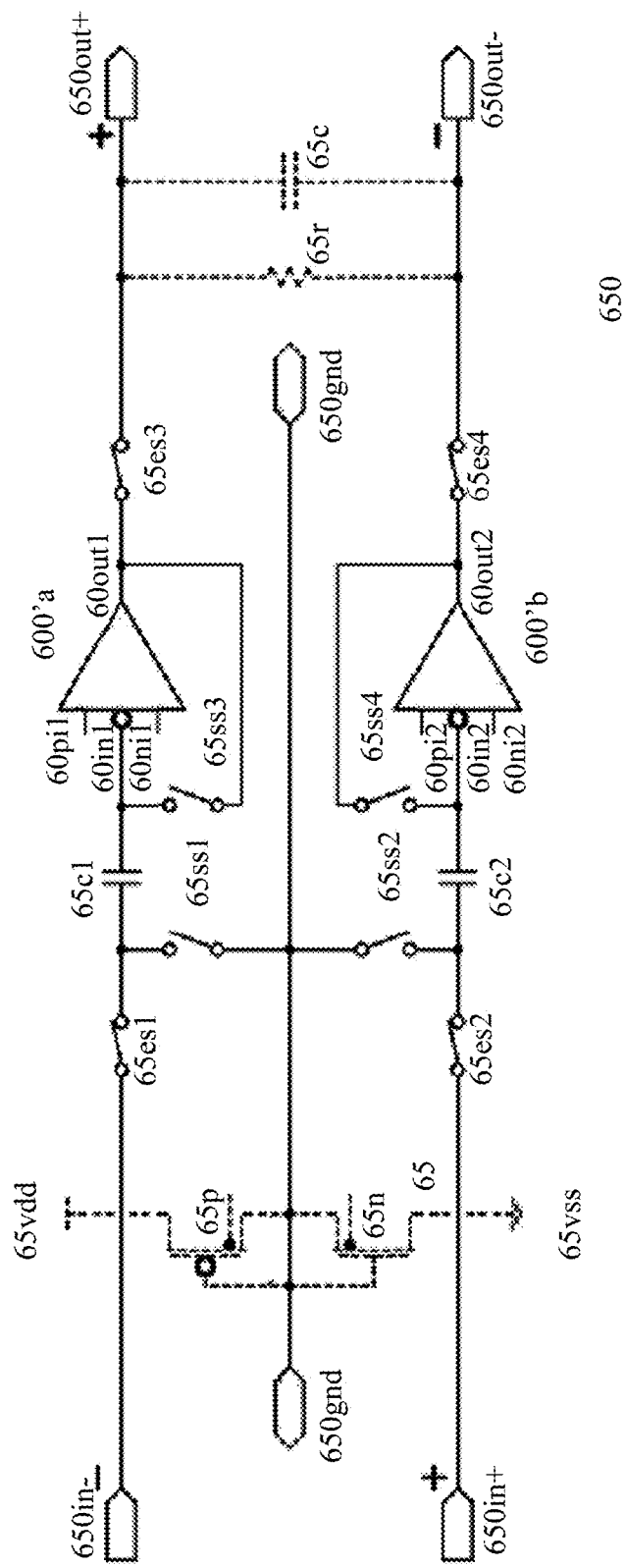
FIG. 6b shows a schematic diagram of a preferred embodiment of a full-differential CiFET replica OpAmp of the present invention.
Figure 6C:
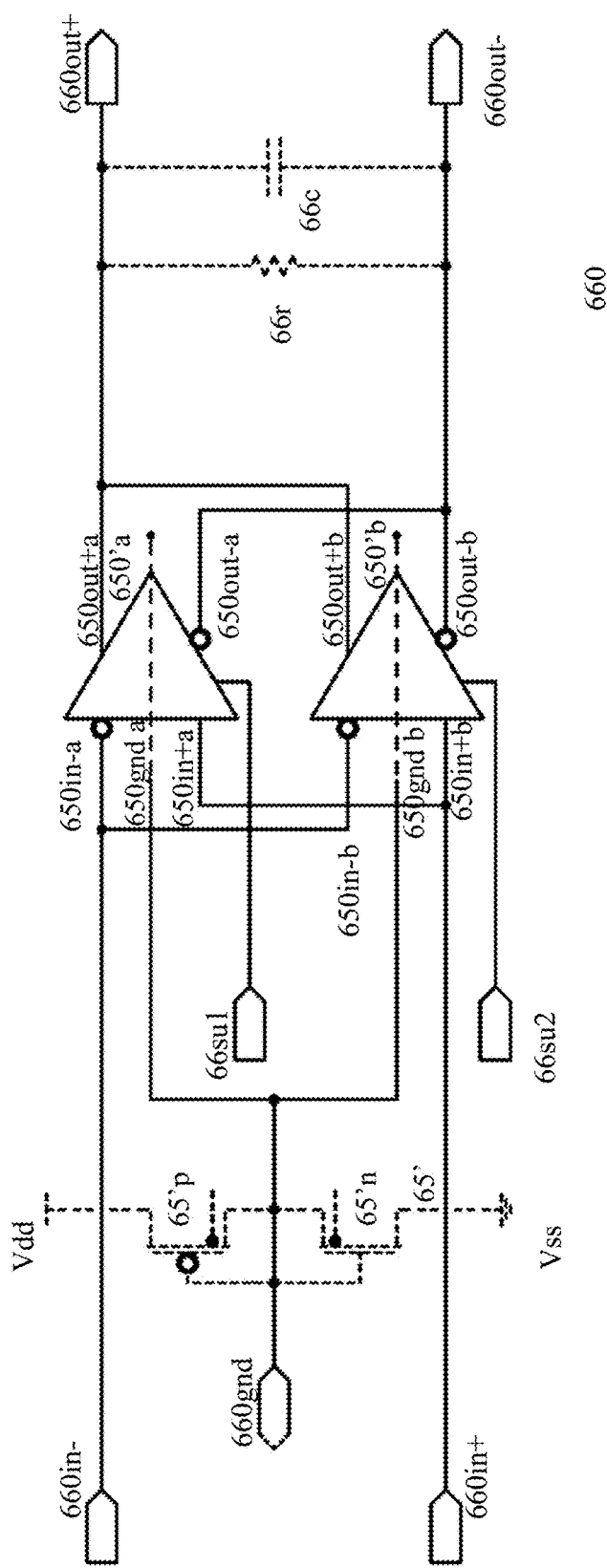
FIG. 6c shows a schematic diagram of another preferred embodiment of a continuous full-differential double-replica CiFET OpAmps of the present invention.
Figure 6D:
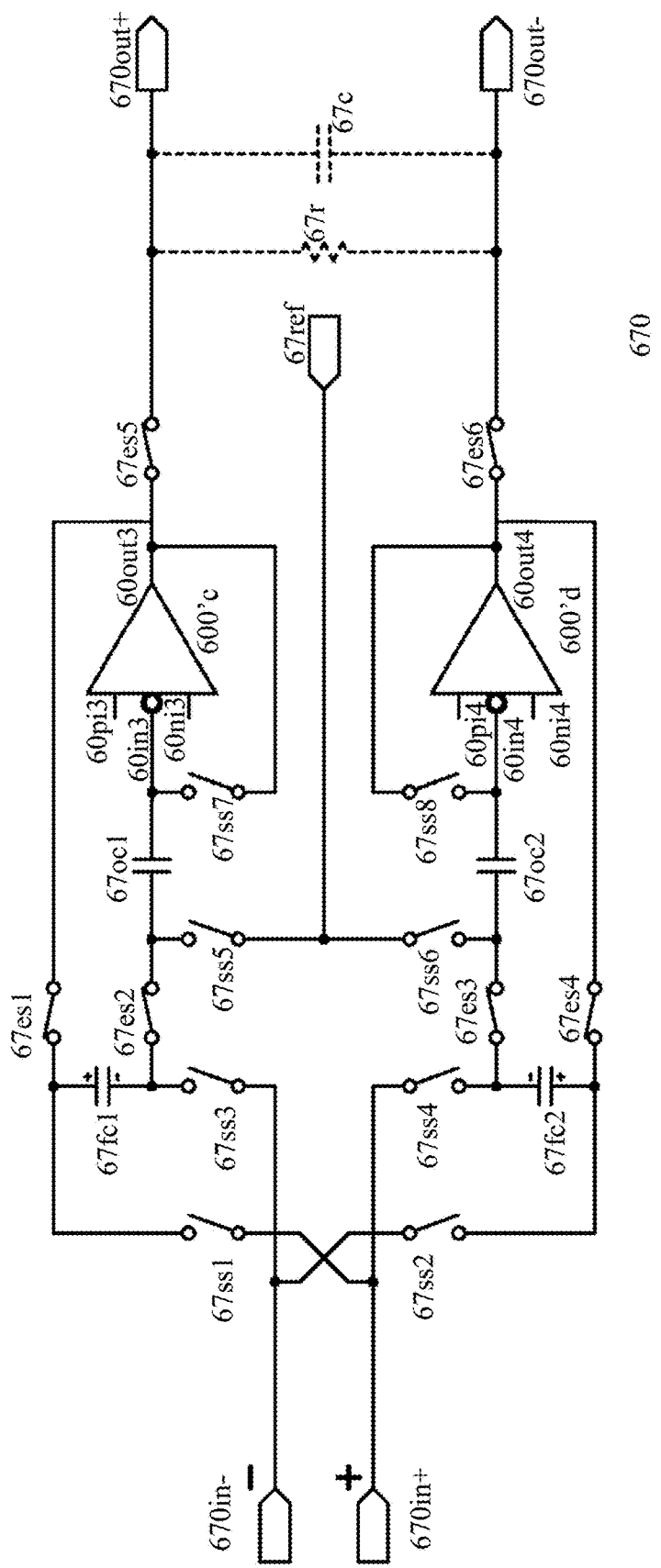
FIG. 6d shows a schematic diagram of a preferred embodiment of a precision 2× full-differential CiFET sample and hold replica OpAmp employing capacitive feedback of the present invention.
Figure 6F:
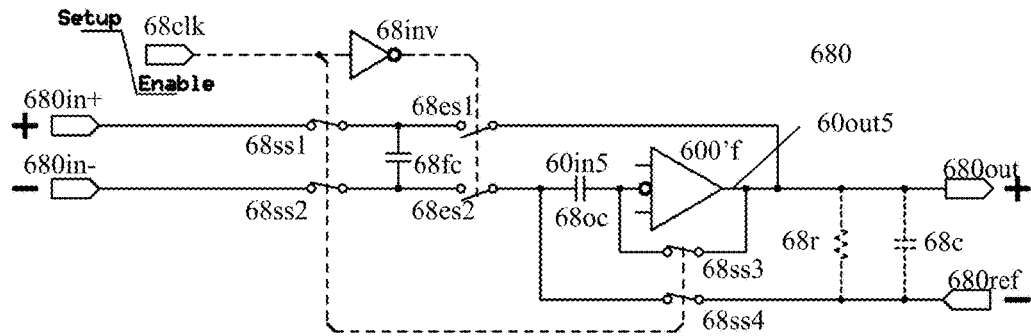
FIG. 6f shows a schematic diagram of a preferred embodiment of a sample and hold voltage amplifier using a CiAmp of the present invention.

FIG. 6f illustrates sample and hold using a CiAmp 600'f (similar to ones shown in FIGS. 4a, 6a(1) and 6a(2)) in its basic sampled data configuration. A sample clock, 68clk, controls this unity gain sample-and-hold circuit 680, repeatedly and continuously alternates between "setup" phase and "enable" phase, or such clock signal is inverted by a clock inverter 68inv, detailed in FIG. 6e(1), such that non-inverted clock signal provides control for "setup" switches 68ss1, 68ss2, 68ss3 and 68ss4 and inverted clock signal is used for controlling "enable" switches 68es1 and 68es2, as shown in FIG. 6f. Initially the cycle starts with the clock going high to close the "setup" switches 68ss1, 68ss2, 68ss3 and 68ss4, which connect, while open the "enable" switches 68es1 and 68es2:

1) the CiAmp 600'f output 680out+, back to its input of the CiAmp 600'f through the switch 68ss3, which is also connected to the $C_{offset}$ capacitor 68oc, causing the CiAmp 600'f to self-bias at its "sweet-spot" near ½ of the power supply voltage, 2) the other side of the $C_{offset}$ capacitor 68oc between this CiAmp's sweet-spot voltage and the output reference voltage, Ref_ $_{680}$ref, to store the difference between these voltages as a charge on $C_{offset}$ 68oc, and 3) the input voltage sampling capacitor (or flying capacitor) $C_{fly}$ 68fc, across the input 680in+ and 680in− to store the input voltage as a charge on $C_{fly}$ 68fc.

These capacitors $C_{offset}$ 68oc and $C_{fly}$ 68fc are small (in the 100 fF range) and can be made from interconnect metal separated by the normal oxide insulator between interconnect; thus their capacitance is not a function of voltage. Their absolute capacitance value is of little importance; in fact, capacitors $C_{offset}$ 68oc and $C_{fly}$ 68fc just have to be small enough to be charged quickly enough to settle to the desired accuracy, and these capacitors have to be large enough to absorb any switching charge imbalance and not decay significantly within the total clocking time period.

At the end of "setup" phase, the switches 68ss3 and 68ss4, which are associated with $C_{offset}$ 68oc, are turned OFF faster than the sample $C_{fly}$ capacitor switches 68ss1 and 68ss2. This preferred arrangement is to guarantee that the stored charge on $C_{offset}$ 68oc is presented with a high impedance to preserve its charge in the event that the CiAmp output 680out moves as it is released. Any latency in turning off $C_{fly}$ 68fc is just an insignificant delay in the sampling aperture time. The middle of this logic-quick turn OFF of setup defines the aperture time along with its width as the logic transition time near the middle of its voltage swing. Also note that the "input range" is valid up to a diode drop outside of the power supply rails in either direction.

"Enable" phase is a phase where the "enable" switches 68es1 and 68es2 connect the sample capacitor $C_{fly}$ 68fc in series with the $C_{offset}$ capacitor 68fc and place this voltage stack from Amp output 680out to its input 680in+. Here the sampled voltage over $C_{fly}$ capacitor 68fc is connected in series with voltage over the $C_{offset}$ 68fc, which corrects for the difference between the sweet-spot voltage and the output Ref_ voltage 680ref. The input 60in5 of the CiAmp 600'f will always return to its exact sweet-spot voltage when there is any feedback from its output 60out5 back to its input 60in5. There is precisely only one exact sweet-spot voltage as determined by operating threshold voltages of the stack of CiFET channels which pass the same current path through all channels in series. At the target steady-state voltage, there is no other path for this channel current to go except through all the channels in series. Passing this current requires each channel to re-acquire its operating threshold voltage. Because the gates of all the CiFET channels are tied together, the PiFET resistance must exactly equal the NiFET resistance for a sweet-spot balance, near ½ of the supply voltage. Any changes to the power supply are ratioed out of the balance equation to about 1 ppm in practice. This is the current mode dual of a differential pair in effect, but with a higher degree of accuracy ~limited to instantons changes in leakage current. The sweet-spot is the analog virtual ground.

The noise voltage is sampled out by the correlated-double-sampling scheme:

1) the instantaneous noise voltage of the CiAmp 600'f is tracked by the $C_{offset}$ capacitor 68oc during the "setup" phase of the clock 68clk,
2) along with the instantaneous input voltage between 680in+ and 680in− being tracked by $C_{fly}$ capacitor 68fc up to the bandwidth of the associated circuitry,
3) in the middle of the fall (or transition) time from "setup" to "enable" phase, defined as the sample aperture time, the instantaneous noise voltage and the instantaneous input voltage 680in+ to 680in− are stored on these two capacitors $C_{offset}$ 68oc and $C_{fly}$ 68fc, which throws out all the lower frequency noise power and offset drift of all previous time,
4) the noise voltage is active only during the "enable" phase period accumulating only its extreme high frequency energy of this time window, and
5) during this "enable" phase time window, an Analog to Digital Converter comparator, for example, may be enacted to make its binary decision.

Figure 6G:
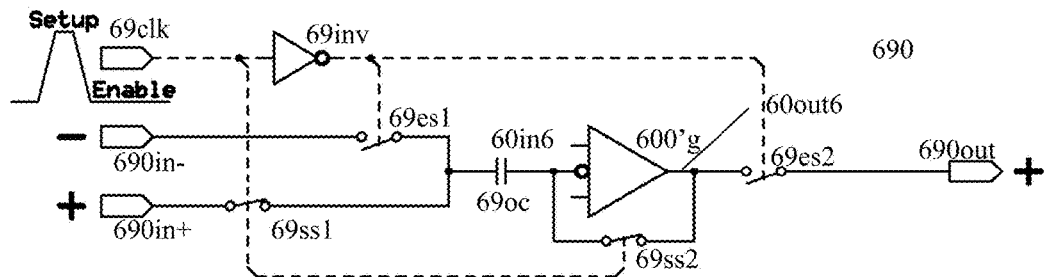
FIG. 6g shows a schematic diagram of another preferred embodiment of a correlated double sample offset and noise corrected OpAmp using a CiAmp of the present invention.
Figure 6H:
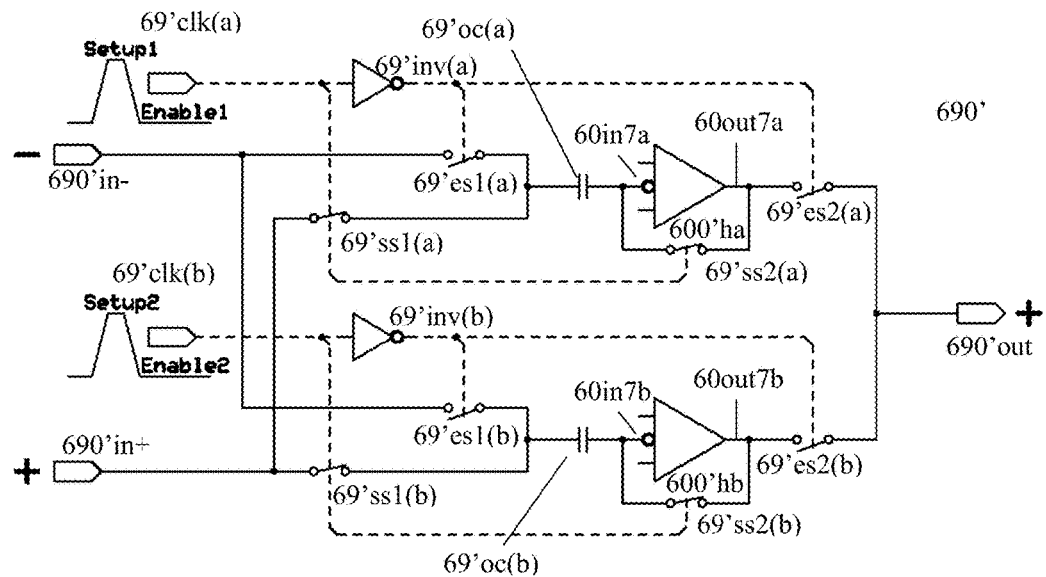
FIG. 6h shows a schematic diagram of a preferred embodiment of a correlated double sample offset and noise corrected operational amplifier with a continuous output using a replica CiAmp of the present invention.

FIG. 6g illustrates yet another correlated sampling 690 using a CiAmp 600'g (similar to ones shown in FIGS. 4a, 6a(1) and 6a(2)) in its basic noise, drift, and offset corrected configuration. The circuit 690 includes inputs 690in+, 690in−, output 690out, and control signal or clock 69'clk. The output can be referenced to either input as a virtual ground which is conventional practice in operational amplifier applications. The clock 69'clk pulses "setup" repeatedly and continuously at, preferably, about a 1 kHz repetition rate during its operation, including a clock inverter 68inv for inverting the clock signal 68clk whereby non-inverted clock signal 68clk is used for controlling "setup" switches 69ss1, 69ss2, while inverted clock signal would be used for controlling "enable" switches 69es1, 69es2. A capacitor 69oc is connected in series with the input port of the CiAmp 600'g. In operation, during "setup" phase, it causes the output 60out6 of the CiAmp 600'g be connected to its input 60in6 to be self-biased, and positive input terminal 690in+ be connected to the other terminal of the capacitor 69oc. At "enabling" phase, "enable" switch 69es1 connects negative input 690in− to the capacitor 69oc, and the output 60out6 of the CiAmp 600'g be connected to the output terminal 690out. Optionally, the circuit 690 can be rearranged for noninverting OpAmp applications by interchanging the input switches 69es1 and 69ss1 switch control logic between the 69clk and 69inv phases without changing the other amplifier switch 69ss2 and 69es2 control logic. FIG. 6h shows a schematic diagram of another preferred embodiment of a sample and hold amplifier 690' of the present invention. The amplifier 690' comprises two sample and hold amplifiers similar to that shown as the amplifier 690 shown in FIG. 6g connected in parallel to correct for parametric variation errors, and provides continuous output at its output terminal 690'out. The amplifier 690 includes negative and positive voltage input terminals 690'in− and 690'in+, respectively, output terminal 690'out, first narrow pulsed clock 69'clk(a) and second narrow pulsed clock 69'clk(b) (there is 180 degree phase difference between the first and second narrow pulsed clocks 69'clk(a) and 69'clk(b)), and first and second CiAmps 600'ha and 600'hb (similar to ones shown in FIGS. 4a, 6a(1) and 6a(2)), respectively. The amplifier 690' further includes two offset capacitors 69'oc(a) and 69'oc(b) and a plurality of switches, including "setup" switches 69'ss1(a), 69'ss2(a), 69'ss1(b), 69'ss2(b) which connects during "setup" phase of the clock 69'clk(a) or 69'clk(b), and "enable" switches 69'es1(a), 69'es2(a), 69'es1(b), 69'es2(b) which connects during "enable" phase of the clock 69'clk(a) or 69'clk(b). The amplifier 690' further includes clock inverters 69'inv(a), 69'inv(b) for inverting clock signals. Input terminal 60in7a of the CiAmp 600'ha is connected to a second one of the terminals of the first offset capacitor 69'oc(a), input terminal 60in7b of the CiAmp 600'hb to a second one of the terminals of the second offset capacitor 69'oc(b). The first clock 69'clk(a) for configuring connections around the first CiAmp 600'ha, and the second clock 69'clk(b) for the second CiAmp 600'hb. During the "setup" phase of the clock 69'clk(a)/69'clk(b), "setup" switches 69'ss1(a), 69'ss2(a), 69'ss1(b), 69'ss2(b) and "enable" switches 69'es1(a), 69'es2(a), 69'es1

(b), 69'es2(b) cause to connect the positive voltage input terminal 690'in+ to a first terminal of the offset capacitor 69'oc(a)/69'oc(b), and further cause the CiAmp 600'ha/600'hb to be self-biased by connecting the output 60out7a/60out7b to the input 60in7a/60in7b of the CiAmp 600'ha/600'hb, respectively. During the "enable" phase of the clock 69'clk(a)/69'clk(b), "setup" switches 69'ss1(a), 69'ss2(a), 69'ss1(b), 69'ss2(b) and "enable" switches 69'es1(a), 69'es2(a), 69'es1(b), 69'es2(b) cause to connect the negative voltage input terminal 690'in− to the first terminal of the offset capacitor 69'oc(a)/69'oc(b), and further cause the output 60out7a/60out7b of the CiAmp 600'ha/600'hb to be connected to the output terminal 690'out of the amplifier 690'. Since the narrow pulsed clocks 69'clk(a) and 69'clk(b) are 180 degrees different in their phase, calibration time pulse width disconnection from the output from the CiAmps 600'ha and 600'hb alternates for the output terminal 690'out. With the exception of either calibration pulse width time 69'clk(a), 69'clk(b), the two CiFET amplifiers 600'ha and 600'hb outputs 60out7a, 60out7b are connected together by 69'es2(a), 69'es2(b) to drive the output 690'out always leaving the output driven with at least one low impedance CiFET amplifier output.

Figure 6I:
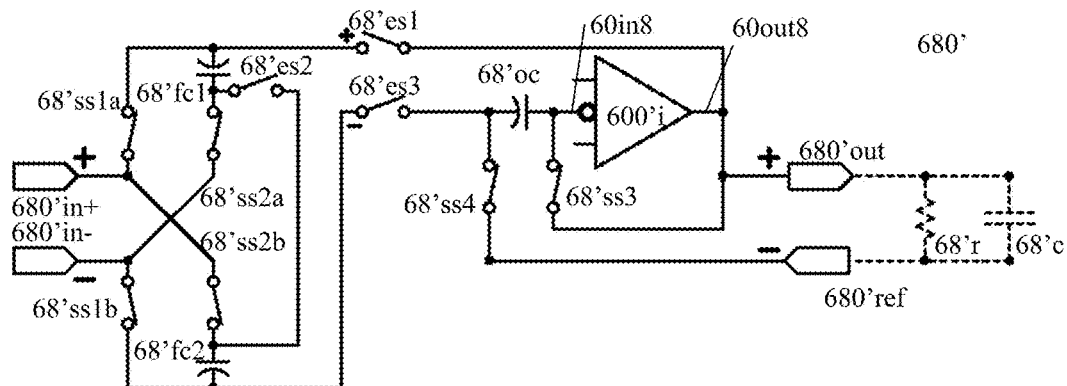
FIG. 6i shows a schematic diagram of a preferred embodiment of a compact 2× sample and hold amplifier with half-scale voltage subtraction capability using a CiAmp of the present invention.

FIG. 6i is a schematic diagram of yet another preferred embodiment of a sample and hold amplifier (2× gain) 680', which is structurally similar to that shown in FIG. 6f. The amplifier 680' comprises one CiAmp 600'i (similar to ones shown in FIGS. 4a, 6a(1) and 6a(2)), having positive and negative voltage input terminals 680'in+ and 680'in−, positive and negative output terminals 680'out+, reference 680'ref, first and second flying capacitors 68'fc1, 68'fc2, and an offset capacitor 68'oc. A second terminal of the offset capacitor 68'oc is connected to the input 60in8 of the CiAmp 600'i. The amplifier 680' further includes a plurality of switches, including "setup" switches 68'ss1a, 68'ss2a, 68'ss1b, 68'ss2b, 68'ss3, and 68'ss4, and "enable" switches 68'es1, 68'es2, and 68'es3, which are operable based on a control clock/signal which alternates "setup" and "enable" phases repeatedly. During the "setup" phase of the clock, "setup" switches 68'ss1a, 68'ss2a, 68'ss1b, 68'ss2b, 68'ss3, and 68'ss4, and "enable" switches 68'es1, 68'es2, and 68'es3 cause to connect first terminals of the flying capacitors 68'fc1 and 68'fc2 to the positive voltage input terminal 680'in+, and second terminals of the flying capacitors 68'fc1 and 68'fc2 to the negative voltage input terminal 680'in− (thus the flying capacitors 68'fc1 and 68'fc2 are connected in parallel), cause the CiAmp 600'i to be self-biased by connecting the output 60out8 of the CiAmp 600'i to the input 60in8 of the CiAmp 600'i, and further cause to connect the reference 680'ref to the first terminal of the offset capacitor 68'oc. During "enable phase" of the clock 68'clk, "setup" switches 68'ss1a, 68'ss2a, 68'ss1b, 68'ss2b, 68'ss3, and 68'ss4, and "enable" switches 68'es1, 68'es2, and 68'es3 cause the flying capacitors 68'fc1 and 68'fc2 to be connected in series with each other and with the offset capacitor 68'oc and to form a capacitive feedback from the output 60out8 to the input 60in8 of the CiAmp 600'i. Effectively, the amplifier 680' provides 2 times gain. Optionally, the amplifier output 680'out can drive a load resistance 68'r and/or a load capacitance 68'c which is normally incurred between output 680'out and output reference 680'ref.

FIG. 6b shows a schematic diagram of a preferred embodiment of a full-differential CiFET amplifier 650 of the present invention, which may be generally suited for very high precision, fast, full-differential OpAmp applications. The CiFET amplifier 650 comprises two multistage amplifiers 600'a and 600'b (similar to ones shown in FIGS. 4a, 6a(1) and 6a(2)), and takes differential input, negative input 650in− and positive input 650in+, analog ground 650gnd, and outputs differential outputs, positive output 650out+ and negative output 650out−. As it can be seen, offset capacitors 65c1 and 65c2 and switches 65es1, 65es2, 65ss1, 65ss2, 65ss3, 65ss4, 65es3 and 65es4 are strategically placed about the multistage amplifiers 600'a and 600'b. These switches 65es1, 65es2, 65ss1, 65ss2, 65ss3, 65ss4, 65es3 and 65es4 are controlled by a control signal (not shown but illustrated in FIG. 6e(1)), which provides "setup" phase and "enable" phase, controlling switches. During "setup" phase of the control signal, switches 65ss1, 65ss2, 65ss3, and 65ss4 pass through while switches 65es1, 65es2, 65es3 and 65es4 disconnect; during "enable" phase, switches 65es1, 65es2, 65es3 and 65es4 passes through, while switches 65ss1, 65ss2, 65ss3, and 65ss4 disconnects. This allows charging and discharging to the offset capacitors 65c1 and 65c2, and feedback from the output of the multistage amp 600'a and 600'b to its input during "setup" phase of the control signal. In particular, during "setup" phase of the control signal, the switches cause the offset capacitor(s) 65c1, 65c2 to be connected with analog ground 650gnd and input 60in1, 60in1 of the multistage amplifiers 600'a, 600'b, respectively, when the multistage amplifiers 600'a, 600'b establish a feedback connection from its output 60out1, 60out2 to the input 60in1, 60in1. During the "enable" phase of the control signal, input 650in−, 650in+ are connected in series with the offset capacitor 65c1, 65c2 and input 60in1, 60in2 of the multistage amplifiers 600'a, 600'b, and the output 60out1 60out2 of the multistage amplifiers 600'a, 600'b are connected to the output 650out+, 650out−, respectively, of the CiFET amplifier 650. In a preferred embodiment of the present invention, the full-differential CiFET amplifier 650 may optionally have a pair 65 of PiFET 65p and NiFET 65n as an optional analog ground generator. The pair 65 is connected to positive power supply 65vdd, negative power supply 65vss, and takes an analog ground as input, and its output provides analog ground reference for the amplifier 650. In particular, the analog ground 650gnd is connected to switches 65ss1 and 65ss2, causing the offset capacitors 65c1 and 65c2 to connect to analog ground during "setup" phase of the control signal. In further preferred embodiment of the present invention, load resistance 65r for resistively loading, and/or capacitance 65c for capacitively loading differential output 650out+ and 650out−.

FIG. 6c shows a schematic diagram of another preferred embodiment of a continuous high-frequency, full-differential CiFET OpAmp 660 of the present invention, including differential input 660in− and 660in+, differential output 660out+ and 660out−. The amplifier 660 has two CiAmplifiers 650'a and 650'b as shown in FIG. 6b. A first control signal (not shown), having "setup" and "enable" phases is provided to the CiAmplifier 650'a and a second control signal (not shown), having "setup" and "enable" phases is provided to the CiAmplifier 650'b through control terminals 66su1 and 66su2, respectively, for controlling configurations of CiAmplifiers 650'a, 650'b as previously described. It is to be noted that, to provide continuous output therefrom, the first control signal is out of phase from the second phase such that, when the first CiAmplifier 650'a is off-line a short time for calibration, the second CiAmplifier 650'b is on-line, and when the first CiAmplifier 650'a is on-line, the second CiAmplifier 650'b is off-line a short time for its calibration. Negative input 660in− is coupled to negative inputs 650in−a and 650in−b of the CiAmplifiers 650'a and 650'b; while positive input 660in+ is coupled to positive inputs 650in+a and 650in+b. Negative outputs 650out−a and 650out−b from CiAmplifiers 650'a and 650'b, respectively, are joined together to form negative output 660out−; while positive outputs 650out+a and 650out+b from CiAmplifiers 650'a and 650'b, respectively, forms positive output 660out+. In a preferred embodiment of the present invention, the full-differential CiFET OpAmp 660 may optionally have a pair 65' of PiFET 65'p and NiFET 65'n as an optional analog ground generator. The pair 65' is connected to positive power supply Vdd, negative power supply Vss, and takes an analog ground as input, and its output provides analog ground reference for the amplifier 660. In particular, the analog ground 660gnd is connected ground inputs 650gnd−a and 650gnd−b of CiFET amplifiers 650'a and 650'b. In further preferred embodiment of the present invention, load resistance 66r represent resistive loads, and/or capacitance 66c for capacitive loads are coupled to differential output 660out+ and 660out−.

FIG. 6d shows a schematic diagram of a preferred embodiment of a precision 2× full-differential CiFET OpAmp employing capacitive feedback of the present invention, suited for precision ADC/DAC applications, which has capability of half scale subtraction/addition without any precision parts. In this configuration of the amplifier 670, a couple of multistage amplifiers 600'c and 600'd (similar to ones shown in FIGS. 4a, 6a(1) and 6a(2)) are coupled with strategically placed flying capacitors 67fc1 and 67fc2, offset capacitors 67oc1 and 67oc2, switches controlled by a control signal, including switches that pass through during "setup" phase of the control signal, 67ss1, 67ss2, 67ss3, 67ss4, 67ss5, 67ss6, 67ss7 and 67ss8, and switches that passes through during "enable" phase of the control signal, 67es1, 67es2, 67es3, 67es4, 67es5 and 67es6. The OpAmp 670 receives full-floating differential input 670in− and 670in+, output reference 67ref, and provides differential output 670out+ and 670out−. During "setup" phase of the control signal, terminals of each of the flying capacitors 67fc1 and 67fc2 are connected the differential inputs 670in− and 670in+ to charge them to the exact same voltage in parallel, and terminals of each of the offset capacitors 67oc1 and 67oc2 are connected to the output reference 67ref and input of the corresponding multistage amplifier 600'c, 600'd, respectively, when the feedback from the output thereof is established by switches 67ss7 and 67ss8. During "enable" phase of the control signal, the OpAmp 670 forms a capacitive feedback between output 60out3, 60out4 and input 60in3, 60in4 of the multistage amplifiers 600'c and 600'd through the flying capacitors, 67fc1, 67fc2 and the offset capacitors 67oc1, 67oc2, respectively.

Half-scale ADC voltages can be accurately subtracted from the precision 2× voltage multiplication effected by the series combination of 67fc1 and 67fc2 during enable phase of operation by setting 67ref voltage to a reference voltage (not shown) during setup phase for charging offset capacitors 67oc1 and 67oc2 during the setup phase of operation, and then switching 67ref terminal to the neutral side of a reference voltage (not shown).

In another preferred embodiment of the present invention, load resistance 67r for resistively loading, and/or capacitance 67c for capacitively loading differential output 670out+ and 670out−.

FIG. 6e(1) shows a preferred exemplary embodiment of control logic U60e for providing a control signal to the switches in the amplifiers shown in FIGS. 6b, 6c, and 6d. For example, clock, CLK, which has "setup" and "enable" phases, is received by an invertor U6e1, and supplied to AND logic D1, D2 through a buffer U6ee2, U6es2. Respectively, in order for the clock signal to break before making delays. For Setup side, the clock signal is inverted by an inverter U6es1. Such processed clocks are further provided to alignment blocks AL1, including buffer U6ee5 and inverters U6ee4, U6ee6 and U6ee7, and AL2, including buffer U6es5 and inverters U6es4, U6es6 and U6es7, for providing course and fine alignment prior to transmitting clocks to switches SWa1 and SWa2 (which may be activated to pass through during "enable" phase of the control clock, SWb1 and SWb2 (activated to pass through during "setup" phase thereof). FIG. 6e(2) shows a symbole diagram of the control logic U60e, for generating setup signal SU60e and enable signal EE60e.

Figure 6J:
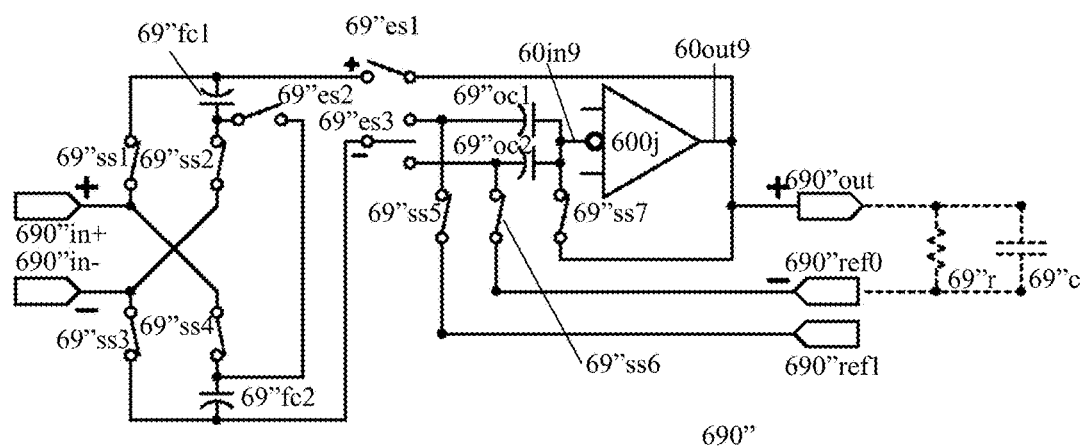
FIG. 6j shows a schematic diagram of a preferred embodiment of a one-bit slice of a compact analog to digital converter (ADC) using a CiAmp with 2× gain including half-scale voltage subtraction capability of the present invention.

FIG. 6j shows a schematic diagram of a preferred embodiment of an analog signal path bit-slice for an analog to digital converter (ADC) using a CiAmp with 2× gain including subtraction capability of the present invention. The circuit 690" is a similar circuit to one shown in FIG. 6i. In particular, the circuit 690" comprises a CiAmp 600j (similar to ones shown in FIGS. 4a, 6a(1) and 6a(2)), negative voltage input 690"in−, positive voltage input 690"in+, a first midscale reference (or analog ground) 690"ref0, second reference 690"ref1, and output 690"out. In a preferred embodiment of the present invention, potential or voltage level of the first midpoint reference 690"ref0 is normally analog ground that the output signal swings about and the second lower reference 690"ref1 is the ADC half-scale quantizing voltage. The circuit 690" further includes a plurality of switches, including "setup" switches 69"ss1, 69"ss2, 69"ss3, 69"ss4, 69"ss5, 69"ss6, and 69"ss7, which close during "setup" phase of a clock (not shown); and "enable" switches 69"es1, 69"es2, and 69"es3, which close during "enable" phase of the clock. The clock alternates "setup" and "enable" phases repeatedly for each input it quantizes. As opposed to FIG. 6i, the circuit 690" yet further comprises first and second offset capacitors, 69"oc1, and 69"oc2, Each of the offset capacitors, 69"oc1, and 69"oc2, have first and second terminals, and the second terminal of each of the offset capacitors 69"oc1, and 69"oc2 are connected to the input 60in9 of the CiAmp 600j. The circuit 690" further comprises first and second flying capacitors 69"fc1, and 69"fc2, both of which have first and second terminals. As similar manner as described for FIG. 6i, during "setup" phase of the clock, "setup", the switches causes the first terminal of the flying capacitors 69"fc1, 69"fc2 to be connected to the positive input 690in+ and the second terminals of the flying capacitors 69"fc1, 69"fc2 to be connected to the negative voltage input 690"in−; and causing the CiAmp 600j to be self-biased by connecting output 60out9 to input 60in9 thereof.

During "enable" phase of the clock, the plurality of switches cause the output 60out9 to capacitively connect to the input 60in9 of the CiAmp 600j, by connecting the flying capacitors 69"fc1 and 69"fc2 and offset capacitor 69"oc1 or 69"oc2 in series (i.e. the first connector of the first flying capacitor 69"oc1 is connected to the output 60out9 of the CiAmp 600j, the second terminal of the first flying capacitor 69"fc1 to the first terminal of the second flying capacitor 69"fc2, then the second terminal of the second flying capacitor 69"fc2 is connected to the first terminal of either the first offset capacitor 69"oc1 or the second offset capacitor 69"oc2 through the "enable" switch 69"es3. In this regard, the switch 69"es3 is preferably a two-way switch, such that, depending on the value of the positive voltage input 690"in+ being below or above the midscale reference 690"ref0, the switch 69"es3 selectively causes to connect the second terminal of the second flying capacitor 69"fc2 to the first terminal of either the first offset capacitor 69"*oc*1 or the second offset capacitor 69"*oc*2. When input 690"*in*+ voltage is above half-scale reference 690"*ref*0 voltage, switch 69"*es*3 causes second terminal of second flying capacitor 69"*fc*2 to connect to first terminal of first offset capacitor 69"*oc*1, and for positive voltage input 690"*in*+ below mid-scale reference 690"*ref*0, switch 69"*es*3 causes second terminal of second flying capacitor 69"*fc*2 to connect to first terminal of the other offset capacitor 69"*oc*2. Further quantizing resolution may be attained, for example, by varying flying capacitor voltage references. Furthermore, by increasing the number of offset capacitors and reference terminals using different switching device or switching/connecting structure with the switch 69"*es*3 positions, a further number of reference levels may be accommodated in accordance with the present invention.

Optionally, the output 690"*out* may be resistively and/or capacitively loaded to the first reference 690"*ref*0 through a resister 69"*r* and/or a capacitor 69"*c*.

Figure 6K:
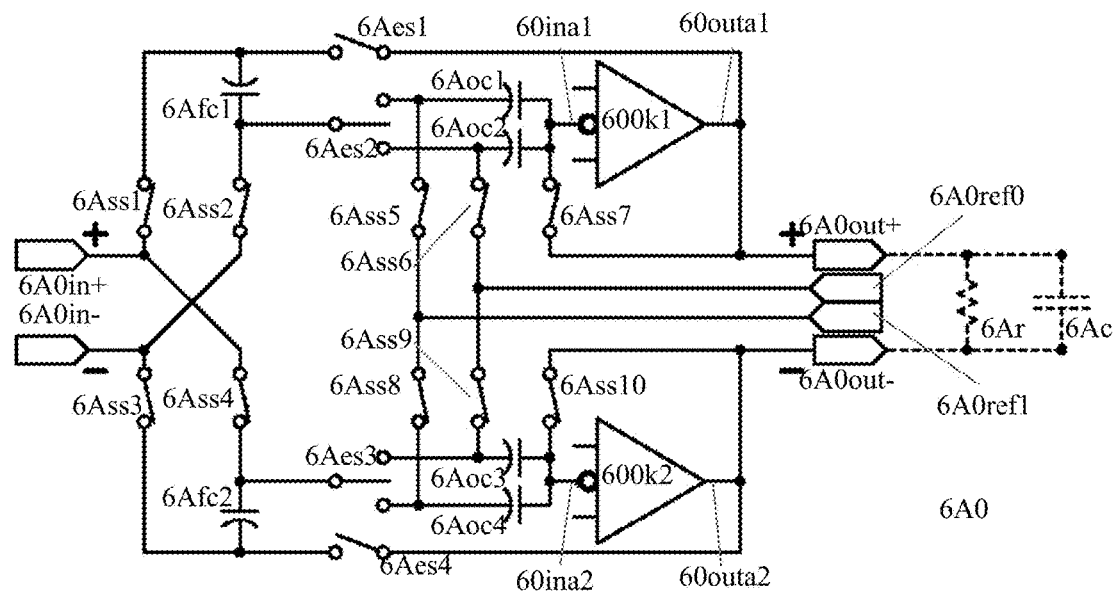
FIG. 6k shows a schematic diagram of a preferred embodiment of a one-bit slice of a high precision full-differential analog to digital converter (ADC) using replica CiAmps, with 2× gain including half-scale voltage addition capability of the present invention.

FIG. 6*k* shows a schematic diagram of a preferred embodiment of a one-bit slice of a high precision analog to digital converter (ADC) using replica CiAmps, with 2× gain including fixed voltage subtraction capability of the present invention. The circuit 6A0 includes two CiAmps including a first CiAmp 600*k*1 and a second CiAmp 600*k*2 (similar to ones shown in FIGS. 4*a*, 6*a*(1) and 6*a*(2)), positive voltage input 6A0*in*+, negative voltage input 6A0*in*−, a first reference (or analog ground) 6A0*ref*0, second reference 6A0*ref*1, positive voltage output 6A0*out*+ and negative voltage output 6A0*out*−. The circuit 6A0 further includes a first flying capacitor 6Afc1, two offset capacitors including a first offset capacitor 6Aoc1 and a second offset capacitor 6Aoc2 for the first CiAmp 600*k*1; and a second flying capacitor 6Afc2, and another two offset capacitors including a third offset capacitor 6Aoc3 and a fourth offset capacitor 6Aoc4 for the second CiAmp 600*k*2. Each of the capacitors has a first and second terminal. The second terminals of the first and second offset capacitors 6Aoc1 and 6Aoc2 are connected to the input of the first CiAmp 600*k*1, and the second terminals of the third and fourth offset capacitors 6Aoc3 and 6Aoc4 are connected to the input of the second CiAmp 600*k*2. The circuit 6A0 further includes a plurality of switches which are operable with a control signal/clock that alternates "setup" and "enable" phases repeatedly, including "setup" switches 6Ass1, 6Ass2, 6Ass3, 6Ass4, 6Ass5, 6Ass6, 6Ass7, 6Ass8, 6Ass9, and 6Ass10, which close during "setup" phase of the control clock; and "enable" switches 6Aes1, 6Aes2, 6Aes3, and 6Aes4, which close during "enable" phase of the control clock.

During "setup" phase of the control clock, the plurality of switches 6Ass1, 6Ass2, 6Ass3, 6Ass4, 6Ass5, 6Ass6, 6Ass7, 6Ass8, 6Ass9, and 6Ass10 and 6Aes1, 6Aes2, 6Aes3, and 6Aes4, cause to connect the positive voltage input 6A0*in*+ to the first terminals of the flying capacitors 6Afc11 and 6Afc2, and the negative voltage input 6A0*in*− to the second terminals of the flying capacitors 6Afc1 and 6Afc2. They further cause the first and second CiAmps 600*k*1, 600*k*2 to be self-biased by feeding back the output 60*outa*1 to the input 60*ina*1 of the first CiAmp 600*k*1, and the output 60*outa*2 to the input 60*ina*2 of the second CiAmp 600*k*2. They yet further cause the first reference 6A0*ref*0 to connect to the second and third offset capacitors 6Aoc2 and 6Aoc3; and the second reference 6A0*ref*1 to connect to the first and fourth offset capacitors 6Aoc1 and 6Aoc4.

During "enable" phase of the control clock, the plurality of switches 6Ass1, 6Ass2, 6Ass3, 6Ass4, 6Ass5, 6Ass6, 6Ass7, 6Ass8, 6Ass9, and 6Ass10 and 6Aes1, 6Aes2, 6Aes3, and 6Aes4 cause to capacitively connect the output 60*outa*1 to the input 60*ina*1 by connecting the first flying capacitor 6Afc1 and the first offset capacitor 6Aoc1 or second offset capacitor 6Aoc2 in series; and capacitively connect the output 60*outa*2 to the input 60*ina*2 by connecting the second flying capacitor 6Afc2 and the third offset capacitor 6Aoc3 or fourth offset capacitor 6Aoc4 in series. In this regard, some of the enable switches, namely 6Aes2 and 6Aes3 are two-way switches, to selectively connect the second terminal of the first flying capacitor 6Afc1/6Afc2 to either the first terminal of the first/fourth offset capacitor 6Aoc1/6Aoc4 or the first terminal of the second/third offset capacitor 6Aoc2/6Aoc3.

In a further preferred embodiment of the present invention, voltage/potential of the second reference 6A0*ref*1 is lower than that of the first midpoint reference 6A0*ref*0 which is the analog ground that the output normally signal swings about, and the two-switches 6Aes2 and 6Aes3 are further controlled based on comparison of the positive input voltage 6A0*in*+ with the first reference 6A0*ref*0, for determining their selections. For example, where the positive voltage input 6A0*in*+ is greater than or equal to the first reference 6A0*ref*0, such condition causes the switch 6Aes2 to connect the second terminal of the first flying capacitor 6Afc1 to the first terminal of the first offset capacitor 6Aoc1; and the switch 6Aes3 to connect the second terminal of the second flying capacitor 6Afc1 to the first terminal of the fourth offset capacitor 6Aoc4; when the positive voltage input 6A0*in*+ is lower than the first reference 6A0*ref*0, such a condition would cause the the switch 6Aes2 to connect the second terminal of the first flying capacitor 6Afc1 to the first terminal of the second offset capacitor 6Aoc2; and the switch 6Aes3 to connect the second terminal of the second flying capacitor 6Afc1 to the first terminal of the third offset capacitor 6Aoc3. Optionally, the positive and negative voltage outputs 6A0*out*+ and 6A0*out*− may be resistively and/or capacitively coupled to each other through a load resister 6Ar and/or a load capacitor 6Ac.

Figure 6M:
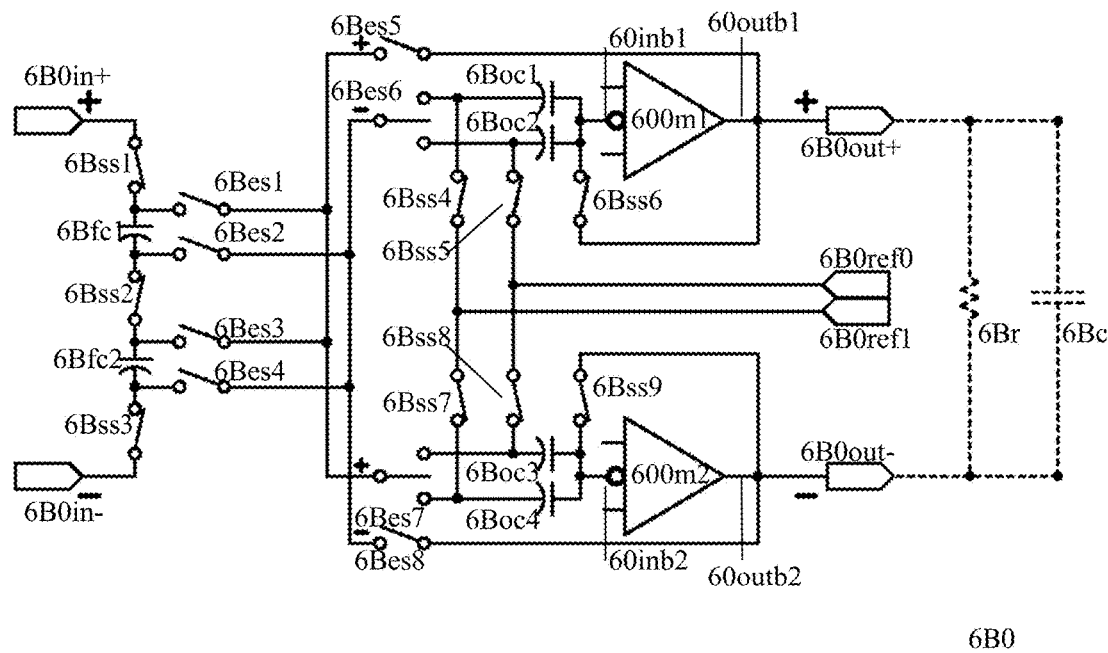
FIG. 6m shows a schematic diagram of a preferred embodiment of a one-bit slice of a high precision full-differential digital to analog converter (DAC) (with ½ gain) including half-scale voltage addition capability using replica CiAmps in accordance with the present invention.
Figure 6N:
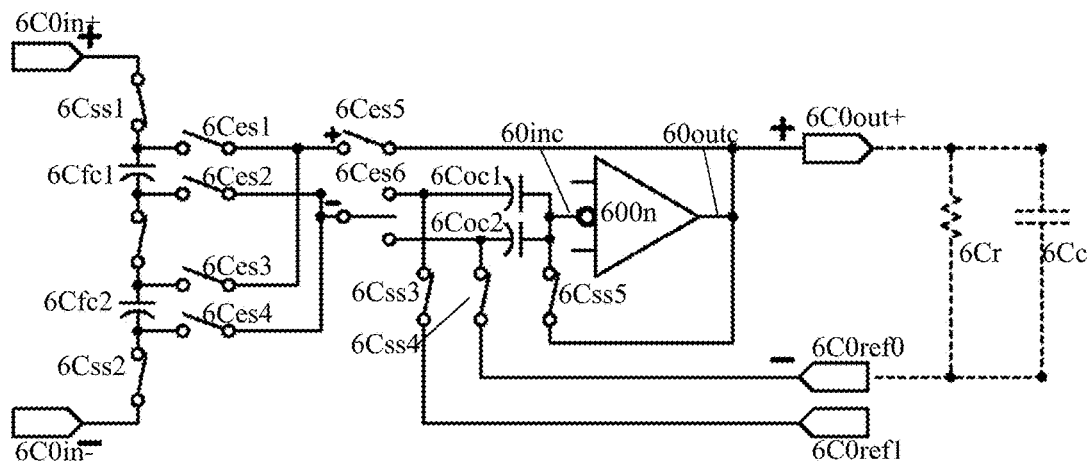
FIG. 6n shows a schematic diagram of a preferred embodiment of a one-bit slice of a compact DAC (with ½ gain) including half-scale voltage addition capability using a CiAmp in accordance with the present invention.

FIG. 6*m* shows a schematic diagram of a preferred embodiment of a bit slice of a full-differential digital to analog converter (DAC) (with ½ gain) including voltage addition capability using a sample and hold amplifier in accordance with the present invention. The circuit 6B0 includes two CiAmps, a first CiAmp 600*m*1 and a second CiAmp 600*m*2, (similar to ones shown in FIGS. 4*a*, 6*a*(1) and 6*a*(2)), positive voltage input 6B0*in*+, negative voltage input 6B0*in*−, a first reference (or analog ground) 6B0*ref*0, second reference 6B0*ref*1, positive voltage output 6B0*out*+ and negative voltage output 6B0*out*−. The circuit 6B0 further comprises two flying capacitors, a first flying capacitor 6Bfc1 and a second flying capacitor 6Bfc2, and offset capacitors, a first offset capacitor 6Boc1, a second offset capacitor 6Boc2, a third offset capacitor 6Boc3, and a fourth offset capacitor 6Boc4. Each of the capacitors has a first terminal and a second terminal. The second terminals of the first and second offset capacitors 6Boc1 and 6Boc2 are connected to the input 60*inb*1 of the first CiAmp 600*m*1, and the second terminals of the third and fourth offset capacitors 6Boc3 and 6Boc4 are connected to the input 60*inb*2 of the second CiAmp 600*m*2. The circuit 6B0 further includes a plurality of switches which are operable with a control signal/clock that alternates "setup" and "enable" phases repeatedly, including "setup" switches 6Bss1, 6Bss2, 6Bss3, 6Bss4, 6Bss5, 6Bss6, 6Bss7, 6Bss8, and 6Bss9, which close during "setup" phase of the control clock; and "enable"

switches 6Bes1, 6Bes2, 6Bes3, 6Bes4, 6Bes5, 6Bes6, 6Bes7, and 6Bes8, which close during "enable" phase of the control clock.

During "setup" phase of the control clock, the plurality of switches 6Bss1, 6Bss2, 6Bss3, 6Bss4, 6Bss5, 6Bss6, 6Bss7, 6Bss8, and 6Bss9 and 6Bes1, 6Bes2, 6Bes3, 6Bes4, 6Bes5, 6Bes6, 6Bes7, and 6Bes8, cause to connect the first and second flying capacitors 6Bfc1 and 6Bfc2 in series with the positive voltage input 6B0$in+$ and the negative voltage input 6B0$in-$ (thus, each of the flying capacitors 6Bfc1 and 6Bfc2 would be charged with half of the differential voltage between the positive voltage input 6B0$in+$ and the negative voltage input 6B0$in$). They further cause the first and second CiAmps 600$m$1, 600$m$2 to be self-biased by feeding back the output 60$outb$1 to the input 60$inb$1 of the first CiAmp 600$m$1, and the output 60$outb$2 to the input 60$inb$2 of the second CiAmp 600$m$2. They yet further cause the first reference 6B0$ref$0 to connect to the second and third offset capacitors 6Boc2 and 6Boc3; and the second reference 6B0$ref$1 to connect to the first and fourth offset capacitors 6Boc1 and 6Boc4.

During "enable" phase of the control clock, the plurality of switches 6Bss1, 6Bss2, 6Bss3, 6Bss4, 6Bss5, 6Bss6, 6Bss7, 6Bss8, and 6Bss9 and 6Bes1, 6Bes2, 6Bes3, 6Bes4, 6Bes5, 6Bes6, 6Bes7, and 6Bes8 cause capacitively connection from the output 60$outb$1 to the input 60$inb$1 by connecting the first flying capacitor 6Bfc1 and the first offset capacitor 6Boc1 or second offset capacitor 6Boc2 in series; and capacitively connecting the output 60$outb$2 to the input 60$inb$2 by connecting the second flying capacitor 6Bfc2 and the third offset capacitor 6Boc3 or fourth offset capacitor 6Boc4 in series. In this regard, some of the enable switches, namely 6Bes6 and 6Bes7 are two-way switches, selectively connect the second terminal of the first flying capacitor 6Bfc1/6Bfc2 to either the first terminal of the first/fourth offset capacitor 6Boc1/6Boc4 or the first terminal of the second/third offset capacitor 6Boc2/6Boc3. In further preferred embodiment of the present invention, such selection by the two-way switches 6Bes6 and 6Bes7 may be made based on a bit value of a binary input number, i.e. "0" or "1". For example, the two-way switches 6Bes6 and 6Bes7 connect to the second and third offset capacitors 6Boc2 and 6Boc3 when the bit value is "0"; while the two-way switches 6Bes6 and 6Bes7 connect to the first and fourth offset capacitor 6Boc1 and 6Boc4 when the bit value is "1".

Optionally, the positive and negative voltage outputs 6B0$out+$ and 6B0$out-$ may be resistively and/or capacitively coupled each other through a resister 6Br and/or a capacitor 6Bc.

FIG. 6$n$ shows a schematic diagram of a preferred embodiment of a bit slice of a compact DAC (with ½ gain) including voltage addition capability using a sample and hold amplifier in accordance with the present invention.

The circuit 6C0 includes a CiAmps 600$n$, (similar to ones shown in FIGS. 4$a$, 6$a$(1) and 6$a$(2)), positive voltage input 6C0$in+$, negative voltage input 6C0$in-$, a first reference (or analog ground) 6C0$ref$0, second reference 6C0$ref$1, and a positive voltage output 6C0$out+$. The circuit 6C0 further comprises two flying capacitors, a first flying capacitor 6Cfc1 and a second flying capacitor 6Cfc2, and two offset capacitors, a first offset capacitor 6Coc1, and a second offset capacitor 6Coc2. Each of the capacitors has a first terminal and a second terminal. The second terminals of the first and second offset capacitors 6Coc1 and 6Coc2 are connected to the input 60$inc$ of the CiAmp 600$n$. The circuit 6C0 further includes a plurality of switches which are operable with a control signal/clock that alternates "setup" and "enable" phases repeatedly, including "setup" switches 6Css1, 6Css2, 6Css3, 6Css4, and 6Css5, which closes during "setup" phase of the control clock; and "enable" switches 6Ces1, 6Ces2, 6Ces3, 6Ces4, 6Ces5, and 6Ces6, which closes during "enable" phase of the control clock.

During "setup" phase of the control clock, the plurality of switches 6Css1, 6Css2, 6Css3, 6Css4, and 6Css5, and 6Ces1, 6Ces2, 6Ces3, 6Ces4, 6Ces5, and 6Ces6, cause to connect the first and second flying capacitors 6Cfc1 and 6Cfc2 in series with the positive voltage input 6C0$in+$ and the negative voltage input 6C0$in-$ (thus, each of the flying capacitors 6Cfc1 and 6Cfc2 would be charged with the half of the differential voltage between the positive voltage input 6C0$in+$ and the negative voltage input 6C0$in$. They further cause the CiAmps 600$n$ to be self-biased by feeding back the output 60$outc$ to the input 60$inc$ of the CiAmp 600$n$. They yet further cause the first reference 6C0$ref$0 to connect to the first terminal of the second offset capacitor 6Coc2; and the second reference 6B0$ref$1 to connect to the first terminal of the first offset capacitor 6Coc1.

During "enable" phase of the control clock, the plurality of switches 6Css1, 6Css2, 6Css3, 6Css4, and 6Css5, and 6Ces1, 6Ces2, 6Ces3, 6Ces4, 6Ces5, and 6Ces6 cause capacitively connect the output 60$outc$ to the input 60$inc$ by parallelly connecting the first and second flying capacitor 6Cfc1 and 6Cfc2, and further connecting to either one of the first offset capacitor 6Coc1 or second offset capacitor 6Coc2 in series. In this regard, some of the enable switches, namely 6Ces6 is a two-way switch, selectively connect the second terminals of the first and second flying capacitors 6Cfc1 and 6Cfc2 to either the first terminal of the first offset capacitor 6Coc1 or the first terminal of the second offset capacitor 6Coc2. In further preferred embodiment of the present invention, such selection by the two-way switch 6Ces6 may be made based on a bit value of a binary input number, i.e. "0" or "1". For example, the two-way switch 6Ces6 connects to the second offset capacitors 6Coc2 when the bit value is "0"; while the two-way switch 6Ces6 connects to the first offset capacitor 6Coc1 when the bit value is "1".

Optionally, the positive voltage output 6C0$out+$ and the first reference 6C0$ref$0 may be resistively and/or capacitively loaded to each other through a resister 6Cr and/or a capacitor 6Cc.

For a prospective of relevant settling time, a mental reference RC time constant for a near nominal 1 KΩ driving 100 fF is 100 ps. The offset capacitor(s) (or analog offset capacitors) and the reference voltage add/subtract capacitor only need to recalibrate drift and noise error voltages, therefore the capacitors do not require any significant settling time during operation. Since the capacitors do not change voltage, per se, parasitic and CiAmp input capacitance would not provide any delay contribution factor; only imbalance of parasitics to external signals count towards noise injection errors. Accordingly, the capacitance size does not change settling time and is only a design tradeoff for accuracy due to their absorbing switch differential turn-off charge injection from their opposing gate drive inputs. Since the voltages here do not change, any offset error contribution is negligible and constant.

This phenomena/fact leaves flying capacitors (or input sampling capacitors) and their driving impedance to limit the input sampling time as defined as their total RC and the number of time constants needed for the desired accuracy. In this regard, the size(s) of the flying capacitors (or input sampling capacitors) is(are) chosen to absorb the switch turnoff differential charge injection, but here this charge injection varies with input signal voltage being sampled. The P and N-channel switch transistors charge injection varies with the voltage being open circuited to the input and the exact time each transistor turns off is different because they are being turned off at different gate-to-source voltages. When this accuracy needs to be reduced, the replica-differential configuration is used to differentially cancel out these error contributions. When one capacitor goes up, the other goes down, leaving a differential summing error residue. Noise injection from parasitic coupling also can be differentially canceled out with careful layout practices. Thus the sizings of these sampling capacitors are a dominant area, accuracy, and speed design tradeoff factor.

Figure 6P:
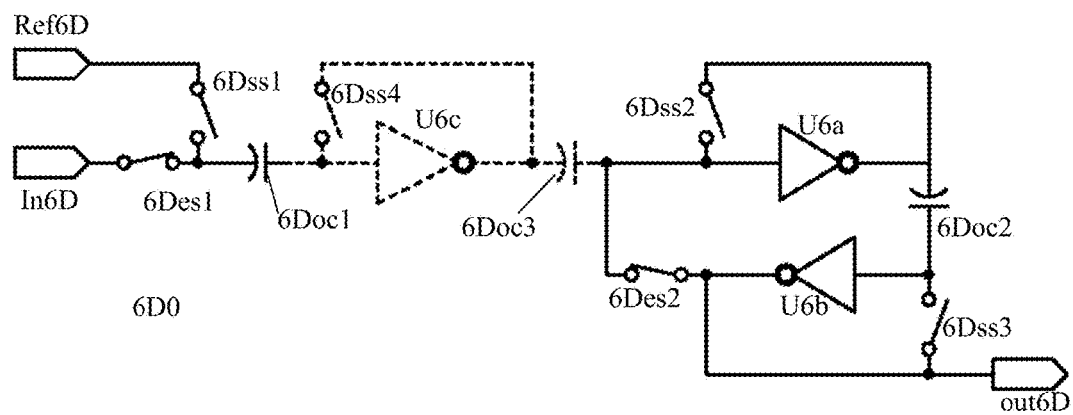
FIG. 6p shows a schematic diagram of latching voltage comparator of the prior art.

FIG. 6p shows a prior art latching comparator 6D0 (such comparator is shown in U.S. Pat. No. 6,069,500 to Kao), which is a Data-Latch logic cell that has been AC coupled to operate in its linear region. The Data-latch is a cross-coupled pair of logic inverters U6a and U6b with a logic selector (switches 6Dss1, 6Dss2, 6Dss3, 6Des1, 6Des2) to switch between the Data input and the latch feedback (using capacitors, 6Doc1 and 6Doc2). The swiches 6Dss1, 6Dss2, and 6Dss3 and 6Des1 and 6Des2 are operable by a selector control input (or control signal) having "SETUP" and "ENABLE" phases, where the swiches 6Dss1, 6Dss2, and 6Dss3 closes during SETUP phase while the switches 6Des1 and 6Des2 closes during ENABLE phase of the selector control input. Optionally, additional gain stage or inverter U6c may be capacitively coupled through a capacitor 6Doc3 between the capacitor 6Doc1 and the input to the first inverter U6a. The additional gain stage U6c would be self-biased through the switch 6Dss4 during SETUP phase of the control signal. When the selector control input is in its SETUP logical state, the voltage signal on the input In6D is passed to the latch where it also passes through to the output out6D. In the other, or ENABLE, state the selector control logic signal disconnects the input In6D and closes the latch feedback to freeze its logical state. When capacitors are inserted in series with the input selector to latch, an open-loop amplifier similar to FIG. 6g is formed, but without sufficient gain to be of much usefulness, just like an amplifier made out of a single stage inverter lacks sufficient gain.

The CiFET amplifiers of the present invention corrects this low gain shortcoming which is identical to the limitation of the prior art latch. If the latch input gain is not high enough, the input signal cannot be pulled out of the mud resulting in limited reliable resolution of the comparator. The latch will latch, but gain is required to properly resolve the analog input level. To compensate for this limited gain, the prior art introduces additional capacitively coupled inverter gain stages between the comparator input and the latch. The individual stages must be capacitively coupled and individually switched to their operating point during setup. If they are not individually capacitively coupled and individually "caged" to their operating point, either a ring oscillator, as in FIG. 4h, or a latch will result during setup. Here CiFET amplifiers can avoid the ring oscillator mode of operation.

Figure 6Q:
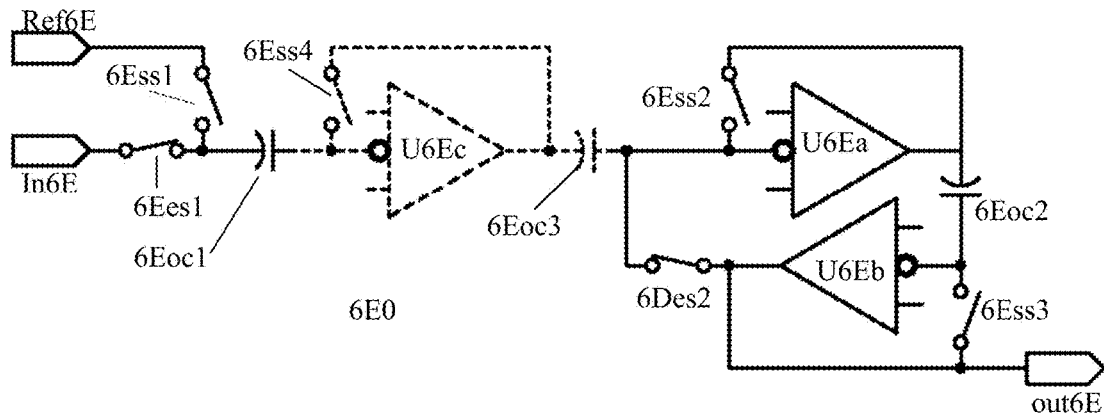
FIG. 6q shows a schematic diagram of a preferred embodiment CiFET amplifier based latching comparator with improved gain, resolution, and signal-to-noise performance in accordance with the present invention.

FIG. 6q is a cleaner, more precise, solution to the limited voltage gain of the FIG. 6p latch. Any one of the CiFET amplifiers of FIG. 4a, 6a(1), 6a(2), or the FIG. 3a CiFET itself could be used for the CiAmps U6Ea and U6Eb in FIG. 6q, including the feed-forward option for speed. Because the CiAmps are unity-gain stable, they can be caged unlike multiple inverters. Similar to FIG. 6p, the circuit 6E0 includes swiches 6Ess1, 6Ess2, and 6Ess3 which close/pass through during "Setup" phase of a control clock (now shown), and switches 6Ees1 and 6Ees2, which close/pass through during "Enable" phase of the control clock. The first and second CiAmps U6Ea and U6Eb are capacitively coupled together in series through the second capacitor 6Eoc2.

As it can be seen, during "Setup" phase, switches 6Ess1, 6Ess2, and 6Ess3 and 6Ees1 and 6Ees2 cause reference Ref6E is capacitively coupled to the first CiAmp U6Ea through a first capacitor 6Eoc1, the first CiAmp U6Ea to self-bias by coupling its output to its input, and further cause the second CiAmp U6Eb to self-bias by coupling its output to its input.

During "Enable" phase, switches 6Ess1, 6Ess2, and 6Ess3 and 6Ees1 and 6Ees2 cause the input In6E to be capacitively coupled to the first CiAmp U6Ea through the first capacitor 6Eoc1, and establishes a feedback loop from the second CiAmp U6Eb to U6Ea by coupling the output of the second CiAmp U6Eb to the input of the first CiAmp U6Ea, Optionally, additional gain stage or inverter U6Ec (any one of the CiFET amplifiers of FIG. 4a, 6a(1), 6a(2), or the FIG. 3a CiFET itself could be used) may be capacitively coupled through a capacitor 6Eoc3 between the capacitor 6Eoc1 and the input to the first inverter U6Ea. The additional gain stage U6Ec would be self-biased through the switch 6Ess4 during "Setup" phase of the control signal.

Figure 6R:
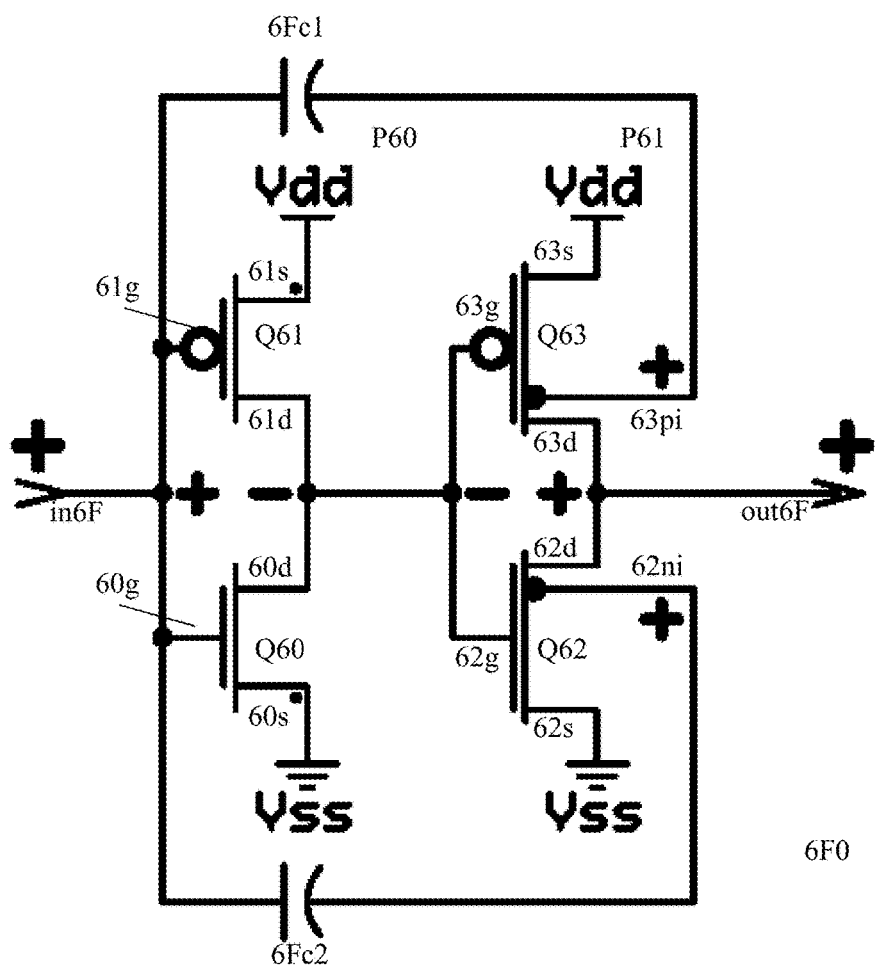
FIG. 6r shows a schematic diagram of a capacitive AC feed-forward circuit using CiFETs of the present invention.

FIG. 6r shows a schematic diagram of a capacitive AC feed-forward transistor circuit 6F0 using at least one CiFET P61 of the present invention. A first amplifier P60 may be a CiFET, which includes FET Q60 and FET Q61. The source terminals 60s and 62s of NiFETs Q60 and Q62, respectively, receive negative power supply, the source terminals 61s and 63s of PiFETs Q61 and Q63 receive positive power supply. The drain terminals 60d and 61d forms output for FET P60 and the drain terminals 62d and 63d forms an output for CiFET P61. The gate terminals 60g and 61g of FET Q60 and FET Q61 are connected together to receive input in6F; and the gate terminals 62g and 63g are connected together to receive the output of the first FET P60. Input in6F is capacitively coupled and fed forward to iPorts 62ni and 63pi of the second CiFET P61 via capacitors 6Fc1 and 6Fc2, respectively. The circuit 6F0 is a minimum transistor illustrative example of capacitive feed-forward to CiFET iPorts. The capacitive feedforward bridges an even number of inverting gain stages and enters at the iPorts of the last gain stage. Optionally all gain stages can be CiFETs or most of gain stages can be existing FETs, except for the amplifier in which the feedforward entry point is would need to be CiFET. For example, the amplifier P60 may be an existing FET; while the amplifier P61 would need to be a CiFET. This feedforward is the opposite of feedback in FIG. 4j which is also used for all the CiFET voltage amplifiers to stabilize them so that they will operate at unity gain when in setup mode.

Figure 6S:
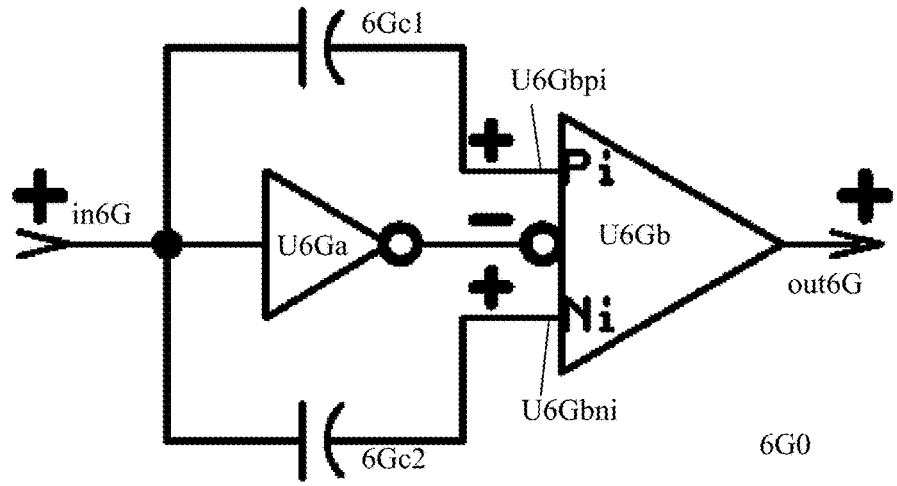
FIG. 6s shows a functional block diagram of the circuit shown in FIG. 6r.

FIG. 6s shows a functional block diagram equivalent to the circuit shown in FIG. 6r, where the amplifier U6Ga corresponds to the amplifier P60, and the amplifier U6Gb corresponds to CiFET P61 in FIG. 6r. Its input in6G is received by the first amplifier U6Ga, then fed to the second amplifier or CiFET U6Gb. The input in6G is capacitively coupled through first and second capacitors 6Gc1 and 6Gc2 to the iPorts U6Gbpi and U6Gbni.

Figure 6T:
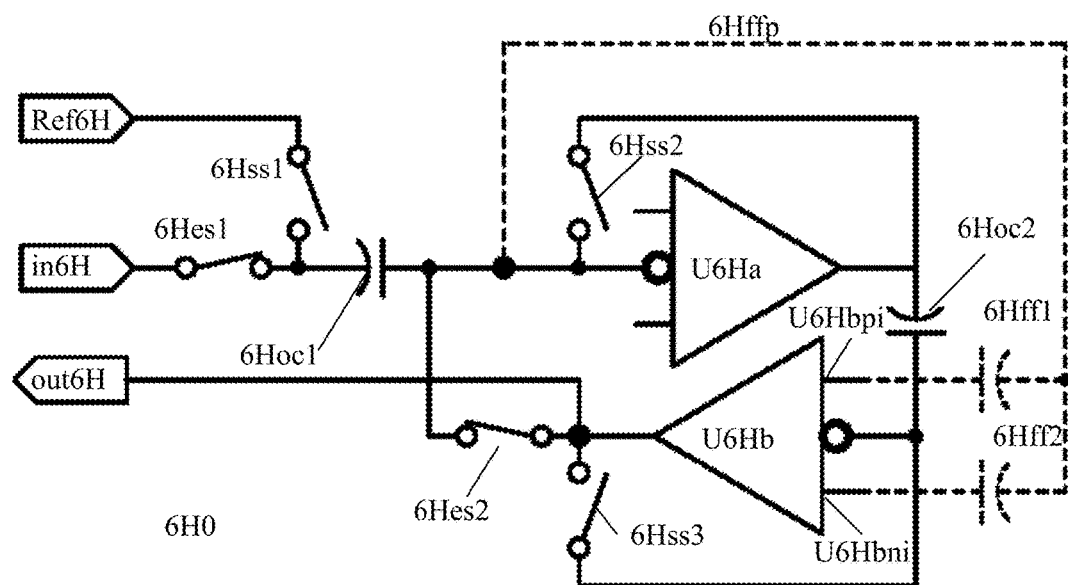
FIG. 6t shows a schematic diagram of a capacitive iPort latch feed forward circuit in accordance with the present invention.

FIG. 6t shows a schematic diagram of a capacitive iPort latch feed forward circuit 6H0 in accordance with the present invention. Similar to one shown in FIG. 6q, the circuit 6H0 includes a pair of amplifiers U6Ha and U6Hb, which may be any one of the CiFET amplifiers of FIG. 4a, 6a(1), 6a(2), or the CiFET itself as shown in FIG. 3a. The amplifiers U6Ha and U6Hb are connected in series through a capacitor 6Hoc2. Setup switches 6Hss1, 6Hss2, and 6Hss3, which closes/pass through when a control signal (not shown) is in "SETUP" phase, and enable switches 6Hes1, and 6Hes2, which close/pass through when the control signal is in "ENABLE" phase. The control signal alternates between "SETUP" and "ENABLE" phases. The first capacitor 6Hoc1 has the first and second terminals, and the second terminal is connected to the input of the first amplifier U6Ha. Optionally, the circuit 6H0 provides a feedforward path 6Hffp, in which the input to the first amplifier U6Ha may be capacitively fed forward to PiPort and NiPort U6Hbpi and U6Hbni, respectively through capacitors 6Hff1 and 6Hff2.

While in operation during "SETUP" phase of the control signal, these switches 6Hss1, 6Hss2, and 6Hss3, and 6Hes1, and 6Hes2 cause the Reference Ref6H to connect to the first terminal of the first capacitor 6Hoc1, the first amplifier U6Ha to be self-biased by connecting the input thereof to the output thereof; and the second amplifier U6Hb to be self-biased by connecting the input thereof to the output thereof. During the "SETUP" phase capacitor 6Hoc2 stores the difference between the amplifier U6Ha and U6Hb self-bias voltages. During "ENABLE" phase of the control signal, these switches 6Hss1, 6Hss2, and 6Hss3, and 6Hes1, and 6Hes2 cause the input in6H to connect to the first terminal of the first capacitor 6Hoc1, and removing any self-biasing from the first and second amplifier U6Ha and U6Hb. Switch 6Hes2 is closed shortly after the start of the "ENABLE" phase to provide positive feedback around the latch loop of amplifier U6Ha output through capacitor 6Hoc2 in series with amplifier U6Hb which has been slightly pushed towards the correct state by the feed-forward chapacitors 6Hff1 and 6Hff2.

Definitions of Terms:

iFET: A 4 terminal (plus body) device similar to a Field Effect Transistor but with an additional control connection that causes the device to respond to current input stimulus.

source channel: A semiconductor region between iPort diffusion and the Source diffusion. Conduction in this region is enabled by an appropriate voltage on the Gate.

drain channel: A semiconductor region between Drain diffusion and the iPort diffusion. Conduction in this region is enabled by an appropriate voltage on the Gate.

CiFET: A single stage, complementary iFET compound device shown in FIG. 3a.

super-saturation: an exponential conduction condition similar to weak inversion, but with high Gate overdrive and forced low voltage along the conduction channel. FIG. 2b #23b.

feed-forward: A technique to present a signal on an output, early on, in anticipation of the ultimate value.

self-biased: Unlike fixed-bias circuits, self-biased circuits adjust to local conditions to establish an optimum operating point.

dual: (of a theorem, expression, etc.) related to another by the interchange of pairs of variables, such as current and voltage as in "Trans-Conductance" to "Trans-Resistance."

trans-resistance: infrequently referred to as mutual resistance, is the dual of Trans-conductance. The term is a contraction of transfer resistance. It refers to the ratio between a change of the voltage at two output points and a related change of current through two input points, and is notated as $r_m$:

$$g_m = \frac{\Delta I_{out}}{\Delta V_{in}}$$

$$r_m = \frac{\Delta I_{out}}{\Delta V_{in}}$$

The SI unit for Trans-resistance is simply the ohm, as in resistance.

For small signal alternating current, the definition is simpler:

$$g_m = \frac{i_{out}}{v_{in}}$$

$$r_m = \frac{v_{out}}{i_{in}}$$

trans-impedance: similar to trans-resistance, but further includes complex variables for high frequency applications.

trans-conductance is a property of certain electronic components. Conductance is the reciprocal of resistance; Trans-conductance is the ratio of the current variation at the output to the voltage variation at the input. It is written as $g_m$. For direct current, Trans-conductance is defined as follows:

$$g_m = \frac{\Delta I_{out}}{\Delta V_{in}}$$

$$r_m = \frac{\Delta I_{out}}{\Delta V_{in}}$$

For small signal alternating current, the definition is simpler:

$$g_m = \frac{i_{out}}{v_{in}}$$

$$r_m = \frac{v_{out}}{i_{in}}$$

Trans-conductance is a contraction of transfer conductance. The old unit of conductance, the mho (ohm spelled backwards), was replaced by the SI unit, the Siemens, with the symbol S (1 siemens=1 ampere per volt).

translinear circuit: translinear circuit is a circuit that carries out its function using the translinear principle. These are current-mode circuits that can be made using transistors that obey an exponential_current-voltage characteristic—this includes BJTs_and CMOS transistors in weak inversion.

subthreshold conduction or subthreshold leakage or subthreshold drain current is the current between the source and drain of a MOSFET when the transistor is in subthreshold region, or weak-inversion region, that is, for gate-to-source voltages below the threshold voltage. The terminology for various degrees of inversion is described in Tsividis. (Yannis Tsividis (1999). *Operation and Modeling of the MOS Transistor* (Second Edition ed.). New York: McGraw-Hill. p. 99. ISBN 0-07-065523-5.)

Subthreshold slope: In the subthreshold region the drain current behavior—though being controlled by the gate terminal—is similar to the exponentially increasing current of a forward biased diode. Therefore a plot of logarithmic drain current versus gate voltage with drain, source, and bulk voltages fixed will exhibit approximately log linear behavior in this MOSFET operating regime. Its slope is the subthreshold slope.

Diffusion current: Diffusion current is a current in a semiconductor caused by the diffusion of charge carriers (holes and/or electrons). Diffusion current can be in the same or opposite direction of a drift current, that is formed due to the electric field in the semiconductor. At equilibrium in a p-n junction, the forward diffusion current in the depletion region is balanced with a reverse drift current, so that the net current is zero. The diffusion current and drift current together are described by the drift-diffusion equation.

Drain-induced barrier lowering: Drain-induced barrier lowering or DIBL is a short-channel effect in MOSFETs referring originally to a reduction of threshold voltage of the transistor at higher drain voltages.

As channel length decreases, the barrier $\varphi_B$ to be surmounted by an electron from the source on its way to the drain reduces.

As channel length is reduced, the effects of DIBL in the subthreshold region (weak inversion) show up initially as a simple translation of the subthreshold current vs. gate bias curve with change in drain-voltage, which can be modeled as a simple change in threshold voltage with drain bias. However, at shorter lengths the slope of the current vs. gate bias curve is reduced, that is, it requires a larger change in gate bias to effect the same change in drain current. At extremely short lengths, the gate entirely fails to turn the device off. These effects cannot be modeled as a threshold adjustment.

DIBL also affects the current vs. drain bias curve in the active mode, causing the current to increase with drain bias, lowering the MOSFET output resistance. This increase is additional to the normal channel length modulation effect on output resistance, and cannot always be modeled as a threshold adjustment.

What is claimed is:

1. A voltage amplifier, comprising:
   at least three complementary pairs of current field effect transistors, each pair comprising a p-type current field effect transistor (PiFET) and an n-type current field effect transistor (NiFET),
      each of PiFET and NiFET has a source termina, a drain terminal, a gate terminal and a diffusion terminal of said corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source and drain channels;
   wherein, for each of at least three complementary pairs, said gate terminal of said PiFET and said gate terminal of said NiFET are connected together to form an input, said source terminal of NiFET is connected to a negative power supply and said source terminal of said PiFET is connected to a positive power supply, and said drain terminals of said NiFET and said PiFET are connected together to form an output, and
   wherein said at least three complementary pairs are connected in series by connecting said output of a previous pair to said input of a subsequent pair of said at least three complementary pairs.

2. The voltage amplifier as recited in claim 1 further comprises a pair of roll-off capacitors, capacitively connecting output of said second pair to said diffusion terminals of said first pair of said NiFET and PiFET.

3. The voltage amplifier as recited in claim 1 or 2 further comprises an additional pair of an NiFET and PiFET as a feed forward pair, wherein said feed forward pair receives input of said voltage amplifier as an input to gate terminals of said feed forward pair, and couples said output of said third pair with drain terminals of said NiFET and PiFET of said feed forward pair to form a feed forward output.

4. A differential voltage amplifier, comprising:
   a. positive and negative voltage input terminals for receiving differential voltage input;
   b. positive and negative voltage output terminals for outputting differential voltage output;
   c. an analog ground reference terminal for receiving analog ground reference;
   d. first and second multistage amplifiers, each of said first and second multistage amplifiers comprising:
      i. at least three complementary pairs of current field effect transistors, each complementary pair comprising a p-type current field effect transistor (PiFET) and an n-type current field effect transistor (NiFET),
         for each complementary pair, each of said PiFET and said NiFET has a source terminal, a draing terminal, a gate terminal and a diffusion terminal of said corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source and drain channels;
         said gate terminal of said PiFET and a gate terminal of said NiFET are connected together to form an input, said source terminal of NiFET is connected to negative power supply and said source terminal of said PiFET is connected to positive power supply, and said drain terminals of said NiFET and said PiFET are connected together to form an output, and
         wherein said at least three complementary pairs are connected in series by connecting said output of a previous pair to said input of a subsequent pair of said at least three complementary pairs,
         wherein, for each of said first and second multistage amplifiers, said input of said first complementary pair forms an input terminal and said output of said last pair forms an output terminal;
   e. first and second capacitors, each of said first and second capacitors has a first and second terminals, said second terminal of said first capacitor is connected to said input terminal of said first multistage amplifier, and said second terminal of said second capacitor is connected to said input terminal of said second multistage amplifier;
   f a plurality of switches controlled by a control signal, wherein control signal alternates phases comprising a setup phase and enable phase;
   wherein during said setup phase of said control signal, said plutality of switches cause said first terminals of said first and second capacitors to connect to said analog ground reference terminal and said output terminal to connect to said input terminal of each of said first and second multistage amplifiers while disconnecting said positive and negative voltage input terminals and positive and negative voltage output terminals; and
   during said enable phase of said control signal, said plurality of swiches cause said negative voltage input terminal to connect to said first terminal of said first capacitor and said positive voltage input terminal to said first terminal of said second capacitor, and to connect said output terminal of said first multistage amplifier to said positive voltage output terminal and said output terminal of said second multistage amplifier to said negative voltage output terminal.

5. A continuous differential voltage amplifier, comprising:
a. positive and negative voltage input terminals for receiving differential voltage input;
b. positive and negative voltage output terminals for outputting differential voltage output;
c. an analog ground reference terminal for receiving analog ground reference;
d. first and second differential voltage amplifiers as recited in claim 4, wherein said first differential voltage amplifier is operable with a first control signal and said second differential voltage amplifier is operable with a second control signal, wherein said first and second control signals alternates setup and enable phases;
wherein said positive voltage input terminals of said first and second differential voltage amplifiers are connected to said positive voltage input terminal of said continuous differential voltage amplifier, said negative voltage input terminals of said first and second differential voltage amplifiers are connected to said negative voltage input terminal of said continuous differential voltage amplifier, positive output terminals of said first and second differential voltage amplifiers are connected to said positive voltage output terminal of said continuous differential voltage amplifier, and said negative voltage output terminals of said first and second differential voltage amplifiers are connected to said negative voltage output terminal of said continuous differential voltage amplifier;
wherein said first and second control signals are out of phase whereby continuous output is provided from said positive and negative voltage terminals of said continuous differential voltage amplifier.

6. The continuous differential voltage amplifier as recited in claim 5, wherein a phase difference between said first control signal and said second control signal is 180 degrees.

7. A differential voltage amplifier, comprising:
a. positive and negative voltage input terminals for receiving differential voltage input;
b. positive and negative voltage output terminals for outputting differential voltage output;
c. an analog ground reference terminal for receiving analog ground reference;
d. first and second multistage amplifiers, each of said first and second multistage amplifiers comprising:
  i. at least three complementary pairs of current field effect transistors,
    a) each pair comprising a p-type current field effect transistor (PiFET) and an n-type current field effect transistor (NiFET),
      a. each of PiFET and NiFET has a source terminal, a drain terminal, a gate terminal, and a diffusion terminal of said corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source and drain channels
      wherein for each complementary pair, said gate terminal of said PiFET and said gate terminal of said NiFET are connected together to form an input, said source terminal of said NiFET is connected to negative power supply and said source terminal of said PiFET is connected to positive power supply, and said drain terminals of said NiFET and said PiFET are connected together to form an output, and
      wherein said at least three complementary pairs are connected in series by connecting said output of a previous pair to said input of a subsequent pair of said at least three complementary pairs,
      wherein, for each of first and second multistage amplifiers, said input of said first complamantary pair forms an input terminal and said output of said last complementary pair forms an output terminal;
e. first and second capacitors, each of said first and second capacitors has a first terminal and second terminal, said second terminal of said first capacitor is connected to said input terminal of said first multistage amplifier, and said second terminal of said second capacitor is connected to said input terminal of said second multistage amplifier;
f third and fourth capacitors, each of said second and third capacitors has a first terminal and second terminal;
g. a plurality of switches controlled by a control signal, wherein control signal alternates phases comprising a setup phase and enable phase;
wherein during said setup phase of said control signal, said plurality of switches cause said first terminals of said first and second capacitors to connect to said analog ground reference terminal, said output terminal to connect to said input terminal of each of said first and second multistage amplifiers, said first terminal of said third capacitor and said second terminal of said fourth capacitor to connect to said positive voltage input terminal, and said second terminal of said third capacitor and said first terminal of said fourth capacitor to connect to said negative voltage input terminal while disconnecting said positive and negative voltage output terminals; and
during said enable phase of said control signal, said plurality of switches causes said output terminal of said first multistage amplifier to capacitively connect to said input terminal of said first multistage amplifier by connecting said third and first capacitors in series, said output terminal of said second multistage amplifier to capacitively connect to said input terminal of said second multistage amplifier by connecting said fourth and second capacitors in series, and said output terminal of said first multistage amplifier to connect to said positive voltage output terminal and said output terminal of said second multistage amplifier to connect to said negative voltage output terminal, while disconnecting said negative and positive voltage input terminals and analog ground reference terminal.

8. A sample and hold voltage amplifier, comprising:
a. positive and negative voltage input terminals for receiving differential voltage input;
b. an output terminal for outputting voltage output;
c. a multistage amplifier comprising:
  i. at least three complementary pairs of current field effect transistors,
    each pair comprising a p-type current field effect transistor (PiFET) and an n-type current field effect transistor (NiFET),
      each of PiFET and NiFET has a source terminal, a drain terminal, a gate terminal, and a diffusion terminal of said corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source and drain channels;

wherein, for each complementary pair, said gate terminal of said PiFET and said gate terminal of said NiFET are connected together to form an input, said source terminal of said NiFET is connected to negative power supply and said source terminal of said PiFET is connected to positive power supply, and said drain terminals of said NiFET and said PiFET are connected together to form an output, wherein said at least three complementary pairs are connected in series by connecting said output of a previous pair to said input of a subsequent pair of said at least three complementary pairs, wherein, for each of said first and second multistage amplifier, said input of said first pair forms an inputer terminal, and said output of said last pair forms an output terminal;

d. a plurality of switches control by a control signal, wherein said control signal alternates between first and second phases;

e. a capacitor having a first terminal and second terminal, said second terminal of said capacitor is connected to said input terminal of said multistage amplifier;

wherein said setup phase of said control signal causes said plurality of switches to connect said positive voltage input terminal to said first terminal of said capacitor, and further causes said multistage amplifier to be self-biased by connecting said output terminal to said input terminal of said multistage amplifier, and wherein said enable phase of said control signal causes said plurality of switches to connect said negative voltage input terminal to said first terminal of said capacitor, and further causing said output terminal of said multistage amplifier to said output voltage terminal.

9. The amplifier as recited in claim 8 further comprises a reference terminal for receiving a reference for said voltage output terminal to resistively and / or capacitively couple said reference terminal with said voltage output terminal.

10. A sample and hold voltage amplifier, comprising:
a. positive and negative voltage input terminals for receiving differential voltage input;
b. an output terminal for outputting voltage output;
c. a reference terminal for receiving output voltage reference;
d. a multistage amplifier comprising:
 i. at least three complementary pairs of current field effect transistors, each pair comprising a p-type current field effect transistor (PiFET) and an n-type current field effect transistor (NiFET), each of PiFET and NiFET has a source terminal, a drain terminal, a gate terminal, and a diffusion terminal of said corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source and drain channels;

wherein, for each complementary pair, said gate terminal of said PiFET and said gate terminal of said NiFET are connected together to form an input, said source terminal of NiFET is connected to negative power supply and said source terminal of said PiFET is connected to positive power supply, and said drain terminals of said NiFET and said PiFET are connected together to form an output, and wherein said at least three complementary pairs are connected in series by connecting said output of a previous pair to said input of a subsequent pair of said at least three complementary pairs, wherein, for each multistage amplifier, said input of said first complementary pair forms an inputer terminal, and said output of said last complementary pair forms an output terminal;

e. first and second capacitors, each of said first and second capacitors has a first and second terminal, said second terminal of said first capacitor is connected to said input terminal of said first multistage amplifier;

f. a plurality of switches controlled by a control signal, wherein control signal alternates a setup phase and enable phase repeatedly;

wherein said output terminal of said multistage amplifier is connected to said output terminal of said sample and hold voltage amplifier;

wherein said setup phase of said control signal causes said plurality of switches to connect said positive voltage input terminal to said first terminal of said second capacitor, said negative voltage input terminal to said second terminal of said second capacitor, said multistage amplifier to be self-biased by connecting said output terminal of said multistage amplifier to said input terminal of said multistage amplifier, and said reference terminal to said first terminal of said first capacitor;

wherein said enable phase of said control signal causes said first terminal of said second capacitor to couple with said output terminal of said multistage amplifier, said second terminal of said second capacitor to connect to said first terminal of said first capacitor.

11. The sample and hold voltage amplifier as recited in claim 10, wherein during transition from said setup phase to said enable phase of said control signal, a corresponding of said plurality of switches that causes said multistage amplifier to be self-bias and to connect said reference to said first terminal of said first capacitor during said setup phase to be disconnected earlier than another corresponding portion of said plurality of switches that causes to connect said positive voltage input terminal to said first terminal of said second capacitor and said negative voltage input terminal to said second terminal of said second capacitor.

12. A precise twice gain analog amplifier, comprising:
a. positive and negative voltage input terminals for receiving differential voltage input;
b. an output terminal for outputting voltage output;
c. an output reference;
d. a multistage amplifier comprising:
 i. at least three complementary pairs of current field effect transistors, each pair comprising a p-type current field effect transistor (PiFET) and an n-type current field effect transistor (NiFET), each of PiFET and NiFET has a source terminal, a drain terminal, a gate terminal, and a diffusion terminal of said corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels;

wherein, for each complementary pair, said gate terminal of said PiFET and said gate terminal of said NiFET are connected together to form an input, said source terminal of said NiFET is connected to negative power supply and said source terminal of said PiFET is connected to positive power supply, and said drain terminals of said NiFET and said PiFET are connected together to form an output; and wherein said at least three complementary pairs are connected in series by connecting said output of a previous pair to said input of a subsequent pair of said at least three complementary pairs;

wherein said input of said first complementary pair forms an input terminal, and said output of said last complementary pair forms an output terminal;

e. a plurality of switches controlled by a control signal, wherein said control signal alternates first and second phases;

f. an offset capacitor having first and second terminals;

g. first and second capacitors, each having first and second terminals;

h. a plurality of switches operable by said control signal;

wherein said second terminal of said offset capacitor is connected to said input of said multistage amplifier;

wherein during said setup phase of said control signal, said plurality of switches causes:
  i. the multistage amplifier to be self-biased by connecting said output terminal of said multistage amplifier to said input of said multistage amplifier;
  ii. the output reference to connect to said first terminal of said offset capacitor;
  iii. the first and second capacitors to be connected in parallel by connecting said first terminals of said first and second capacitors to said positive voltage input terminal and said second terminals of said first and second capacitors to said negative voltage input terminal; and during said enable phase of said control signal, said plurality of switches causes:
  i. the output terminal of said multistage amplifier to be capacitively connected to said input terminal of said multistage amplifier by connecting said output terminal of said multistage amplifier to said first terminal of said first capacitor, said second terminal of said first capacitor to said the first terminal of said second capacitor, said second terminal of said second capacitor to said first terminal of said offset capacitor.

13. A continuous amplifier, comprising:

a. positive and negative voltage input terminals for receiving differential voltage input;

b. an output terminal;

c. a plurality of switches controlled by first and second control signals, wherein each control signal alternates a setup and enable phase repeatedly and said first and second control signals are 180 degree differences in phase;

d. first and second multistage amplifiers, each of said first and second multistage amplifiers comprising:
  i. at least three complementary pairs of current field effect transistors, each pair comprising a p-type current field effect transistor (PiFET) and an n-type current field effect transistor (NiFET), each of PiFET and NiFET has a source terminal, a drain terminal, a gate terminal, and a diffusion terminal of said corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source and drain channels;

wherein, for each complementary pair, said gate terminal of said PiFET and said gate terminal of said NiFET are connected together to form an input, said source terminal of NiFET is connected to negative power supply and said source terminal of said PiFET is connected to positive power supply, and said drain terminals of said NiFET and said PiFET are connected together to form an output; and wherein said at least three complementary pairs are connected in series by connecting said output of a previous pair to said input of a subsequent pair of said at least three complementary pairs;

wherein, for each multistage amplifier, said input of said first complementary pair forms an input terminal, and said output of said last complementary pair forms output terminal;

e. a first and second offset capacitor, each having first and second terminals, wherein said second terminal of said first offset capacitor is connected to said input terminal of said first multistage amplifier, and said second terminal of said second offset capacitor is connected to said input terminal of said second multistage amplifier;

wherein said setup phase of said first control signal causes to connect said positive voltage input terminal to said first terminal of said first offset capacitor, and further causes said first multistage amplifier to be self-biased by connecting said output terminal of said first multistage amplifier to said input terminal of said first multistage amplifier;

the setup phase of said second control signal causes to connect said positive voltage input terminal to said first terminal of said second offset capacitor, and further causes said second multistage amplifier to be self-biased by connecting said output terminal of said second multistage amplifier to said input terminal of said second multistage amplifier;

the enable phase of said first control signal causes to connect said negative voltage input terminal to said first terminal of said first offset capacitor and said output terminal of said first multistage amplifier to said output terminal of said continuous amplifier; and the enable phase of said second control signal causes to connect said negative voltage input terminal to said first terminal of said second offset capacitor and said output terminal of said second multistage amplifier to said output terminal of said continuous amplifier.

14. A sample and hold amplifier, comprising:
a. a positive and negative voltage input terminals;
b. an output terminal;
c. a plurality of references of said different levels, including an analog ground;
d. a plurality of offset capacitors corresponding to said number of references, each of said plurality of said offset capacitors includes first and second terminals;
e. a plurality of flying capacitors, each of said plurality of flying capacitors has first and second terminals;
f. a plurality of switches controlled by a clock that alternates setup and enable phases;
g. a multistage amplifier comprising:
   i. at least three complementary pairs of current field effect transistors, each pair comprising a p-type current field effect transistor (PiFET) and an n-type current field effect transistor (NiFET), each of PiFET and NiFET has a source terminal, a drain terminal, a gate terminal, and a diffusion terminal of said corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source and drain channels;
   wherein, for each complementary pair, said gate terminal of said PiFET and said gate terminal of said NiFET are connected together to form an input, said source terminal of said NiFET is connected to negative power supply and said source terminal of said PiFET is connected to positive power supply, and said drain terminals of said NiFET and said PiFET are connected together to form an output, and
   wherein, for each multistage amplifier, said at least three complementary pairs are connected in series by connecting said output of a previous pair to said input of a subsequent pair of said at least three complementary pairs;
   wherein, for each multistage amplifier, said input of said first complementary pair forms an input terminal, and said output of said last complementary pair forms an output terminal;
wherein said output terminal of said multistage amplifier is in communication with said output terminal of said sample and hold amplifier, and said second terminals of said plurality of said offset capacitors are connected to said input terminal of said multistage amplifier;
wherein, during setup phase of said clock, said plurality of switches causes to connect said first terminals of said plurality of flying capacitors to said positive voltage input terminal of said sample and hold amplifier, to connect said second terminals of said plurality of flying capacitors to said negative input voltage input terminal of said sample and hold amplifier, to connect each of said first terminals of said plurality of said offset capacitors to said corresponding one of said plurality of references, and to have said multistage amplifier to be self-biased by connecting said output terminal of said multistage amplifier to said input terminal of said multistate amplifier; and
during enable phase of said clock, said plurality of switches causes to connect said plurality of said flying capacitors in series with each other and with a selected one of said plurality of said offset capacitors in series, and to capacitively couple said output terminal of said multistage amplifier through said plurality of said flying capacitors and said selected one of said plurality of said offset capacitors to said input terminal of said multistage amplifier;
wherein said selected one of said plurality of said offset capacitors is connected to said corresponding one of said plurality of references with a voltage level of said corresponding one of said plurality of references is higher than or equal to said voltage level at said positive voltage input terminal of said sample and hold amplifier, and said voltage level at said positive voltage input terminal of said sample and hold amplifier is higher than a voltage level of one level lower than said corresponding one of said plurality of references.

15. A digital to analog converter, comprising:
a. a positive and negative voltage input terminals;
b. an output terminal;
c. a plurality of references of said different levels, including an analog ground;
d. a plurality of offset capacitors corresponding to said number of references, each of said plurality of said offset capacitors includes first and second terminals;
e. a plurality of flying capacitors, each of said plurality of flying capacitors has first and second terminals;
f. a plurality of switches controlled partly by a clock that alternates setup and enable phases;
g. a multistage amplifier comprising:
   i. at least three complementary pairs of current field effect transistors, each pair comprising a p-type current field effect transistor (PiFET) and an n-type current field effect transistor (NiFET), each of PiFET and NiFET has a source terminal, a drain terminal, a gate terminal, and a diffusion terminal of said corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source and drain channels;
   wherein, for each complementary pair, said gate terminal of said PiFET and said gate terminal of said NiFET are connected together to form an input, said source terminal of said NiFET of said each pair is connected to negative power supply and said source terminal of said PiFET is connected to positive power supply, and said drain terminals of said NiFET and said PiFET are connected together to form an output; and
   wherein, for each multistage amplifier, said at least three complementary pairs are connected in series by connecting said output of a previous pair to said input of a subsequent pair of said at least three complementary pairs;
   wherein, for each multistage amplifier, said first complementary pair forms an input terminal and said output of said last complementary pair forms an output terminal;
wherein said output terminal of said multistage amplifier is in communication with said output terminal of said sample and hold amplifier, and said second terminals of said plurality of said offset capacitors are connected to said input terminal of said multistage amplifier;

wherein, during setup phase of said clock, said plurality of switches causes to couple said plurality of said flying capacitors with said positive and negative voltage input terminals of said sample and hold amplifier, to connect each of said first terminals of said plurality of said offset capacitors to said corresponding one of said plurality of references, and to have said multistage amplifier to be self-biased by connecting said output terminal of said multistage amplifier to said input terminal of said multistate amplifier; and during enable phase of said clock, said plurality of switches causes to couple said plurality of said flying capacitors with a selected one of said plurality of said offset capacitors, and to capacitively couple said output terminal of said multistage amplifier through said plurality of said flying capacitors and said selected one of said plurality of said offset capacitors to said input terminal of said multistage amplifier;

wherein said selected one of said plurality of said offset capacitors is selected based on a value of a digital representation for an analog output.

16. The digital to analog converter as recited in claim 15, wherein said plurality of said flying capacitors are coupled in series during said setup phase of said clock, and said plurality of said flying capacitors are coupled in parallel during said enable phase of said clock.

17. A digital to analog converter, comprising:
a. a positive and negative voltage input terminals;
b. a positive and negative voltage output terminals;
c. a plurality of references of said different levels, including an analog ground;
d. a first plurality of offset capacitors and a second plurality of offset capacitors, a number of each of said first and second plurality of said offset capacitors corresponds to said number of said references, each of said first and second plurality of said offset capacitors includes first and second terminals;
e. a first and second flying capacitors, each of said first and second flying capacitors has first and second terminals;
f. a plurality of switches controlled partly by a clock that alternates setup and enable phases;
g. a first and second multistage amplifiers, each of said first and second multistage amplifiers comprising:
  i. at least three complementary pairs of current field effect transistors, each pair comprising a p-type current field effect transistor (PiFET) and an n-type current field effect transistor (NiFET), each of PiFET and NiFET has a source terminal, a drain terminal, a gate terminal, and a diffusion terminal of said corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source and drain channels;
    wherein, for each complementar pair, said gate terminal of said PiFET and said gate terminal of said NiFET are connected together to form an input, said source terminal of NiFET is connected to negative power supply and said source terminal of said PiFET is connected to positive power supply, and said drain terminals of said NiFET and said PiFET are connected together to form an output, and
  wherein, for each multistage amplifier, said at least three complementary pairs are connected in series by connecting said output of a previous pair to said input of a subsequent pair of said at least three complementary pairs,
  wherein, for each multistage amplifier, said input of said first complementary pair forms an input terminal, and said output of said last complementary pair forms an output terminal;

wherein said output terminals of said first multistage amplifier is in communication with said positive voltage output terminal of said sample and hold amplifier, said output terminals of said second multistage amplifier is in communication with said negative voltage output terminal of said sample and hold amplifier, said second terminals of said first plurality of said offset capacitors are connected to said input terminal of said first multistage amplifier, and said second terminals of said second plurality of said offset capacitors are connected to said input terminal of said second multistage amplifier;

wherein, during setup phase of said clock, said plurality of switches causes to couple said first and second flying capacitors in series with said positive and negative voltage input terminals of said sample and hold amplifier, to connect each of said first terminals of said first and second plurality of said offset capacitors to said corresponding one of said plurality of references, and to have said first and second multistage amplifiers to be self-biased by connecting said output terminal of said first multistage amplifier to said input terminal of said first multistate amplifier and by connecting said output terminal of said second multistage amplifier to said input terminal of said second multistate amplifier; and during enable phase of said clock, said plurality of switches causes to couple said first flying capacitor with a selected one of said first plurality of said offset capacitors in series, to couple said second flying capacitor with a selected one of said second plurality of said offset capacitors in series, to capacitively couple said output terminal of said first multistage amplifier through said first flying capacitor and said selected one of said first plurality of said offset capacitors to said input terminal of said first multistage amplifier, and to capacitively couple said output terminal of said second multistage amplifier through said second flying capacitor and said selected one of said second plurality of said offset capacitors to said input terminal of said second multistage amplifier;

wherein said selected one of said first and second plurality of said offset capacitors is selected based on a value of a digital representation for an analog output.

18. A latching comparator receives an input and a reference to generate an output, comprising:
a. first and second complementary pairs of current field effect transistors, each complementary pair comprising a p-type current field effect transistor (PiFET) and an n-type current field effect transistor (NiFET), each of said PiFET and said NiFET has:
  i. a source terminal, a drain terminal, a gate terminal, and a diffusion terminal of said corresponding conductivity type of said each of said PiFET and said NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source and drain channels;

wherein, for said each complementar pair, said gate terminal of said PiFET and said gate terminal of said NiFET are connected together to form an input, said source terminal of said NiFET is connected to negative power supply and said source terminal of said PiFET is connected to positive power supply, and said drain terminals of said NiFET and said PiFET are connected together to form an output, and wherein said output of the second complementary pair is coupled to said output of said latching comparator;

b. a plurality of switches operable by a control signal that alternates a setup phase and an enable phase;

c. a first capacitor and a second capacitor, each of said first and second capacitors having a first terminal and a second terminal, said second terminal of said first capacitor is connected to said input of said first complementary pair, said output of said first complementary pair is capacitively coupled to said input of said second complementary pair;

wherein, during said setup phase of said control signal, said plurality of switches cause said reference to coupled to said first terminal of said first capacitor for capacitively coupling to said input of said first complementary pair, said first complementary pair to be self-biased by coupling said output of said first complementary pair to said input of said first complementary pair, and said second complementary pair to be self-biased by coupling said output of said second complementary pair to said input of said second complementary pair; and during said enable phase of said control signal, said plurality of switches cause said input of said latching comparator to be coupled to said first terminal of said first capacitor for capacitively coupling to said input of the first complementary pair, and said output of said second complementary pair to be coupled to said input of said first complementary pair.

19. A latching comparator receives an input and a reference to generate an output, comprising:

a. first and second multistage amplifiers, each multistage amplifier comprises at least three complementary pairs of current field effect transistors, each complementary pair comprising a p-type current field effect transistor (PiFET) and an n-type current field effect transistor (NiFET), each of said PiFET and said NiFET has:

i. a source terminal, a drain terminal, a gate terminal, and a diffusion terminal of said corresponding conductivity type of said each of said PiFET and said NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source and drain channels;

wherein, for said each complementar pair, said gate terminal of said PiFET and said gate terminal of said NiFET are connected together to form an input, said source terminal of said NiFET is connected to negative power supply and said source terminal of said PiFET is connected to positive power supply, and said drain terminals of said NiFET and said PiFET are connected together to form an output, and wherein, for each multistage amplifier, said at least three complementary pairs are connected in series by connecting said output of a previous pair to said input of a subsequent pair of said at least three complementary pairs, said output of the second multistage amplifier is coupled to said output of said latching comparator;

b. a plurality of switches operable by a control signal that alternates a setup phase and an enable phase;

c. a first capacitor and a second capacitor, each of said first and second capacitors having a first terminal and a second terminal, said second terminal of said first capacitor is connected to said input of said first multistage amplifier, said output of said first complementary pair is capacitively coupled to said input of said second multistage amplifier;

wherein, during said setup phase of said control signal, said plurality of switches cause said reference to be coupled to said first terminal of said first capacitor for capacitively coupling to said input of said first multistage amplifier, said first multistage amplifier to be self-biased by coupling said output of said first multistage amplifier to said input of said first multistage amplifier, and said second multistage amplidier to be self- biased by coupling said output of said second multistage amplifier to said input of said second multistage amplifier; and during said enable phase of said control signal, said plurality of switches cause said input of said latching comparator to be couple to said first terminal of said first capacitor for capacitively coupling to said input of the first multistage amplifier, and said output of said second multistage amplifier to be coupled to said input of said first multistage amplifier.

* * * * *